(12) United States Patent
Oikawa et al.

(10) Patent No.: US 12,528,813 B2
(45) Date of Patent: Jan. 20, 2026

(54) SUBSTITUTED IMIDAZO[4,5-B]PYRIDINES AS M3 RECEPTOR PAMS

(71) Applicant: NIPPON SHINYAKU CO., LTD., Kyoto (JP)

(72) Inventors: Koya Oikawa, Muko (JP); Takuto Yamanaka, Kyoto (JP); Sho Hirai, Kyoto (JP); Kazuhiko Wakita, Muko (JP)

(73) Assignee: NIPPON SHINYAKU CO., LTD., Kyoto (JP)

( * ) Notice: Subject to any disclaimer, the term of this patent is extended or adjusted under 35 U.S.C. 154(b) by 745 days.

(21) Appl. No.: 17/775,418

(22) PCT Filed: Nov. 12, 2020

(86) PCT No.: PCT/JP2020/042247
§ 371 (c)(1),
(2) Date: May 9, 2022

(87) PCT Pub. No.: WO2021/095801
PCT Pub. Date: May 20, 2021

(65) Prior Publication Data
US 2023/0002395 A1 Jan. 5, 2023

(30) Foreign Application Priority Data

Nov. 13, 2019 (JP) ................. 2019-205344

(51) Int. Cl.
*A61K 31/4353* (2006.01)
*A61P 13/10* (2006.01)
*C07D 471/04* (2006.01)
*C07D 487/04* (2006.01)

(52) U.S. Cl.
CPC ............ *C07D 487/04* (2013.01); *A61P 13/10* (2018.01)

(58) Field of Classification Search
CPC .................... A61K 31/4353; C07D 471/04
USPC ........................... 514/299; 544/118
See application file for complete search history.

(56) References Cited

U.S. PATENT DOCUMENTS

| 5,571,819 A | 11/1996 | Sabb et al. |
| 6,017,927 A | 1/2000 | Takeuchi et al. |
| RE49,111 E | 6/2022 | Takahashi et al. |
| 2005/0203083 A1 | 9/2005 | Mammen et al. |
| 2005/0203167 A1 | 9/2005 | Mammen et al. |
| 2008/0015196 A1 | 1/2008 | Doller et al. |
| 2008/0051404 A1 | 2/2008 | Claiborne et al. |
| 2008/0275038 A1 | 11/2008 | Vidal Juan et al. |
| 2009/0209540 A1 | 8/2009 | Kim et al. |
| 2010/0292188 A1 | 11/2010 | Denonne et al. |
| 2012/0128773 A1 | 5/2012 | Fischer et al. |
| 2013/0150388 A1 | 6/2013 | McCarron et al. |
| 2013/0217684 A1 | 8/2013 | Kim et al. |
| 2014/0135319 A1 | 5/2014 | Koppitz et al. |
| 2014/0187548 A1 | 7/2014 | Koppitz et al. |
| 2015/0322065 A1 | 11/2015 | Chappie et al. |
| 2015/0352090 A1 | 12/2015 | Armani et al. |
| 2016/0002218 A1 | 1/2016 | Takahashi et al. |
| 2016/0222005 A1 | 8/2016 | Stupple et al. |
| 2017/0197955 A1 | 7/2017 | Takahashi et al. |
| 2017/0290824 A1 | 10/2017 | Takahashi et al. |
| 2018/0116965 A1 | 5/2018 | Suda et al. |
| 2020/0095261 A1 | 3/2020 | Gao et al. |
| 2021/0000831 A1 | 1/2021 | Segawa et al. |
| 2021/0371412 A1 | 12/2021 | Oikawa et al. |
| 2023/0000840 A1 | 1/2023 | Yoshinaga et al. |

FOREIGN PATENT DOCUMENTS

| CL | 2020002866 A1 | 2/2021 |
| CN | 103429591 A | 12/2013 |
| EA | 006437 B1 | 12/2005 |
| EP | 2 416 761 B1 | 2/2015 |
| EP | 3 590 931 A1 | 1/2020 |

(Continued)

OTHER PUBLICATIONS

Jordan, V. C. Nature Reviews: Drug Discovery, 2, 2003, 205.*
Vippagunta, et al. Advanced Drug Delivery Reviews, 48, 2001, 18.*
Hackam, et al. JAMA, 296(14), 2006, 1731-1732.*
Australian Government, IP Australia, "Examination Report No. 1", issued in Australian Application No. 2019265134, which is a counterpart to U.S. Appl. No. 17/053,380, on Sep. 28, 2023, 3 pages.

(Continued)

*Primary Examiner* — Douglas M Willis

(57) ABSTRACT

The purpose of the present invention is to provide a compound having M3 PAM activity.

Examples of the present invention include azabenzimidazole compounds represented by the following formula [1] and pharmaceutically acceptable salts thereof.

[Chem. 1]

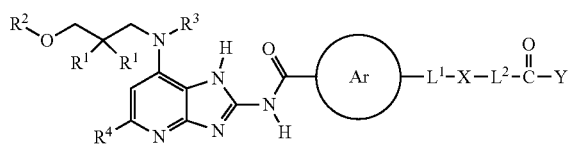

The compounds of the present invention have M3 PAM activity. In addition, since the compounds of the present invention have M3 PAM activity, the compounds of the present invention are useful as preventive agents or therapeutic agents for urination disorders and urine collection disorders in underactive bladder, hypotonic bladder, acontractile bladder, detrusor underactivity, and neurogenic bladder.

30 Claims, No Drawings

(56) References Cited

FOREIGN PATENT DOCUMENTS

| | | | |
|---|---|---|---|
| JP | 2009-510152 A | 3/2009 | |
| JP | 2009-542802 A | 12/2009 | |
| JP | 2011-510044 A | 3/2011 | |
| JP | 2012-031152 A | 2/2012 | |
| JP | 2013-237634 A | 11/2013 | |
| JP | 2013-545776 A | 12/2013 | |
| JP | 2013-545779 A | 12/2013 | |
| JP | 2016-509048 A | 3/2016 | |
| TW | 305842 B | 5/1997 | |
| WO | 1999/063993 A1 | 12/1999 | |
| WO | 2001/042213 A1 | 6/2001 | |
| WO | 2005/115399 A2 | 12/2005 | |
| WO | 2007/025177 A2 | 3/2007 | |
| WO | 2007/039297 A1 | 4/2007 | |
| WO | 2008/007900 A1 | 1/2008 | |
| WO | 2008/119713 A1 | 10/2008 | |
| WO | 2009/092764 A1 | 7/2009 | |
| WO | 2009/149279 A2 | 12/2009 | |
| WO | 2010/062571 A1 | 6/2010 | |
| WO | 2011/018894 A1 | 2/2011 | |
| WO | 2012/032031 A1 | 3/2012 | |
| WO | 2012/080230 A1 | 6/2012 | |
| WO | 2012/080236 A1 | 6/2012 | |
| WO | 2014/086855 A1 | 6/2014 | |
| WO | 2014/128465 A1 | 8/2014 | |
| WO | 2014/133056 A1 | 9/2014 | |
| WO | 2015/186821 A1 | 12/2015 | |
| WO | 2016/031833 A1 | 3/2016 | |
| WO | 2016/057500 A1 | 4/2016 | |
| WO | 2016/175230 A1 | 11/2016 | |
| WO | 2018/118736 A1 | 6/2018 | |
| WO | 2018/157857 A1 | 9/2018 | |
| WO | 2019/124507 A1 | 6/2019 | |
| WO | 2019/189766 A1 | 10/2019 | |
| WO | 2019/215203 A1 | 11/2019 | |
| WO | 2019/216294 A1 | 11/2019 | |
| WO | 2020/092621 A1 | 5/2020 | |
| WO | WO-2021095801 A1 * | 5/2021 | ........... A61K 31/437 |

OTHER PUBLICATIONS

Egyptian Patent Office (EGPO), "Technical Report", issued in Egyptian Patent Application No. EG/P/2020/01740, which is a counterpart to U.S. Appl. No. 17/053,380, on Dec. 27, 2024, 12 pages (6 pages of English translation of Technical Report, and 6 pages of original Technical Report).
Intellectual Property Office of Singapore, "Written Opinion," issued in Singaporean Patent Application No. 11202204908W, which is a counterpart to U.S. Appl. No. 17/775,345, on Mar. 12, 2024, 7 pages.
Paul Abrams et al., "Muscarinic receptors: their distribution and function in body systems, and the implications for treating overactive bladder," British Journal of Pharmacology, vol. 148, pp. 565-578 (2006).
Malcolm P. Caulfield and Nigel J. M. Birdsall, "International Union of Pharmacology. XVII. Classification of Muscarinic Acetylcholine Receptors," Pharmacological Reviews, vol. 50, No. 2, pp. 279-290 (1998), <online> https://www.researchgate.net/publication/13636638_International_Union_of_Pharmacology_XVII_Classification_of_muscarinic_acetylcholine_receptors, retrieved on Jan. 15, 2018.
Miles Congreve et al., "Applying Structure-Based Drug Design Approaches to Allosteric Modulators of GPCRs," Trends In Pharmacological Sciences, vol. 38, No. 9, pp. 837-847, Sep. 2017, doi: 10.1016/j.tips.2017.05.010, Elsevier Ltd.
Ciro Costagliola et al., "Pharmacotherapy of intraocular pressure: part I. Parasympathomimetic, sympathomimetic and sympatholytics," Expert Opinion on Pharmacotherapy, vol. 10, Issue 16, pp. 2663-2677 (2009).
International Search Report received for PCT Patent Application No. PCT/JP2019/018201, of which U.S. Appl. No. 17/053,380 is a U.S. national phase entry, mailed on Jun. 11, 2019, 4 pages.

Andrew C. Kruse et al., "Structure and dynamics of the M3 muscarinic acetylcholine receptor," Nature, vol. 482, pp. 552-556, Feb. 23, 2012, Macmillan Publishers Limited.
A. Abdel Raheem and Helmut Madersbacher, "Voiding dysfunction in women: How to manage it correctly," Arab Journal of Urology, vol. 11, pp. 319-330 (2013).
Kendrick Co Shih et al., "Systematic review of randomized controlled trials in the treatment of dry eye disease in Sjogren syndrome," Journal of Inflammation, vol. 14, No. 26, 11 pages, (2017) doi: 10.1186/s12950-017-0174-3.
The International Bureau of WIPO, "Written Opinion of the International Searching Authority," issued in International Application No. PCT/JP2019/018201, of which U.S. Appl. No. 17/053,380 is a U.S. national phase entry, mailed on Jun. 11, 2019, 6 pages.
Banyu Pharm Co., Ltd., "Novel, highly selective, muscarinic M3 receptor antagonists," Expert Opinion on Therapeutic Patents, vol. 11, No. 9, pp. 1475-1478, 2001.
European Patent Office, "Extended European Search Report," issued in European Patent Application No. 19 800 286.7, which is a counterpart to U.S. Appl. No. 17/053,380, on Jan. 10, 2022, 11 pages.
Naresh Kumar et al., "Synthesis and optimization of novel and selective muscarinic M3 receptor antagonists," Bioorganic & Medicinal Chemistry Letters, vol. 17, No. 18, pp. 5256-5260, 2007, Elsevier Ltd.
Peter Norman, "Long-acting muscarinic M3 receptor antagonists—Theravance: US20050203083, US20050203131, US20050203132, US20050203133, US20050203134, US20050203137, US20050203138, US20050203139, US20050203161 and US20050203167," Expert Opinion on Therapeutic Patents, vol. 16, No. 9, pp. 1321-1326, 2006.
Instituto Nacional de Propiedad Industrial (INAPI), "Examiner's Report," issued in Chilean Patent Application No. 202002868, which is a counterpart of U.S. Appl. No. 17/053,380, on Jan. 10, 2022, 33 pages (17 pages of English translation of Examiner's Report, and 16 pages of original Examiner's Report).
Saudi Authority for Intellectual Property, "Substantive Examination Report," issued in Saudi Arabian Patent Application No. 520420487, which is counterpart of U.S. Appl. No. 17/053,380, on Jan. 27, 2022, 11 pages (4 pages of English translation of Substantive Examination Report, and 7 pages of original Substantive Examination Report).
Intellectual Property India, "Examination Report," issued in Indian Patent Application No. 202047052667, which is a counterpart to U.S. Appl. No. 17/053,380, mailed on May 23, 2022, 5 pages.
Peter Norman, "Long-acting muscarinic M3 receptor antagonists," Expert Opinion on Therapeutic Patents, vol. 16, No. 9, pp. 1315-1320, 2006.
China National Intellectual Property Administration, "First Office Action", issued in Chinese Patent Application No. 201980046177.6, which is a counterpart to U.S. Appl. No. 17/053,380, on Nov. 22, 2022, 20 pages (12 pages of English translation of Office Action and 8 pages of original Office Action).
Ministry of Justice, Israel Patent Office, "Notice of Deficiencies", issued in Israeli Patent Application No. 278517, which is a counterpart to U.S. Appl. No. 17/053,380, on Nov. 16, 2022, 3 pages.
Taiwan Intellectual Property Office, "Office Action", issued in ROC (Taiwan) U.S. Appl. No. 17/053,380, which is a counterpart to U.S. Appl. No. 17/053,380, on Jan. 9, 2023, 8 pages (3 pages of English translation of Office Action and 5 pages of original Office Action).
The International Bureau of WIPO, "International Preliminary Report on Patentability," received for PCT Patent Application No. PCT/JP2020/042247, issued on May 17, 2022, 4 pages.
International Search Report received for PCT Patent Application No. PCT/JP2020/042247, mailed on Dec. 22, 2020, 2 pages.
Republic of Colombia Superintendence of Industry and Commerce, "Office Action", issued in Colombian Patent Application No. NC2020/0013848, which is a counterpart to U.S. Appl. No. 17/053,380, on Nov. 23, 2022, 12 pages (6 pages of English translation of Office Action, and 6 pages of original Office Action).
Mexican Patent Office (Instituto Mexicano de la Propiedad Industrial (IMPI)), "1st technical Office Action", issued In Mexican Patent Application No. MX/a/2020/011855, which is a counterpart

(56) References Cited

OTHER PUBLICATIONS to U.S. Appl. No. 17/053,380, on Apr. 12, 2023, 8 pages (4 pages of English translation of Office Action and 4 pages of original Office Action).
Astellas, "ASP8302 Non-Confidential Summary," Version Mar. 3, 2021, 19 pages.
Douglas A. Drossman et al., "Rome IV—Functional GI Disorders: Disorders of Gut-Brain Interaction," Gastroenterology, vol. 150, No. 6, pp. 1257-1261, 2016.
Douglas A. Drossman et al., "Rome III: New Standard for Functional Gastrointestinal Disorders," Journal of Gastrointestinal and Liver Diseases, vol. 15, No. 3, pp. 237-241, Sep. 2006.
The International Bureau of WIPO, "International Preliminary Report on Patentability," received for PCT Patent Application No. PCT/JP2020/042259, issued on May 17, 2022, 5 pages.
International Search Report received for PCT Patent Application No. PCT/JP2020/042259, mailed on Jan. 12, 2021, 2 pages.
"Rome IV: Functional Gastrointestinal Disorders," vol. 1, 4th Edition, 2016, pp. 2-5, 14-15, and 24-25, Rome Foundation, INC.
Marta Tanasiewicz et al., "Xerostomia of Various Etiologies: A Review of the Literature," Advances in Clinical and Experimental Medicine, vol. 25, No. 1, pp. 199-206, 2016, Wroclaw Medical University.
United States Patent and Trademark Office, "Non-Final Office Action," issued in U.S. Appl. No. 17/053,380 on Jul. 5, 2024, 41 pages.
Intellectual Property Office of the Philippines, Bureau of Patents, "Substantive Examination Report", issued in Philippine Patent Application No. 1/2020/551873, which is a counterpart to U.S. U.S. Appl. No. 17/053,380, mailed on Feb. 3, 2025, 4 pages.
European Patent Office, "Extended European Search Report", issued in European Patent Application No. 20 888 347.0, which is a counterpart to U.S. Appl. No. 17/775,345, on Oct. 16, 2023, 8 pages.
European Patent Office, "Extended European Search Report", issued in European Patent Application No. 20 886 259.9, which is a counterpart to U.S. Appl. No. 17/775,418, on Oct. 16, 2023, 6 pages.
Instituto Mexicano de la Propiedad Industrial (IMPI), "2nd Office Action", issued in Mexican Patent Application No. MX/a/2020/011855, which is a counterpart to U.S. Appl. No. 17/053,380, on Oct. 2, 2023, 8 pages (4 pages of English translation of Office Action, and 4 pages of original Office Action).
Instituto Nacional de Propiedad Industrial (INAPI), "Notification of the Examiner's Report No. 2", issued in Chilean Patent Application No. 2020-002868, which is a counterpart to U.S. Appl. No. 17/053,380, on Oct. 3, 2022, 30 pages (15 pages of English translation of Notification of the Examiner's Report No. 2, and 15 pages of original Notification of the Examiner's Report No. 2).
Ministry of Law and Human Rights of the Republic of Indonesia, Directorate General of Intellectual Property, "Notification of result of first stage of substantive examination result", issued in Indonesian Patent Application No. P00202009247, which is a counterpart to U.S. Appl. No. 17/053,380, on Nov. 8, 2022, 6 pages (3 pages of English translation of Notification, and 3 pages of original Notification).
New Zealand Intellectual Property Office, "Patent examination report 1," issued in NZ Patent Application No. 788181, which is a counterpart of U.S. Appl. No. 17/775,345, on Feb. 19, 2025, 4 pages.
Saudi Authority for Intellectual Property, "Second Substantive Examination Report", issued in Saudi Arabian application No. 522432594, which is a counterpart to U.S. Appl. No. 17/775,345, on Nov. 1, 2023, 9 pages (4 pages of English translation of Examination Report and 5 pages of original Examination Report).
National Institute for the Defense of Competition and the Protection of Intellectual Property, "Patentability Examination", issued in Peruvian Patent Application No. 0001816-2020/DIN, which is a counterpart to U.S. Appl. No. 17/053,380, on Oct. 24, 2024, 17 pages (9 pages of English translation of Patentability Examination, and 8 Pages of original Patentability Examination).
Saudi Authority for Intellectual Property, "Notification of Application Rejection", issued in Saudi Arabian Patent Application No. 522432594, which is a counterpart to U.S. Appl. No. 17/775,345, as received by Applicant on Jun. 10, 2024, 8 pages (4 pages of English translation of Notification, and 4 pages of original Notification).
Taiwan Intellectual Property Office, "Office Action of the Intellectual Property Office", issued in Taiwanese Patent Applicatin No. 522432594, which is a counterpart to U.S. Appl. No. 17/775,418, on Jun. 4, 2024, 8 pages (3 pages of English translation of Office Action, and 5 pages of original Office Action).
Rospatent Federal Service for Intellectual Property, "Official Action," issued in Russian Patent Application No. 2020139649, which is a counterpart to U.S. Appl. No. 17/053,380, on Nov. 2, 2022, 19 pages (10 pages of English translation of Official Action, and 9 pages of original Official Action).
Rospatent Federal Service for Intellectual Property, Federal Institute of Industrial Property (FIPS), "Search Report," Issued in Russian Patent Application No. 2020139649, which is a counterpart to U.S. Appl. No. 17/053,380, completed on Nov. 1, 2022, and received on Nov. 2, 2022, 5 pages (2 pages of English translation of Search Report, and 3 pages of original Search Report).
Taiwan Intellectual Property Office, "Decision of the Intellectual Property Office", issued in Taiwanese Patent Application No. 109139704, which is a counterpart to U.S. Appl. No. 17/775,418, on Feb. 10, 2025, 5 pages (2 pages of English translation of Office Action and 3 pages of original Office Action).
Taiwan Intellectual Property Office, "Decision of the Intellectual Property Office", issued in Taiwanese Patent Application No. 108115846, which is a counterpart to U.S. Appl. No. 17/053,380, on Dec. 5, 2023, 5 pages (2 pages of English translation of Office Action and 3 pages of original Office Action).
United States Patent and Trademark Office, "Non-Final Office Action," issued in U.S. Appl. No. 17/053,380 on Dec. 5, 2023, 61 pages.
Ministry of Law and Human Rights of the Republic of Indonesia, Directorate General of Intellectual Property, "Notification of the first stage of substantive examination results", issued in Indonesian Patent Application No. P00202205790, which is a counterpart to U.S. Appl. No. 17/775,345, on Apr. 1, 2024, 6 pages (3 pages of English translation of Office Action, and 3 pages of original Office Action).
Rospatent Federal Service for Intellectual Property, "Official Action", issued in Russian Patent Application No. 2022115612, which is a counterpart to U.S. Appl. No. 17/775,418, on Mar. 27, 2024, 23 pages (11 pages of English translation of Office Action, and 12 pages of original Office Action).
Taiwan Intellectual Property Office, "Office Action of the Intellectual Property Office", issued in Taiwanese Patent Application No. 109139511, which is a counterpart to U.S. Appl. No. 17/775,345, on Mar. 28, 2024, 11 pages (5 pages of English translation of Office Action, and 6 pages of original Office Action).
Rospatent Federal Service for Intellectual Property, "Official Action", issued in Eurasian application No. 202291442, which is a counterpart to U.S. Appl. No. 17/775,345, on May 19, 2023, 4 pages (2 pages of English translation of Official Action and 2 pages of original Official Action).
Saudi Authority for Intellectual Property, "First Substantive Examination Report", issued in Saudi Arabian application No. 522432594, which is a counterpart to U.S. Appl. No. 17/775,345, on May 28, 2023, 8 pages (4 pages of English translation of Examination Report and 4 pages of original Examination Report).
Saudi Authority for Intellectual Property, "Second Substantive Examination Report", issued in Saudi Arabian application No. 520420487, which is a counterpart to U.S. Appl. No. 17/053,380, on May 25, 2023, 9 pages (4 bages of English translation of Examination Report and 5 pages of original Examination Report).
United States Patent and Trademark Office, "Non-Final Office Action," issued in U.S. Appl. No. 17/775,345 on Apr. 7, 2025, 451 pages.
Qasim Aziz et al., "Esophageal Disorders," Gastroenterology, vol. 150, No. 6, pp. 1368-1379 (2016).
Bowel Interest Group, "Functional Constipation Webinar," from https://bowelinterestgroup.co.uk/resources/functional-constipation-webinar, recorded on Wednesday, Jul. 4, 2018.

(56) References Cited

OTHER PUBLICATIONS

M. Camilleri and V. Andresen, "Current and novel therapeutic options for irritable bowel syndrome management," Digestive and Liver Disease, vol. 41, pp. 854-862 (2009).
Jean Paul Galmiche et al., "Functional Esophageal Disorders," Gastroenterology, vol. 130, No. 5, pp. 1459-1465 (2006).
Jitender Reddy Kubbi et al., "Xerostomia: An overview," Journal of Indian Academy of Oral Medicine and Radiology, vol. 27, No. 1, pp. 85-89 (2015).
Takeshi Nakamura et al., "M3 muscarinic acetylcholine receptor plays a critical role in parasympathetic control of salivation in mice," Journal of Physiology, vol. 558, No. 2, pp. 561-575 (2004).
Instituto Mexicano de la Propiedad Industrial (IMPI), "1st Substantive Examination Requirement", issued in Mexican Patent Application No. MX/a/2022/005650, which is a counterpart to U.S. Appl. No. 17/775,345, on Jun. 2, 2025, 14 pages (7 pages of English translation of 1st Substantive Examination Requirement, and 7 pages of original 1st Substantive Examination Requirement).
Ministry of Science and Technology, the Intellectual Property Office of Viet Nam, "Result of the Substantive Examination", issued in Vietnamese Patent Application No. 1-2022-03592, which is a counterpart to U.S. Appl. No. 17/775,345, on May 27, 2025, 4 pages (2 pages of English translation of Office Action and 2 pages of original Office Action).
Instituto Mexicano de la Propiedad Industrial (IMPI), "1st Background Requirement", issued in Mexican Patent Application No. MX/a/2022/005649, which is a counterpart to U.S. Appl. No. 17/775,418, on May 12, 2025, 10 pages (5 pages of English translation of 1st Background Requirement, and 5 pages of original 1st Background Requirement).
Ukrainian Intellectual Property Institute, "Official Action," issued in Ukrainian Patent Application No. a 2022 01951, which is a counterpart to U.S. Appl. No. 17/775,345, on Mar. 26, 2025, 7 pages (3 pages of English translation of Official Action and 4 pages of original Official Action).
Ministry of Justice, Israel Patent Office, "Notice of Deficiencies", issued in Israeli Patent Application No. 292813, which is a counterpart to U.S. Appl. No. 17/775,345, on Mar. 20, 2025, 4 pages.
Instituto Mexicano de la Propiedad Industrial (IMPI), "2nd background requirement is informed", issued in Mexican Patent Application No. MX/a/2022/005649, which is a counterpart to U.S. Appl. No. 17/775,418, on Jul. 16, 2025, 11 pages (5 pages of English translation of the Requirement, and 6 pages of the original Requirement).
Korean Intellectual Property Office, "Notice of Grounds for Rejection", issued in Korean Patent Application No. 10-2022-7019712, which is a counterpart to U.S. Appl. No. 17/775,345, on Jul. 21, 2025, 13 pages (7 pages of English translation of the Notice followed by 6 pages of the original Notice).
Australian Government, IP Australia, "Examination Report No. 1", issued in Australian Application No. 2020382209, which is a counterpart to U.S. Appl. No. 17/775,345, on Aug. 20, 2025, 3 pages.
Saudi Authority for Intellectual Property, "Notification of the Substantive Examination Report", issued in Saudi Arabian Patent Application No. 524452072, which is a counterpart to U.S. Appl. No. 17/775,345, on Aug. 24, 2025, 8 pages (4 pages of English translation of Notification, and 4 pages of original Notification).
Australian Government, IP Australia, "Examination Report No. 1", issued in Australian Application No. 2020384041, which is a counterpart to U.S. Appl. No. 17/775,418, on Aug. 25, 2025, 3 pages.
Intellectual Property India, "Examination Report," issued in Indian Patent Application No. 202247032509, which is a counterpart to U.S. Appl. No. 17/775,418, dispatched on Sep. 16, 2025, 6 pages.
Intellectual Property India, "Examination Report," issued in Indian Patent Application No. 20224703171, which is a counterpart to U.S. Appl. No. 17/775,345, dispatched on Oct. 9, 2025, 5 pages.
Republic Of Colombia Superintendency of Industry and Commerve, "Office Action", issued in Colombian Patent Application No. NC2022/0006066, which is a counterpart to U.S. Appl. No. 17/775,345, on Nov. 19, 2025, 17 pages (8 pages of English translation of Office Action, and 9 pages of original Office Action).

\* cited by examiner

SUBSTITUTED IMIDAZO[4,5-B]PYRIDINES AS M3 RECEPTOR PAMS

CROSS REFERENCE TO RELATED APPLICATIONS

This patent application is a U.S. national stage application under 35 U.S.C. § 371 of International Patent Application No. PCT/JP2020/042247 filed on Nov. 12, 2020, which claims the benefit of foreign priority to Japanese Patent Application No. JP 2019-205344 filed on Nov. 13, 2019. The International Application was published in Japanese on May 20, 2021, as International Publication No. WO 2021/095801 A1 under PCT Article 21(2).

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

Field of the Invention

The present invention relates to a pharmaceutical composition containing a novel azabenzimidazole compound, or a pharmaceutically acceptable salt thereof, or a solvate thereof, as an active ingredient.

Description of Related Art

Acetylcholine (ACh) is a neurotransmitter that is released from the ends of the parasympathetic nerves and the motor nerves and that transmits nerve stimuli by binding to acetylcholine receptors (AChR). Acetylcholine receptors are roughly classified into G protein-coupled muscarinic receptors and ion channel type nicotinic receptors. Muscarinic receptors are classified into five subtypes, M1 to M5. Subtype M3 muscarinic receptors (hereinafter, sometimes referred to as "M3 receptors") have been reported to be mainly expressed in the bladder, gastrointestinal tract, pupil, salivary gland, lacrimal gland, etc., and be involved in contraction of the bladder, gastrointestinal tract, and pupil, secretion of saliva and tears, etc. (see NON-PATENT DOCUMENTS 1 and 2).

A compound having an action of enhancing an M3 receptor signal is expected to be useful as a preventive agent or therapeutic agent for bladder/urinary tract diseases, gastrointestinal diseases, oral diseases, ocular diseases, etc. (see NON-PATENT DOCUMENTS 3 to 6).

PRIOR ART DOCUMENTS

Non-Patent Documents

[NON-PATENT DOCUMENT 1] Pharmacological Reviews, 1998, Vol. 50, No. 2, p. 279-290

[NON-PATENT DOCUMENT 2] British Journal of Pharmacology, 2006, Vol. 148, No. 5, p. 565-578

[NON-PATENT DOCUMENT 3] Arabian Journal of Urology, 2013, Vol. 11, No. 4, p. 319-330

[NON-PATENT DOCUMENT 4] Clinics in Colon and Rectal Surgery, 2012, Vol. 25, p. 12-19

[NON-PATENT DOCUMENT 5] Expert Opinion on Pharmacotherapy, 2009, Vol. 10, No. 16, p. 2663-2677

[NON-PATENT DOCUMENT 6] Journal of Inflammation, 2017 Nov. 21, 14:26

[NON-PATENT DOCUMENT 7] Trends in Pharmacological Sciences, 2017, Vol. 38, No. 9, p. 837-847

[NON-PATENT DOCUMENT 8] Nature, 2012, Vol. 482, p. 552-556

BRIEF SUMMARY OF THE INVENTION

Problems to be Solved by the Invention

Regarding G protein-coupled receptors, there have been many reports on the structure of an allosteric site different from an orthosteric site to which an endogenous agonist binds, and this allosteric site is attracting much attention in recent years (see NON-PATENT DOCUMENT 7). Depending on the ligand that binds to the allosteric site, the structure of the receptor is changed, and the binding force between the endogenous agonist and the receptor is increased. Accordingly, endogenous agonist-stimulation-dependent signal levels can be enhanced for the receptor. As used herein, a ligand that enhances the signal level of the receptor due to the endogenous agonist by binding to the allosteric site as described above is referred to as a positive allosteric modulator (PAM). That is, a positive allosteric modulator means a ligand that binds to the allosteric site different from the orthosteric site, to which the endogenous agonist binds, and enhances a signal of the agonist.

Also, regarding M3 receptors, in recent years, an allosteric site different from an orthosteric site to which an endogenous agonist (acetylcholine, muscarinic) binds has been reported (see NON-PATENT DOCUMENT 8). M3 receptor PAMs (hereinafter, referred to as "M3 PAMs") are considered to be able to enhance endogenous agonist-stimulation-dependent signal levels for M3 receptors. Therefore, M3 PAMs can enhance the signal levels of M3 receptors under more physiological conditions, and are expected to be therapeutically promising for diseases involving M3 receptors.

An object of the present invention is to provide a compound having M3 PAM activity.

Means of Solving the Problems

As a result of intensive studies, the inventors discovered that an azabenzimidazole compound represented by the following formula [1], or a pharmaceutically acceptable salt thereof, or a solvate thereof (sometimes herein referred to as a "compound of the present invention") has M3 PAM activity, and achieved the prevent invention.

That is, for the present invention, the following (Item 1) to (Item 8) can be mentioned.

3

(Item 1)

An azabenzimidazole compound, or a pharmaceutically acceptable salt thereof, or a solvate thereof, the azabenzimidazole compound being a compound of the formula [1]:

[Chem. 1]

wherein
  each $R^1$ is a hydrogen atom or alkyl, or optionally the two $R^1$s combine with the adjacent carbon atom to form 3- to 7-membered cycloalkyl or an oxygen-containing non-aromatic heterocyclic group,
  $R^2$ is a hydrogen atom, alkyl, cycloalkyl, alkyl substituted with cycloalkyl, or alkoxyalkyl,
  $R^3$ is a hydrogen atom, alkyl, or alkoxyalkyl,
  $R^4$ is pyridyl optionally substituted with one or two groups selected from the group consisting of alkyl, trihaloalkyl, alkoxy, cyano, and cycloalkyl, or phenyl optionally substituted with 1 to 3 groups selected from the group consisting of trihaloalkyl, halogen, alkoxy, and cycloalkyl,
  Ar is an aromatic carbocyclic group or an aromatic heterocyclic group,
  the aromatic carbocyclic group and the aromatic heterocyclic group for Ar are optionally substituted with a group selected from the group consisting of the following (1) to (3),
  (1) halogen,
  (2) alkyl, and
  (3) alkoxy,
  $L^1$ is a bond, (C1 to C6) alkylene, (C1 to C6) haloalkylene, (C1 to C6) alkylene-N(Ra)-, (C1 to C6) alkylene-O—, or —C(O)—, wherein Ra is a hydrogen atom or alkyl,
  X is cycloalkylene, alkylene, a non-aromatic heterocyclic group optionally substituted with halogen, or a bond,
  $L^2$ is a bond, (C1 to C6) alkylene, —O—(C1 to C6) alkylene, or —N(Rb)-(C1 to C6) alkylene, wherein Rb is a hydrogen atom or alkyl, and
  Y is OH, $NHSO_2$(alkyl), $NHSO_2$(cycloalkyl), $NHSO_2$(haloalkyl), $NHSO_2$(monoalkylamino), $NHSO_2$(dialkylamino), $NHSO_2$(alkoxy), NH(alkoxy), or NH(alkyl).

(Item 2)

The azabenzimidazole compound according to Item 1, or a pharmaceutically acceptable salt thereof, or a solvate thereof, wherein
  each $R^1$ is alkyl, or the two $R^1$s combine with the adjacent carbon atom to form 3- to 7-membered cycloalkyl,
  $R^2$ is alkyl,
  $R^3$ is alkyl, and
  $R^4$ is pyridyl optionally substituted with one or two groups selected from the group consisting of trihaloalkyl, alkoxy, and cycloalkyl, or phenyl optionally substituted with 1 to 3 groups selected from the group consisting of trihaloalkyl and cycloalkyl.

4

(Item 3)

The azabenzimidazole compound according to Item 1, or a pharmaceutically acceptable salt thereof, or a solvate thereof, wherein
  $R^1$s combine with the carbon atom adjacent to the two $R^1$s to form 3- to 7-membered cycloalkyl,
  $R^2$ is alkyl,
  $R^3$ is alkyl,
  $R^4$ is pyridyl substituted with trihaloalkyl and one group selected from the group consisting of the following groups,
  (1) alkoxy, and
  (2) cycloalkyl,
  Ar is an aromatic heterocyclic group,
  $L^1$ is a bond, (C1 to C6) alkylene, or (C1 to C6) alkylene-N(Ra)-, wherein Ra is alkyl,
  X is a bond,
  $L^2$ is a bond, and
  Y is OH.

(Item 4)

The azabenzimidazole compound according to any one of Items 1 to 3, or a pharmaceutically acceptable salt thereof, or a solvate thereof, wherein the azabenzimidazole compound is any one of the following compounds (1) to (14):
(1) 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoic acid,
(2) 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoic acid,
(3) 3-[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoic acid,
(4) 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-methylpropanoic acid,
(5) 2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-6-carboxylic acid,
(6) 2-({[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}(methyl)amino)acetic acid,
(7) 4-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]butanoic acid,
(8) 4-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoic acid,
(9) 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid,
(10) 3-[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid,
(11) 4-[6-({5-[6-cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoic acid,

(12) 4-[6-({5-[6-ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoic acid,

(13) 3-[6-({5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]propanoic acid, and

(14) 4-[6-({5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoic acid.

(Item 5)

A pharmaceutical composition comprising the azabenzimidazole compound according to any one of Items 1 to 4, or a pharmaceutically acceptable salt thereof, or a solvate thereof, as an active ingredient.

(Item 6)

An M3 positive allosteric modulator (PAM) comprising the azabenzimidazole compound according to any one of Items 1 to 4, or a pharmaceutically acceptable salt thereof, or a solvate thereof, as an active ingredient.

(Item 7)

A preventive agent or therapeutic agent for a urination disorder or a urine collection disorder in a bladder/urinary tract disease, glaucoma, or diabetes which involves an M3 receptor, the preventive agent or therapeutic agent comprising the azabenzimidazole compound according to any one of Items 1 to 4, or a pharmaceutically acceptable salt thereof, or a solvate thereof, as an active ingredient.

(Item 8)

The preventive agent or therapeutic agent according to Item 7, wherein the urination disorder or the urine collection disorder in the bladder/urinary tract disease which involves the M3 receptor is due to underactive bladder, hypotonic bladder, acontractile bladder, detrusor underactivity, neurogenic bladder, urethral relaxation failure, or detrusor-external urethral sphincter dyssynergia.

Advantageous Effects of the Invention

According to the present invention, it is possible to provide an azabenzimidazole compound having M3 PAM activity.

BRIEF DESCRIPTION OF THE SEVERAL VIEWS OF THE DRAWING(S)

Not applicable.

DETAILED DESCRIPTION OF THE INVENTION

The meaning of each term as used herein is described below. Unless otherwise specified, each term is used in the same meaning when used alone or in combination with other terms.

"Halogen" refers to a fluorine atom, a chlorine atom, a bromine atom, or an iodine atom.

Examples of "alkyl" include linear or branched alkyl having 1 to 10 carbon atoms, preferably 1 to 8 carbon atoms, and more preferably 1 to 6 carbon atoms. Specific examples of "alkyl" include methyl, ethyl, n-propyl, isopropyl, n-butyl, isobutyl, sec-butyl, tert-butyl, n-pentyl, sec-pentyl, 1-ethylpropyl, 1,2-dimethylpropyl, tert-pentyl, 2-methylbutyl, isopentyl, neopentyl, n-hexyl, sec-hexyl, 1-ethylbutyl, isohexyl, neohexyl, 1,1-dimethylbutyl, texyl, 2-ethylbutyl, 1,2,2-trimethylpropyl, 2,2-dimethylbutyl, n-heptyl, isoheptyl, n-octyl, and isooctyl.

"Trihaloalkyl" refers to a group in which the above "alkyl" is substituted with three "halogens" above. Specific examples of "trihaloalkyl" include trifluoromethyl, trichloromethyl, and trifluoroethyl.

"Alkoxy" refers to a group in which the above "alkyl" is bound to an oxygen atom. Examples of "alkoxy" include linear or branched alkoxy having 1 to 8 carbon atoms and preferably 1 to 6 carbon atoms. Specific examples of "alkoxy" include methoxy, ethoxy, n-propoxy, isopropoxy, n-butoxy, isobutoxy, sec-butoxy, tert-butoxy, n-pentyloxy, n-hexyloxy, n-heptyloxy, and n-octyloxy.

Examples of the alkoxy moiety of "alkoxyalkyl" include the same "alkoxy" as described above.

Examples of "alkylene" include an alkylene having a linear or branched divalent hydrocarbon group having 1 to 6 carbon atoms. Specific examples of "alkylene" include methylene, ethylene, and propylene.

Examples of the cycloalkyl moiety of "alkyl substituted with cycloalkyl" include "cycloalkyl" described later.

Examples of "oxygen-containing non-aromatic heterocyclic group" include a 3- to 8-membered non-aromatic heterocyclic group, more preferably a 5- to 7-membered non-aromatic heterocyclic group, containing an oxygen atom as a ring-constituting atom in addition to carbon atoms. Specific examples of "oxygen-containing non-aromatic heterocyclic group" include oxolanyl (1-oxolanyl, 2-oxolanyl), oxanyl (1-oxanyl, 2-oxanyl, 3-oxanyl), and oxepanyl (1-oxepanyl, 2-oxepanyl, 3-oxepanyl).

Examples of "aromatic carbocyclic group" include an aromatic hydrocarbon group that is a monocyclic to tricyclic group and has 6 to 14 carbon atoms. Specific examples of "aromatic carbocyclic group" include phenyl, 1-naphthyl, 2-naphthyl, 1-anthryl, 2-anthryl, 9-anthryl, 1-phenanthryl, 2-phenanthryl, 3-phenanthryl, 4-phenanthryl, and 10-phenanthryl. Among them, phenyl is preferred.

Examples of "cycloalkyl" include a cyclic non-aromatic hydrocarbon group that is a monocyclic to tricyclic group. Specific examples of "cycloalkyl" include cyclopropyl, cyclobutyl, cyclopentyl, cyclohexyl, cycloheptyl, and cyclooctyl.

The above "cycloalkyl" may be a bridged hydrocarbon group. Examples of the bridged hydrocarbon group include
bicyclo[2.2.1]heptanyl (for example, bicyclo[2.2.1]heptan-1-yl, bicyclo[2.2.1]heptan-2-yl,
bicyclo[2.2.1]heptan-7-yl),
bicyclo[1.1.1]pentanyl (for example, bicyclo[1.1.1]pentan-1-yl, bicyclo[1.1.1]pentan-2-yl),
bicyclo[4.1.0]heptanyl (for example, bicyclo[4.1.0]heptan-1-yl, bicyclo[4.1.0]heptan-2-yl,
bicyclo[4.1.0]heptan-3-yl, bicyclo[4.1.0]heptan-7-yl),
bicyclo[2.2.2]octanyl (for example, bicyclo[2.2.2]octan-1-yl, bicyclo[2.2.2]octan-2-yl),
bicyclo[3.1.1]heptanyl (for example, bicyclo[3.1.1]heptan-1-yl, bicyclo[3.1.1]heptan-2-yl,
bicyclo[3.1.1]heptan-3-yl, bicyclo[3.1.1]heptan-6-yl), or
cuban-1-yl.

The above "cycloalkyl" may be a spirocyclic group. Examples of the spirocyclic group include
spiro[3.3]heptanyl (for example, spiro[3.3]heptan-1-yl, spiro[3.3]heptan-2-yl),
spiro[4.4]nonanyl (for example, spiro[4.4]nonan-1-yl, spiro[4.4]nonan-2-yl),
spiro[5.5]undecanyl (for example, spiro[5.5]undecan-1-yl, spiro[5.5]undecan-2-yl, spiro[5.5]undecan-3-yl), or spiro[2.5]octanyl (for example, spiro[2.5]octan-1-yl, spiro[2.5]octan-4-yl, spiro[2.5]octan-5-yl, spiro[2.5]octan-6-yl).

Examples of "heteroaryl" include an aromatic ring that is monocyclic to tricyclic, has 1 to 3 heteroatoms selected from the group consisting of nitrogen atom, oxygen atom, and sulfur atom as constituent atoms, and has 6 to 14 carbon atoms. Specific examples of "heteroaryl" include furyl (for example, 2-furyl, 3-furyl),
thienyl (for example, 2-thienyl, 3-thienyl),
pyrrolyl (for example, 1-pyrrolyl, 2-pyrrolyl, 3-pyrrolyl),
imidazolyl (for example, 1-imidazolyl, 2-imidazolyl, 4-imidazolyl),
pyrazolyl (for example, 1-pyrazolyl, 3-pyrazolyl, 4-pyrazolyl),
triazolyl (for example, 1,2,4-triazol-1-yl, 1,2,4-triazol-3-yl, 1,2,4-triazol-4-yl),
tetrazolyl (for example, 1-tetrazolyl, 2-tetrazolyl, 5-tetrazolyl),
oxazolyl (for example, 2-oxazolyl, 4-oxazolyl, 5-oxazolyl),
isoxazolyl (for example, 3-isoxazolyl, 4-isoxazolyl, 5-isoxazolyl),
oxadiazolyl (for example, 1,3,4-oxadiazol-2-yl),
thiazolyl (for example, 2-thiazolyl, 4-thiazolyl, 5-thiazolyl),
thiadiazolyl (for example, 1,3,4-thiadiazolyl, 1,2,4-thiadiazolyl, 1,2,3-thiadiazolyl),
isothiazolyl (for example, 3-isothiazolyl, 4-isothiazolyl, 5-isothiazolyl),
pyridyl (for example, 2-pyridyl, 3-pyridyl, 4-pyridyl),
pyridazinyl (for example, 3-pyridazinyl, 4-pyridazinyl),
pyrimidinyl (for example 2-pyrimidinyl, 4-pyrimidinyl, 5-pyrimidinyl),
pyrazinyl (for example, 2-pyrazinyl),
benzothiadiazolyl (for example, 1,2,3-benzothiadiazol-4-yl, 1,2,3-benzothiadiazol-5-yl, 2,1,3-benzothiadiazol-4-yl, 2,1,3-benzothiadiazol-5-yl),
benzothiazolyl (for example, benzothiazol-2-yl, benzothiazol-4-yl, benzothiazol-5-yl, benzothiazol-6-yl, benzothiazol-7-yl),
indolyl (for example, indol-3-yl, indol-4-yl, indol-5-yl, indol-6-yl, indol-7-yl),
benzothiophenyl (for example, 1-benzothiophen-2-yl, 1-benzothiophen-3-yl, 1-benzothiophen-4-yl, 1-benzothiophen-5-yl, 1-benzothiophen-6-yl, 1-benzothiophen-7-yl),
1,1-dioxo-1-benzothiophenyl (for example, 1,1-dioxo-1-benzothiophen-2-yl, 1,1-dioxo-1-benzothiophen-3-yl, 1,1-dioxo-1-benzothiophen-4-yl, 1,1-dioxo-1-benzothiophen-5-yl, 1,1-dioxo-1-benzothiophen-6-yl, 1,1-dioxo-1-benzothiophen-7-yl),
quinolyl (quinolin-2-yl, quinolin-3-yl, quinolin-4-yl, quinolin-5-yl, quinolin-6-yl, quinolin-7-yl, quinolin-8-yl), or
1,3-benzoxazol-2-yl.

Examples of "non-aromatic heterocyclic group" include a monocyclic or polycyclic non-aromatic cyclic group having one or more identical or different heteroatoms selected from among nitrogen atom, oxygen atom, and sulfur atom within a ring thereof. Specific examples of "non-aromatic heterocyclic group" include oxetanyl (for example, 2-oxetanyl, 3-oxetanyl),
azetidinyl (for example, 2-azetidinyl, 3-azetidinyl),
tetrahydropyranyl (for example, 2-tetrahydropyranyl, 3-tetrahydropyranyl, 4-tetrahydropyranyl),
1,4-dioxanyl (for example, 1,4-dioxan-2-yl),
1,3-dioxanyl (for example, 1,3-dioxan-2-yl, 1,3-dioxan-4-yl, 1,3-dioxan-5-yl),
pyrrolidinyl (for example, 1-pyrrolidinyl, 2-pyrrolidinyl, 3-pyrrolidinyl),
piperidinyl (for example, 1-piperidinyl, 2-piperidinyl, 3-piperidinyl, 4-piperidinyl),
piperazinyl (for example, 1-piperazinyl, 2-piperazinyl, 3-piperazinyl),
azepanyl (for example, 1-azepanyl, 2-azepanyl, 3-azepanyl, 4-azepanyl),
azocanyl (for example, 1-azocanyl, 2-azocanyl, 3-azocanyl, 4-azocanyl, 5-azocanyl),
homopiperidinyl (for example, 2-homopiperidinyl, 3-homopiperidinyl, 4-homopiperidinyl),
morpholinyl (for example, 2-morpholinyl, 3-morpholinyl, 4-morpholinyl),
thiomorpholinyl (for example, 2-thiomorpholinyl, 3-thiomorpholinyl, 4-thiomorpholinyl), or tetrahydrofuryl (2-tetrahydrofuryl, 3-tetrahydrofuryl).

The above "non-aromatic heterocyclic group" may be a bridged cyclic group. Examples of the bridged cyclic group include 3-azabicyclo[3.2.1]octanyl (for example, 3-azabicyclo[3.2.1]octan-1-yl, 3-azabicyclo[3.2.1]octan-2-yl, 3-azabicyclo[3.2.1]octan-3-yl, 3-azabicyclo[3.2.1]octan-6-yl, 3-azabicyclo[3.2.1]octan-8-yl),
3-azabicyclo[3.1.0]hexanyl (for example, 3-azabicyclo[3.1.0]hexan-1-yl, 3-azabicyclo[3.1.0]hexan-2-yl, 3-azabicyclo[3.1.0]hexan-6-yl), quinuclidinyl (for example, quinuclidin-2-yl, quinuclidin-3-yl, quinuclidin-4-yl), or
6-oxa-3-azabicyclo[3.1.1]heptanyl (for example, 6-oxa-3-azabicyclo[3.1.1]heptan-1-yl, 6-oxa-3-azabicyclo[3.1.1]heptan-2-yl, 6-oxa-3-azabicyclo[3.1.1]heptan-3-yl, 6-oxa-3-azabicyclo[3.1.1]heptan-7-yl).

The above "non-aromatic heterocyclic group" may be a spiro-cyclic group. Examples of the spiro-cyclic group include 6-azaspiro[2.5]octanyl (for example, 6-azaspiro[2.5]octan-1-yl, 6-azaspiro[2.5]octan-4-yl, 6-azaspiro[2.5]octan-5-yl),
3,9-dazaspiro[5.5]undecanyl (for example, 3,9-dazaspiro[5.5]undecan-1-yl, 3,9-dazaspiro[5.5]undecan-2-yl, 3,9-dazaspiro[5.5]undecan-3-yl),
2,7-diazaspiro[3.5]nonanyl (for example, 2,7-diazaspiro[3.5]nonan-1-yl, 2,7-diazaspiro[3.5]nonan-2-yl, 2,7-diazaspiro[3.5]nonan-5-yl, 2,7-diazaspiro[3.5]nonan-6-yl, 2,7-diazaspiro[3.5]nonan-7-yl),
7-azaspiro[3.5]nonanyl (7-azaspiro[3.5]nonan-1-yl, 7-azaspiro[3.5]nonan-2-yl, 7-azaspiro[3.5]nonan-5-yl, 7-azaspiro[3.5]nonan-6-yl), or
2,5-diazabicyclo[2.2.1]heptanyl (2,5-diazabicyclo[2.2.1]heptan-1-yl, 2,5-diazabicyclo[2.2.1]heptan-2-yl, 2,5-diazabicyclo[2.2.1]heptan-3-yl, 2,5-diazabicyclo[2.2.1]heptan-7-yl).

Hereinafter, each symbol in the formula [1] is described.

In the formula [1], each $R^1$ is a hydrogen atom or alkyl, or optionally the two $R^1$s combine with the adjacent carbon atom to form 3- to 7-membered cycloalkyl or an oxygen-containing non-aromatic heterocyclic group.

The "alkyl" for $R^1$ is preferably methyl, ethyl, n-propyl, and n-butyl, and more preferably methyl and ethyl.

The 3- to 7-membered cycloalkyl, for $R^1$, formed by the two $R^1$s combining with the adjacent carbon atom, is preferably cyclopropyl, cyclobutyl, cyclopentyl, cyclohexyl, and cycloheptyl, and more preferably cyclobutyl, cyclopentyl, and cyclohexyl.

In the formula [1], $R^2$ is a hydrogen atom, alkyl, cycloalkyl, alkyl substituted with cycloalkyl, or alkoxyalkyl.

The "alkyl" for $R^2$ is preferably methyl, ethyl, n-propyl, n-butyl, and n-pentyl, and more preferably methyl, ethyl, n-propyl, and n-butyl.

In the formula [1], $R^3$ is a hydrogen atom, alkyl, cycloalkyl, alkyl substituted with cycloalkyl, or alkoxyalkyl.

The "alkyl" for $R^3$ is preferably methyl, ethyl, and n-propyl, and more preferably methyl and ethyl.

In the formula [1], $R^4$ is pyridyl optionally substituted with one or two groups selected from the group consisting of alkyl, trihaloalkyl, alkoxy, cyano, and cycloalkyl, or phenyl optionally substituted with 1 to 3 groups selected from the group consisting of trihaloalkyl, halogen, alkoxy, and cycloalkyl.

The "trihaloalkyl" in pyridyl optionally substituted with one or two alkyls for $R^4$ is preferably trifluoromethyl.

The "alkoxy" in pyridyl optionally substituted with one or two alkoxys for $R^4$ is preferably methoxy, ethoxy, n-propoxy, and n-butoxy, and more preferably ethoxy.

The "cycloalkyl" in pyridyl optionally substituted with one or two cycloalkyls for $R^4$ is preferably cyclopropyl and cyclobutyl, and more preferably cyclopropyl.

The "trihaloalkyl" in phenyl optionally substituted with 1 to 3 trihaloalkyls for $R^4$ is preferably trifluoromethyl.

The "cycloalkyl" with which phenyl is optionally substituted for $R^4$ is preferably cyclopropyl and cyclobutyl, and more preferably cyclopropyl.

$R^4$ is preferably pyridyl substituted with trihaloalkyl and one group selected from the group consisting of alkyl, trihaloalkyl, alkoxy, cyano, and cycloalkyl.

Ar is an aromatic carbocyclic group or an aromatic heterocyclic group.

An aromatic heterocyclic group is preferable, and pyridyl, pyrimidinyl, pyrazinyl, imidazolyl, 5,6,7,8-tetrahydroimidazo[1,2-a]pyridyl, 1,2,3,4-tetrahydro-2,7-naphthyridine, 5,6,7,8-tetrahydro-1,6-naphthyridine, 4,5,6,7-tetrahydropyrazolo[1,2-a]pyridyl, 5,6,7,8-tetrahydroisoquinoline, and pyridazinyl are more preferable.

$L^1$ is a bond, (C1 to C6) alkylene, (C1 to C6) alkylene-N(Ra)-, (C1 to C6) alkylene-O—, or —C(O)—.

A bond and (C1 to C6) alkylene are preferable, and (C1 to C6) alkylene is more preferable.

X is a bond, cycloalkylene, or a non-aromatic heterocyclic group.

A bond and a non-aromatic heterocyclic group are preferable.

$L^2$ is a bond, (C1 to C6) alkylene, —O—(C1 to C6) alkylene, or —N(Rb)-(C1 to C6) alkylene.

A bond and (C1 to C6) alkylene are preferable, and a bond is more preferable.

Y is OH, $NHSO_2$(alkyl), $NHSO_2$(cycloalkyl), $NHSO_2$(haloalkyl),
$NHSO_2$(monoalkylamino), $NHSO_2$(dialkylamino), $NHSO_2$(alkoxy), NH(alkoxy), or NH(alkyl).

OH is more preferable.

The compound of the present invention can be prepared from a known compound or an easily synthesizable intermediate, for example, according to the following method, Examples described below, or a known method. In the preparation of the compound of the present invention, in the case where a starting material has a substituent that affects the reaction, the reaction is generally carried out after protecting the starting material with a suitable protective group in advance by a known method. The protective group can be removed by a known method after the reaction.

The azabenzimidazole compound according to the present invention may be used as it is for pharmaceuticals, and can also be used in the form of a pharmaceutically acceptable salt, a solvate, or a solvate of the salt according to a known method. Examples of pharmaceutically acceptable salts include salts with mineral acids such as hydrochloric acid, hydrobromic acid, sulfuric acid, and phosphoric acid, salts with organic acids such as acetic acid, malic acid, lactic acid, citric acid, tartaric acid, maleic acid, succinic acid, fumaric acid, p-toluenesulfonic acid, benzenesulfonic acid, and methanesulfonic acid, salts with alkali metals such as lithium, potassium, and sodium, salts with alkaline earth metals such as magnesium and calcium, and salts with an organic base such as ammonium salts. These salts can be formed by methods usually performed.

For example, in the case where the compound of the present invention is a hydrochloride salt, the hydrochloride salt can be prepared by dissolving the azabenzimidazole compound according to the present invention in a solution of hydrogen chloride in alcohol, a solution of hydrogen chloride in ethyl acetate, a solution of hydrogen chloride in 1,4-dioxane, a solution of hydrogen chloride in cyclopentyl methyl ether, or a solution of hydrogen chloride in diethyl ether.

Some of the compounds of the present invention may have an asymmetric carbon, and the respective stereo isomers and mixtures thereof are all included in the present invention. The stereo isomers can be prepared, for example, by means of optical resolution from the racemate thereof according to a known method using an optically active acid (for example, tartaric acid, dibenzoyltartaric acid, mandelic acid, 10-camphor sulfonic acid, etc.), utilizing its basicity, or by using an optically active compound prepared in advance as a starting material. In addition, the stereo isomers may also be prepared by optical resolution using a chiral column or by asymmetric synthesis.

The formula [1] of the present invention is not limited to a specific isomer, but includes all possible isomers and racemates. For example, as shown below, tautomers [1 Eq] and stereoisomers are also included:

[Chem. 2]

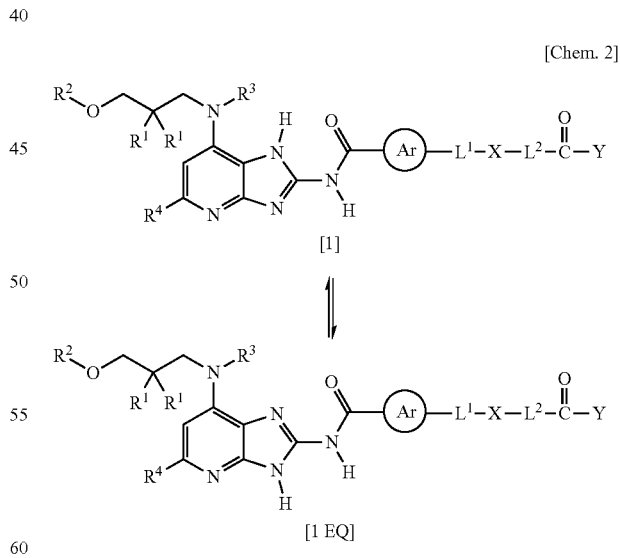

wherein the symbols are as defined above.

(Preparation Method for the Compound of the Present Invention)

The Compound [1] of the present invention and a salt thereof can be prepared from a known compound per se or an intermediate that is easily preparable from a known compound, for example, according to the following method, Examples described below, or a known method.

If the solvents, reagents, and starting materials used in each Step in the following preparation methods are commercially available, such commercially available products can be used as they are. Also, the compound obtained or the starting material used in each Step in the following preparation method may form a salt and can be converted by a known method into another type of salt or a free form. Conversely, when the compound obtained or the starting material used in each Step in the following preparation method is a free form, it can be converted into a desired salt by a known method. Examples of such salts include those similar to the salts described above for the compound of the present invention.

The compound of the present invention represented by the formula [1] or a pharmaceutically acceptable salt thereof may form a solvate (for example, hydrate, etc.) and/or a crystalline polymorph, and the present invention also includes such various solvates and crystalline polymorphs. The "solvate" may be coordinated with any number of solvent molecules (for example, water molecules, etc.) with respect to the compound represented by the formula [1]. When the compound represented by the formula [1] or a pharmaceutically acceptable salt thereof is left in the air, the compound or the salt may absorb water and adsorbed water may adhere thereto, or the compound or the salt may form a hydrate. In addition, the compound represented by the formula [1] or a pharmaceutically acceptable salt thereof may be recrystallized to form a crystalline polymorph thereof.

In the preparation of the compound of the present invention, when the starting material has a substituent capable of affecting the reaction, a protective group may be introduced in these substituents by a known method in advance, and the target compound can be obtained by removing the protective group after the reaction if necessary. For such introduction of a protective group and removal of the protective group, for example, the conditions described in Wuts and Greene, "Greene's Protective Groups in Organic Synthesis", 4th edition, John Wiley & Sons Inc., 2006, or P. J. Kocienski, "Protecting Groups", 3rd edition, Thieme, 2005, may be selected and used as appropriate.

The compound obtained in each Step of the following preparation methods can be isolated or purified according to a conventional method such as solvent extraction, concentration, distillation, sublimation, recrystallization, reprecipitation, and chromatography. Alternatively, the compound may also be used in the next Step in the state of a reaction mixture or a crude product.

Unless otherwise specified, the reaction in each Step in the following preparation methods is conducted according to known methods, for example, such as methods as described in: "Comprehensive Organic Transformations: A Guide to Functional Group Preparations, 2nd Edition", by R. C. Larock, John Wiley & Sons, Inc., 1999; The Chemical Society of Japan, "Experimental Chemistry", 4th edition, Maruzen, 1992; L. Kuerti and B. Czako, "Strategic Applications of Named Reactions in Organic Synthesis", translated by Kiyoshi Tomioka, Kagaku-Dojin Publishing Company, Inc., 2006; and G. S. Zweifel and M. H. Nantz, "Modern Organic Synthesis: An Introduction", translated by Tamejiro Hiyama, Kagaku-Dojin Publishing Company, Inc., 2009; or methods as described in the Examples, such that these methods are modified or combined as appropriate.

Preparation Process 1: Preparation processes for, out of Compounds [1], Compound [1A] (when Y is OH), and Compound [1B] (when Y is a group selected from $NHSO_2$ (alkyl), $NHSO_2$(cycloalkyl), $NHSO_2$(haloalkyl), $NHSO_2$(monoalkylamino), $NHSO_2$(dialkylamino), NH(alkoxy), and NH(alkyl))

[Chem. 3]

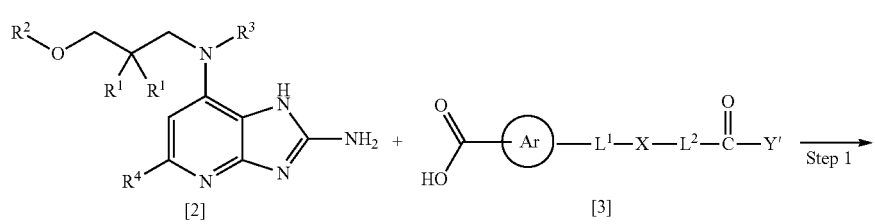

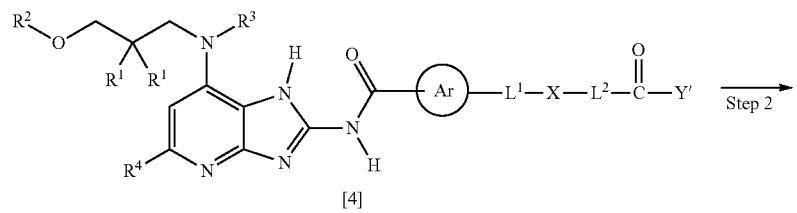

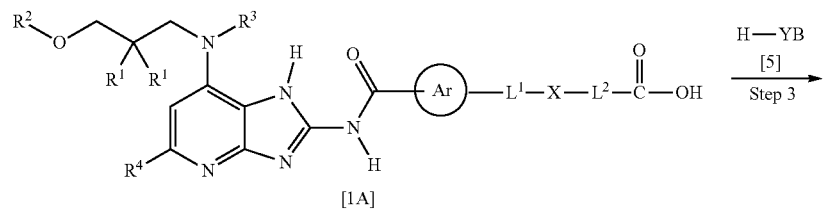

-continued

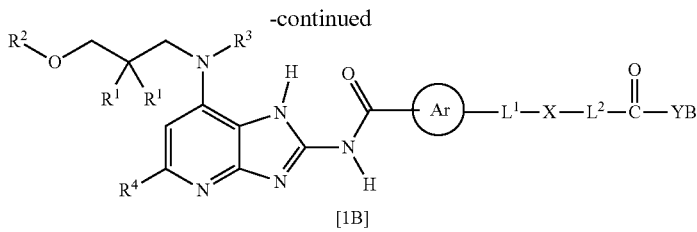

[1B]

Here, $R^1$, $R^2$, $R^3$, $R^4$, Ar, $L^1$, X, and $L^2$ are as defined above, Y' represents alkoxy, examples thereof include methoxy and ethoxy, YB represents $NHSO_2$(alkyl), $NHSO_2$(cycloalkyl), $NHSO_2$(haloalkyl), $NHSO_2$(monoalkylamino), $NHSO_2$(dialkylamino), NH(alkoxy), or NH(alkyl) in Y, and appropriate alkyl, haloalkyl, cycloalkyl, and alkoxy are as defined above.

Step 1

This reaction is an amidation reaction for preparing Compound [4] by condensation of Compound [2] with Compound [3], which is commercially available or can be prepared according to a known method, or a salt thereof, and can be carried out according to a known method per se.

Examples of the salt of Compound [3] include salts with suitable acids, for example, a hydrochloride salt, a trifluoroacetic acid salt, and the like.

The amount of Compound [2] to be used in this reaction is suitably within the range of 0.5 to 2 molar equivalents of Compound [3].

This reaction is carried out in the presence of a condensing agent. Examples of the condensing agent to be used include O-(1H-benzotriazol-1-yl)-N,N,N',N'-tetramethyluronium hexafluorophosphate (hereinafter, referred to as "HBTU"), O-(7-azabenzotriazol-1-yl)-N,N,N',N'-tetramethyluronium hexafluorophosphate (hereinafter, referred to as "HATU"), O-(1H-benzotriazol-1-yl)-N,N,N',N'-tetramethyluronium tetrafluoroborate (hereinafter, referred to as "TBTU"), 1-ethoxycarbonyl-2-ethoxy-1,2-dihydroquinoline (hereinafter, referred to as "EEDQ"), chloro-N,N,N',N'-tetramethylformamidinium hexafluorophosphate (hereinafter, referred to as "TCFH"), 1-ethyl-3-(3-dimethylaminopropyl)carbodiimide hydrochloride (hereinafter, referred to as "EDCI"), 4-(4,6-dimethoxy-1,3,5-triazin-2-yl)-4-methylmorpholinium chloride (hereinafter, referred to as "DMT-MM"), N-[1-(cyano-2-ethoxy-2-oxoethylideneaminooxy) dimethylamino (morpholino)] uronium hexafluorophosphate (hereinafter, referred to as "COMU"), and N,N'-carbonyldiimidazole (hereinafter, referred to as "CDI").

The condensing agent is suitably within the range of 1 to 4 molar equivalents of Compound [2].

In this reaction, a base can be used as necessary. Examples of the base that can be used include organic bases such as triethylamine, N,N-diisopropylethylamine (hereinafter, referred to as "DIPEA"), 1,8-diazabicyclo[5,4,0]-7-undecene (hereinafter, referred to as "DBU"), pyridine, and N-methylmorpholine, and inorganic bases such as potassium carbonate, cesium carbonate, and sodium carbonate.

The amount of the base to be used is suitably within the range of, for example, 1 to 10 molar equivalents of Compound [2].

In this reaction, an additive such as 1-hydroxybenzotriazole (hereinafter, referred to as "HOBt"), N-hydroxysuccinimide, 1-hydroxy-7-azabenzotriazole (hereinafter, referred to as "HOAt"), and 4-dimethylaminopyridine (hereinafter, referred to as "DMAP") can also be added as necessary.

In the case of using the above additive in this reaction, the amount of the additive to be used is each suitably within the range of 1 to 3 molar equivalents of Compound [2].

The solvent to be used in this reaction is not particularly limited as long as it is not involved in the reaction, and examples of the solvent include hydrocarbons such as toluene and xylene, halogenated hydrocarbons such as dichloromethane and chloroform, ethers such as 1,4-dioxane, tetrahydrofuran (hereinafter, referred to as "THF"), and ethylene glycol dimethyl ether (hereinafter referred to as "DME"), amides such as dimethylformamide (hereinafter referred to as "DMF"), dimethylacetamide (hereinafter referred to as "DMA"), and N-methylpyrrolidone (hereinafter referred to as "NMP"), alcohols such as ethanol and isopropanol, dimethylsulfoxide (hereinafter referred to as "DMSO"), acetonitrile, water, and mixed solvents thereof.

The reaction temperature can be within the range of 0° C. to 200° C. and preferably 0° C. to 70° C. Also, a microwave reaction apparatus (for example, a microwave synthesis system "Initiator" (manufactured by Biotage Japan Ltd.)) may be used as necessary.

The reaction time can vary depending on the type of the starting material to be used and the reaction temperature, and is usually suitably within the range of 0.5 to 72 hours.

Step 2

This Step is Step for obtaining [1A] by hydrolyzing Compound [4] in a suitable solvent in the presence of a suitable acid or base.

Examples of the acid to be used in this reaction include inorganic acids such as hydrochloric acid and sulfuric acid, and organic acids such as trifluoroacetic acid (hereinafter, referred to as "TFA"), methanesulfonic acid, and toluenesulfonic acid. Examples of the base include inorganic bases such as sodium hydroxide, potassium hydroxide, and lithium hydroxide.

In this reaction, the amount of the acid or the base to be used is suitably 1 to 50 molar equivalents of Compound [4].

The solvent to be used is not particularly limited as long as it is not involved in the reaction, and examples of the solvent include alcohols such as methanol, ethanol, and isopropanol, ethers such as THF, diethyl ether, 1,4-dioxane, and DME, nitriles such as acetonitrile and propionitrile, ketones such as acetone, water, and mixed solvents thereof.

The reaction temperature can be within the range of −10° C. to 200° C. and preferably 0° C. to 70° C. Also, a microwave reaction apparatus may be used as necessary.

The reaction time can vary depending on the type of the starting material to be used and the reaction temperature, and is usually suitably within the range of 0.5 hours to 4 days.

Step 3

This Step is Step for preparing Compound [1B] by a condensation reaction of Compound [1A] with Compound

[5], which is commercially available or can be prepared according to a known method, or a salt thereof, and can be carried out according to a known method per se.

Examples of the salt of Compound [5] include salts with suitable acids, for example, a hydrochloride salt, a trifluoroacetic acid salt, and the like.

The amount of Compound [5] to be used in this reaction is suitably within the range of 1 to 10 molar equivalents of Compound [1A].

This reaction is carried out in the presence of a condensing agent. Examples of the condensing agent to be used include HBTU, HATU, TBTU, EEDQ, TCFH, EDC, DMT-MM, COMU, and CDI.

The condensing agent is suitably within the range of 1 to 4 molar equivalents of Compound [1A].

In this reaction, a base can be used as necessary. Examples of the base that can be used include organic bases such as triethylamine, DIPEA, DBU, pyridine, and N-methylmorpholine, and inorganic bases such as potassium carbonate, cesium carbonate, and sodium carbonate.

The amount of the base to be used is suitably within the range of, for example, 1 to 10 molar equivalents of Compound [1A].

In this reaction, an additive such as HOBt, N-hydroxysuccinimide, HOAt, and DMAP can also be added as necessary.

In the case of using the above additive in this reaction, the amount of the additive to be used is each suitably within the range of 1 to 3 molar equivalents of Compound [1A].

The solvent to be used in this reaction is not particularly limited as long as it is not involved in the reaction, and examples of the solvent include hydrocarbons such as toluene and xylene, halogenated hydrocarbons such as dichloromethane and chloroform, ethers such as 1,4-dioxane, THF, and DME, amides such as DMF, DMA, and NMP, alcohols such as ethanol and isopropanol, DMSO, acetonitrile, water, and mixed solvents thereof.

The reaction temperature can be within the range of 0° C. to 200° C. and preferably 0° C. to 70° C. Also, a microwave reaction apparatus may be used as necessary.

The reaction time can vary depending on the type of the starting material to be used and the reaction temperature, and is usually suitably within the range of 0.5 to 4 days.

Preparation Process for Compound [2]

Compound [2] can be prepared, for example, according to the following preparation process.

[Chem. 4]

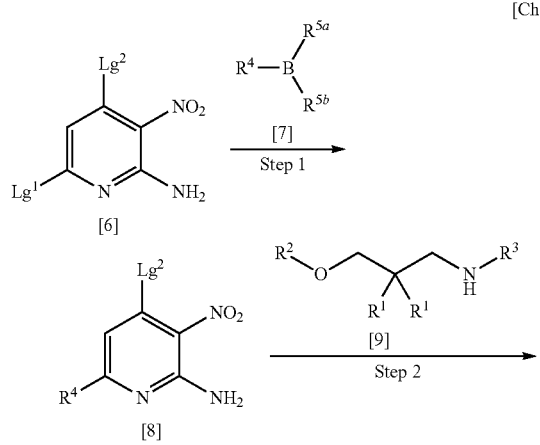

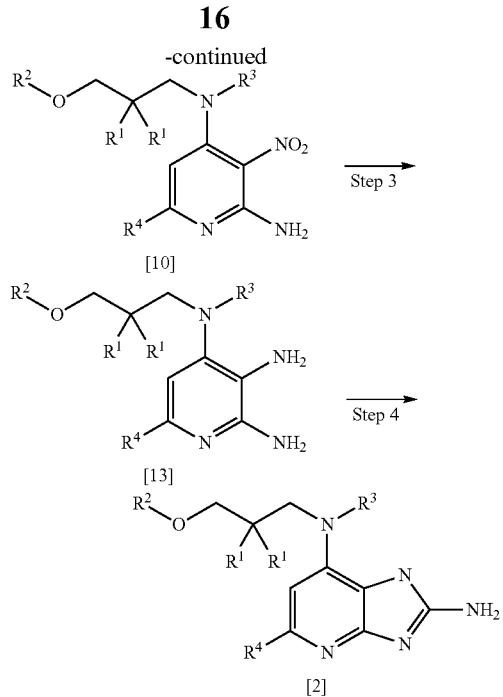

Here, $R^1$, $R^2$, $R^3$, and $R^4$ are as defined above, $R^{5a}$ and $R^{5b}$ both represent a hydroxy group or $R^{5a}$ and $R^{5b}$ combine to form —O—C(CH$_3$)$_2$—C(CH$_3$)$_2$—O—, —O—(CH$_2$)$_3$—O—, or O—CH$_2$—C(CH$_3$)$_2$—CH$_2$—O—, $Lg^1$ and $Lg^2$ are each a leaving group, and examples of $Lg^1$ and $Lg^2$ include a chlorine atom and a bromine atom.

Step 1

This Step is Step for obtaining Compound [8] by a reaction between Compound [6] and a boron compound [7], which is commercially available or can be prepared according to a known method, in the presence of a palladium catalyst and a base, that is, a so-called cross-coupling reaction.

The amount of Compound [7] to be used is suitably within the range of 1 to 3 molar equivalents of Compound [6].

Examples of the palladium catalyst to be used include tris(dibenzylideneacetone)bispalladium chloroform adduct (hereinafter, referred to as "Pd$_2$(dba)$_3$·CHCl$_3$"), tris(dibenzylideneacetone)bispalladium (hereinafter, referred to as "Pd$_2$(dba)$_3$"), tetrakistriphenylphosphine palladium (hereinafter, referred to as "Pd(PPh$_3$)$_4$"), [1,1'-bis(diphenylphosphino)ferrocene]-dichloropalladium(II)·dichloromethane adduct (hereinafter referred to as "Pd(dppf)Cl$_2$·CH$_2$Cl$_2$"), bis(triphenylphosphine)palladium(II) dichloride (hereinafter, referred to as "PdCl$_2$(PPh$_3$)$_2$"), [1,1'-bis(di-tert-butylphosphino)ferrocene]-dichloropalladium(II) (hereinafter, referred to as "Pd(dtbpf)Cl$_2$), bis(tricyclohexylphosphine)palladium(II) dichloride (hereinafter, referred to as "PdCl$_2$(PCy$_3$)$_2$"), palladium(II) acetate (hereinafter, referred to as "Pd(OAc)$_2$"), etc.

The amount of the palladium catalyst to be used is suitably within the range of, for example, 0.01 to 0.3 molar equivalents of Compound [6].

Examples of the base to be used include inorganic bases such as potassium carbonate, cesium carbonate, sodium carbonate, sodium bicarbonate, sodium acetate, potassium acetate, trisodium phosphate, and tripotassium phosphate The amount of the base to be used is suitably within the range of, for example, 1 to 4 molar equivalents of Compound [6].

In this Step, a suitable ligand may be used as necessary. Examples of ligands that can be used include 1,1'-bis(diphenylphosphino)ferrocene (hereinafter, referred to as "dppf"), 4,5-bis(diphenylphosphino)-9,9-dimethylxanthene (hereinafter, referred to as "Xantphos"), 2-dicyclohexylphosphino-2',4',6'-triisopropylbiphenyl (hereinafter, referred to as "XPhos"), 2,2'-bis(diphenylphosphino)-1,1'-binaphthyl (hereinafter, referred to as "BINAP"), 2-dicyclohexylphosphino-2',6'-diisopropylbiphenyl (hereinafter, referred to as "RuPhos"), triphenylphosphine (hereinafter, referred to as "PPh$_3$"), and tricyclohexylphosphine (hereinafter referred to as "PCy$_3$").

The amount of the ligand to be used is suitably within the range of, for example, 1 to 5 molar equivalents of the palladium catalyst.

The solvent to be used in this Step is not particularly limited as long as it is not involved in the reaction, and examples of the solvent include hydrocarbons such as toluene and xylene, ethers such as 1,4-dioxane, THF, and DME, amides such as DMF, DMA, and NMP, alcohols such as ethanol, 2-propanol, and tert-butanol, water, and mixed solvents thereof.

The reaction temperature can vary depending on the types of the starting material and the reagent to be used, and is usually suitably within the range of 20° C. to 200° C. Also, a microwave reaction apparatus may be used as necessary.

The reaction time can vary depending on the type of the starting material to be used and the reaction temperature, and is usually suitably within the range of 0.1 to 24 hours.

Compound [8] can also be prepared via Step 5 and Step 6 described below.

[Chem. 5]

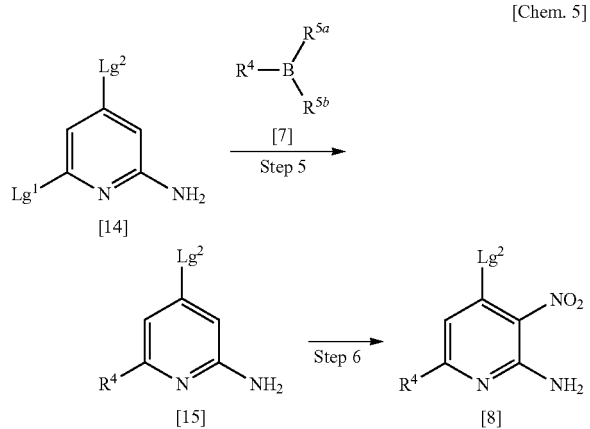

Here, $R^4$, $R^{5a}$, $R^{5b}$, $Lg^1$, and $Lg^2$ are as defined above.

Step 5

This Step is a cross-coupling reaction between Compound [14] and Compound [7] using a palladium catalyst, and can be carried out under the same reaction conditions as Step 1 of the above preparation process for Compound [2].

Step 6

This Step is Step for obtaining Compound [8] by nitrating Compound in the presence of a suitable nitrating agent, and can be carried out according to a known method as a nitration reaction.

Examples of the nitrating agent to be used include nitric acid, fuming nitric acid, copper nitrate, sodium nitrate, and potassium nitrate.

The amount of the nitrating agent to be used is suitably within the range of 1 to 1.1 molar equivalents of Compound [15].

In this Step, the solvent to be used is selected according to the type of the reagent to be used, and examples of the solvent include concentrated sulfuric acid and concentrated hydrochloric acid.

The reaction temperature can vary depending on the types of the starting material and the reagent to be used, and is usually suitably within the range of 0° C. to 40° C. and more preferably within the range of 5° C. to 15° C.

The reaction time can vary depending on the types of the starting material and the reagent to be used and the reaction temperature, and is usually suitably within the range of 0.5 hours to 12 hours and more preferably within the range of 1 hour to 3 hours.

Step 2

This Step is Step for obtaining an aromatic amino compound by a reaction between Compound [8] and Compound [9] which is commercially available or can be prepared according to a known method.

Compound [9] may be used in the form of a salt with a suitable acid, for example, a hydrochloride salt, a trifluoroacetic acid salt, or the like.

The amount of Compound [9] to be used is suitably within the range of 0.5 to 1.5 molar equivalents of Compound [8].

In this Step, a base can be used as necessary. Examples of the base that can be used include organic bases such as triethylamine, DIPEA, and DBU, and inorganic bases such as potassium carbonate, cesium carbonate, and sodium carbonate.

The amount of the base to be used is suitably within the range of, for example, 1 to 10 molar equivalents of Compound [8].

The solvent to be used is not particularly limited as long as it is not involved in the reaction, and examples of the solvent include hydrocarbons such as toluene and xylene, ethers such as 1,4-dioxane, THF, and DME, amides such as DMF and DMA, nitriles such as acetonitrile and propionitrile, alcohols such as 2-propanol and tert-butanol, DMSO, water, and mixed solvents thereof.

The reaction temperature can vary depending on the types of the starting material and the reagent to be used, and is usually suitably within the range of 20° C. to 200° C. Also, a microwave reaction apparatus may be used as necessary.

The reaction time can vary depending on the type of the starting material to be used and the reaction temperature, and is usually suitably within the range of 0.5 to 24 hours.

In the case of preparing Compound using Compound [6] as a starting material, Compound can be obtained even when the order of Step 1 and Step 2 is changed. The reaction conditions in this case are the same as the reaction conditions in Step 1 and Step 2 of the above preparation process for Compound [2].

Step 3

This Step is Step for obtaining an aromatic diamine compound by reducing the nitro group of Compound [10], and can be carried out according to a known method per se. This reduction reaction is achieved, for example, by performing iron reduction using reduced iron and ammonium chloride or the like, zinc reduction using zinc powder and ammonium chloride or acetic acid, or the like, in a suitable solvent.

Examples of the reducing agent that can be used in this reduction reaction include reduced iron, zinc powder, and tin(II) chloride.

In this Step, the amount of the reducing agent to be used is suitably within the range of 1 to 10 molar equivalents of Compound [10].

In the case of using the above metal reagent in this reduction reaction, an acid is usually used. Examples of the acid to be used include hydrochloric acid, acetic acid, and ammonium chloride.

The amount of the acid to be used in this Step is suitably within the range of 1 to 10 molar equivalents of Compound [10].

The solvent to be used in this Step is not particularly limited as long as it is not involved in the reaction, and examples of the solvent include hydrocarbons such as toluene, ethers such as 1,4-dioxane, THF, and DME, esters such as ethyl acetate, ketones such as acetone, nitriles such as acetonitrile, amides such as DMF, alcohols such as methanol, ethanol, 2-propanol, and tert-butanol, water, and mixed solvents thereof.

The reaction temperature can vary depending on the types of the starting material and the reagent to be used, and is usually suitably within the range of 0° C. to 200° C.

The reaction time can vary depending on the types of the starting material and the reagent to be used and the reaction temperature, and is usually suitably within the range of 1 hour to 24 hours.

Step 4

This Step is a ring closure reaction for obtaining Compound [2] by reacting the diamine compound with cyanogen bromide, and Compound [2] can be prepared, for example, according to the method described in WO 2005/082901.

In this Step, the amount of cyanogen bromide to be used is suitably within the range of 2 to 10 molar equivalents of Compound [13].

In this Step, the solvent to be used is not particularly limited as long as it is not involved in the reaction, and examples of the solvent include alcohols such as methanol, ethanol, 2-propanol, and tert-butanol.

The reaction temperature can vary depending on the starting material to be used, and is usually suitably within the range of 20° C. to 70° C.

The reaction time can vary depending on the types of the starting material and the reagent to be used and the reaction temperature, and is usually suitably within the range of 1 hour to 72 hours.

Urine collection and urination are regulated by the action of the bladder and urethra. In urine collection, urinary restraint is maintained by relaxation of bladder smooth muscle (detrusor) and contraction of urethral sphincter. On the other hand, urination is caused by contraction of bladder smooth muscle and relaxation of urethral smooth muscle. During urination, acetylcholine is released from the nerve ends of the pelvic nerve, which is the parasympathetic nerve that controls the bladder. The released acetylcholine binds to the M3 receptors of the bladder smooth muscle, whereby the bladder smooth muscle contracts.

If a urine collection disorder occurs due to, for example, overactive bladder or the like, urine cannot be retained at the time of urine collection. In addition, if a urination disorder occurs due to, for example, underactive bladder or the like, urine cannot be excreted sufficiently during urination. Furthermore, residual urine after urination may be found in a urination disorder. An increasing amount of residual urine may lead to symptoms such as frequent urination. Thus, a urine collection disorder and a urination disorder may develop together (see Current Urology Report, 2016, 17:17).

The compound of the present invention can be used for the prevention or treatment of diseases involving M3 receptors, in particular, bladder/urinary tract diseases involving bladder contraction, digestive system diseases involving gastrointestinal contraction, oral diseases involving salivation, ocular diseases involving tear secretion or pupil contraction, etc. The compound of the present invention is particularly useful for the prevention or treatment of urination disorders and urine collection disorders in bladder/urinary tract diseases, glaucoma in ocular diseases, and diabetes. As used herein, diabetes refers to diabetes in which the insulin secretion ability involving M3 receptors is reduced (see Cell Metabolism, 2006, Vol. 3, p. 449-461).

Examples of urination disorders and urine collection disorders for which the prevention or treatment with the compound of the present invention is particularly useful include urination disorders and urine collection disorders in underactive bladder, hypotonic bladder, acontractile bladder, detrusor underactivity, neurogenic bladder, urethral relaxation failure, detrusor-external urethral sphincter dyssynergia, overactive bladder, frequent urination, nocturia, urinary incontinence, benign prostatic hyperplasia, interstitial cystitis, chronic prostatitis, urolithiasis, etc.

The compound of the present invention is particularly useful for the prevention or treatment of urination disorders and urine collection disorders in underactive bladder, hypotonic bladder, acontractile bladder, detrusor underactivity, benign prostatic hyperplasia, and neurogenic bladder. For example, in underactive bladder, a urination disorder occurs due to decreased contractile force of the bladder detrusor during urination, and the compound of the present invention can improve the contractile force of the bladder detrusor during urination to promote urination.

The compound of the present invention is particularly useful for the prevention or treatment of underactive bladder, hypotonic bladder, acontractile bladder, and detrusor underactivity due to a specific cause. Examples of specific causes include neurological diseases (multiple system atrophy, Parkinson's disease, multiple sclerosis, spinal cord injury, lumbar disc herniation, etc.), diabetes, pelvic surgery, benign prostatic hyperplasia, and aging.

Acetylcholine contracts the ciliary muscle via the M3 receptors of the ciliary muscle of the eye. By the contraction of the ciliary muscle, Schlemm's canal opens, and aqueous humor outflows through the Schlemm's canal, whereby the intraocular pressure falls. Examples of glaucoma for which prevention or treatment with the compound of the present invention is particularly useful include primary open-angle glaucoma, normal-tension glaucoma, and primary closed-angle glaucoma.

When the compound of the present invention is administered as a pharmaceutical, the compound of the present invention is administered to a mammal including human as it is or as a pharmaceutical composition containing the compound in an amount of, for example, 0.001% to 99.5%, preferably 0.1% to 90%, in a pharmaceutically acceptable non-toxic and inert carrier.

The carrier may be one or more of solid, semi-solid, or liquid diluents, fillers, and other auxiliaries for formulations. The pharmaceutical composition according to the present invention is preferably administered in a unit dosage form. The pharmaceutical composition can be administered by tissue administration, oral administration, intravenous administration, local administration (transdermal administration, eye drops, intraperitoneal cavity, intrathoracic cavity, etc.), or transrectally. Of course, the composition is administered in dosage forms suitable for these modes of administration.

The dose as a pharmaceutical is preferably adjusted taking into consideration the conditions such as age, weight, type and severity of disease of the patient, administration route, type of the compound of the present invention, whether or not it is a salt, and the type of the salt. In general, the active ingredient amount of the compound of the present invention or a pharmaceutically acceptable salt thereof for adult, in the case of oral administration, is suitably within a range of 0.01 mg to 5 g/day/adult, preferably 1 mg to 500 mg/day/adult. In some cases, a smaller amount may be sufficient or a larger amount may be required. Usually, the dosage can be administered once a day or can be divided and administered several times a day, or in the case of intravenous administration, the dosage can be administered rapidly or sustainably within 24 hours.

One or more hydrogen, carbon, and/or the other atoms in the compound of the present invention may each be replaced with an isotope thereof. Examples of such isotopes include $^2H$, $^3H$, $^{11}C$, $^{13}C$, $^{14}C$, $^{15}N$, $^{18}O$, $^{17}O$, $^{31}P$, $^{32}P$, $^{35}S$, $^{18}F$, $^{123}I$, and $^{36}Cl$, i.e., hydrogen, carbon, nitrogen, oxygen, phosphorus, sulfur, fluorine, iodine, and chlorine. The compound substituted with such an isotope is also useful as a pharmaceutical and includes all radiolabeled compounds of the compound of the present invention.

The present invention is described in more detail with reference to, but is not limited to, the following Comparative Examples, Examples, and Test Examples.

The following abbreviations are used in Examples.
TFA: Trifluoroacetic acid
Pt—C: Platinum-carbon
Pd—C: Palladium-carbon
Pd(OH)$_2$—C: Palladium(II) hydroxide-carbon
Pd$_2$(dba)$_3$·CHCl$_3$: Tris(dibenzylideneacetone)bispalladium chloroform adduct
Pd$_2$(dba)$_3$: Tris(dibenzylideneacetone)bispalladium
Pd(dppf)Cl$_2$·CH$_2$Cl$_2$: [1,1'-Bis(diphenylphosphino)ferrocene]-dichloropalladium(II)·dichloromethane adduct
Pd(OAc)$_2$: Palladium(II) acetate
dppf: 1,1'-Bis(diphenylphosphino)ferrocene
XPhos: 2-Dicyclohexylphosphino-2',4',6'-triisopropylbiphenyl
RuPhos: 2-Dicyclohexylphosphino-2',6'-diisopropylbiphenyl
Dave-Phos: 2-Dicyclohexylphosphino-2'-(N,N-dimethylamino) biphenyl
SPhos: 2-Dicyclohexylphosphino-2',6'-dimethoxybiphenyl
PPh$_3$: Triphenylphosphine
Rh$_2$(OAc)$_4$: Rhodium(II) acetate dimer
Boc: Tert-butoxycarbonyl
Bn: Benzyl
Ts: 4-Toluenesulfonyl
HBTU: O-(1H-benzotriazol-1-yl)-N,N,N',N'-tetramethyluronium hexafluorophosphate
HATU: O-(7-azabenzotriazol-1-yl)-N,N,N',N'-tetramethyluronium hexafluorophosphate
TBTU: O-(1H-benzotriazol-1-yl)-N,N,N',N'-tetramethyluronium tetrafluoroborate
EEDQ: 1-Ethoxycarbonyl-2-ethoxy-1,2-dihydroquinoline
TCFH: Chloro-N,N,N',N'-tetramethylformamidinium hexafluorophosphate
EDCI: 1-Ethyl-3-(3-dimethylaminopropyl)carbodiimide hydrochloride
DMT-MM: 4-(4,6-Dimethoxy-1,3,5-triazin-2-yl)-4-methylmorpholinium chloride
COMU: N-[1-(cyano-2-ethoxy-2-oxoethylideneaminooxy) dimethylamino (morpholino)] uronium hexafluorophosphate
CDI: N,N'-carbonyldiimidazole
HOBt: 1-Hydroxybenzotriazole
HOAt: 1-Hydroxy-7-azabenzotriazole
DMAP: 4-Dimethylaminopyridine
DEAD: Diethyl azodicarboxylate
DMA: Dimethylacetamide
DMF: Dimethylformamide
DMSO: Dimethylsulfoxide
THF: Tetrahydrofuran
NMP: N-methylpyrrolidone
DIPEA: N,N-diisopropylethylamine
TEA: Triethylamine
DBU: 1,8-Diazabicyclo[5.4.0]-7-undecene
CDCl$_3$: Deuterated chloroform
DMSO-d6: Deuterated dimethylsulfoxide
TLC: Thin layer chromatography
MS: Mass spectrometry
LCMS: High performance liquid chromatography-Mass spectrometry
ESI: Electron Spray Ionization
M: Molar concentration (mol/L)

MS was performed using LCMS. ESI was used as a method for ionization. Observed values of the mass spectrometry are expressed as m/z.

The measurement conditions for LCMS are as follows:
Instrument: ACQUITY UPLC MS/PDA system (Waters)
Mass spectrometer: Waters 3100 MS detector
Photodiode array detector: ACQUITY PDA detector (UV-detected wavelength: 210 nm to 400 nm)
Column: Acquity BEH C18, 1.7 μm, 2.1×50 mm
Flow rate: 0.5 mL/min
Column temperature: 40° C.
Solvent;
A: 0.1% formic acid/H$_2$O (v/v; the same hereinafter)
B: 0.1% formic acid/acetonitrile $^1$H NMR spectrum was obtained using JNM-ECS400 Nuclear Magnetic Resonance Spectrometer (JEOL RESONANCE Ltd.). The observed peaks are shown as chemical shift values δ (ppm) (s=singlet, d=doublet, t=triplet, q=quartet, brs=broad singlet, m=multiplet, dd=double doublet, dt=double triplet).

In the experiment using microwave, Initiator 60 (manufactured by Biotage) was used, which can achieve a temperature of 40° C. to 250° C. and a pressure of up to 20 bar.

The compounds described herein were named using naming software, ACD/NAME (registered trademark, Advanced Chemistry Development Inc.) according to IUPAC rules, or ChemBioDraw (version 14.0, Cambridge Soft), or named according to IUPAC nomenclature.

In a name of a compound, the descriptors "r" and "s" (lower case) refer to the stereochemistry of pseudoasymmetric carbon atom according IUPAC rules.

Reference Example 1: 1-[1-(Ethoxymethyl)cyclopentyl]-N-methylmethaneamine hydrochloride

[Step 1] Preparation of 1-(ethoxymethyl)cyclopentane-1-carbonitrile

60% sodium hydride (17 g) was added to a solution of 1-(hydroxymethyl)cyclopentane-1-carbonitrile (43 g) in DMF (1150 mL) under ice-cooling, and the mixture was stirred at room temperature for 1 hour. Ethyl iodide (64 g) was added to the reaction mixture under ice-cooling, and the mixture was stirred at room temperature. After confirming the consumption of the starting material on TLC, water and ethyl acetate were added to the reaction mixture, and the aqueous layer was extracted with ethyl acetate. The combined organic layer was washed with water and saturated saline and dried over anhydrous sodium sulfate, and then the solvent was removed under reduced pressure. The residue was purified by silica gel column chromatography to afford the title compound (48 g).

[Step 2] Preparation of tert-butyl {[1-(ethoxymethyl)cyclopentyl]methyl}methyl carbamate Lithium aluminum hydride (11 g) was suspended in THF (800 mL), and a solution of 1-(ethoxymethyl)cyclopentane-1-carbonitrile (46 g), obtained in Step 1, in THF (200 mL) was added dropwise to the mixture with stirring under ice-cooling. After the completion of the dropping, the mixture was stirred at room temperature for 2 hours. Water (11 mL), 15% aq. sodium hydroxide (11 mL), and water (34 mL) were sequentially added dropwise to the reaction mixture under ice-cooling. The mixture was stirred at room temperature for 2 hours, and the insolubles were filtered off through Celite and washed with THF (220 mL) three times. TEA (46 mL) and di-tert-butyl dicarbonate (72 g) were added to the filtrate with stirring at room temperature, and the mixture was stirred at the same temperature for 2 hours. The reaction mixture was concentrated under reduced pressure, and the residue was diluted with water and extracted with ethyl acetate. The organic layer was washed with saturated saline, dried over anhydrous sodium sulfate, and then concentrated under reduced pressure. The obtained residue was dissolved in DMF (600 mL), 60% sodium hydride (14 g) was added to the solution under ice-cooling, and the mixture was stirred at room temperature for 1 hour. Methyl iodide (23 mL) was added dropwise to the reaction mixture under ice-cooling, and the mixture was stirred at room temperature for 15 hours. The reaction mixture was ice-cooled, diluted with water, and then extracted with ethyl acetate-hexane (1:2). The organic layer was washed with saturated saline and dried over anhydrous sodium sulfate, and then the solvent was removed under reduced pressure. The residue was purified by silica gel column chromatography to afford the title compound (71 g).

[Step 3] Preparation of 1-[1-(ethoxymethyl)cyclopentyl]-N-methylmethaneamine hydrochloride Hydrogen chloride (4 M solution in ethyl acetate, 328 mL) was added at room temperature to a solution of tert-butyl {[1-(ethoxymethyl)cyclopentyl]methyl}methyl carbamate (71 g), obtained in Step 2, in ethyl acetate (53 mL), and the mixture was stirred at the same temperature for 2 hours. The reaction mixture was concentrated under reduced pressure, and the precipitated solid was collected by filtration, washed with hexane, and then dried to afford the title compound (50 g).

Reference Example 2: 1-[1-(Methoxymethyl)cyclopentyl]-N-methylmethaneamine hydrochloride

[Step 1] Preparation of tert-butyl {[1-(hydroxymethyl)cyclopentyl]methyl}carbamate TEA (60 mL) and a solution of di-tert-butyl dicarbonate (94 g) in THF (101 mL) were sequentially added dropwise to a solution of [1-(aminomethyl)cyclopentyl] methanol (51 g) in THF (304 mL) under ice-cooling, and the mixture was stirred at room temperature overnight. The reaction mixture was diluted with water and ethyl acetate, and the aqueous layer was extracted with ethyl acetate. The combined organic layer was washed with saturated saline and dried over anhydrous sodium sulfate, and then the solvent was removed under reduced pressure. The residue was diluted with ethyl acetate-hexane (1:9) (700 mL) and, the dilution was stirred at room temperature for 3 hours. The precipitate was collected by filtration, washed with hexane, and then dried to afford the title compound (49 g). In addition, the solvent was removed under reduced pressure from the filtrate, and the residue was purified by silica gel column chromatography to afford the title compound (16 g).

[Step 2] Preparation of tert-butyl {[1-(methoxymethyl)cyclopentyl]methyl}methyl carbamate Methyl iodide (47 mL) was added to a solution of tert-butyl {[1-(hydroxymethyl)cyclopentyl]methyl}carbamate (58 g), obtained in Step 1, in DMF (505 mL) with stirring at room temperature. Subsequently, 60% sodium hydride (30 g) was added in several portions to the mixture under ice-cooling. The mixture was stirred under ice cooling for 30 minutes and then stirred at room temperature overnight. Water (800 mL) was added dropwise to the reaction mixture under ice-cooling, and the mixture was extracted with ethyl acetate. The organic layer was washed with saturated saline and dried over anhydrous sodium sulfate, and then the solvent was removed under reduced pressure. The residue was purified by silica gel column chromatography to afford the title compound (68 g). [Step 3] Preparation of 1-[1-(methoxymethyl)cyclopentyl]-N-methylmethaneamine hydrochloride The title compound (52 g) was obtained according to the method as described in Reference Example 1, Step 3, using tert-butyl {[1-(methoxymethyl)cyclopentyl]methyl}methyl carbamate obtained in Reference Example 2, Step 2, instead of tert-butyl {[1-(ethoxymethyl)cyclopentyl]methyl}methyl carbamate.

Reference Example 3: 6-Chloro-$N^4$-(3-methoxy-2,2-dimethylpropyl)-$N^4$-methyl-3-nitropyridine-2,4-diamine A mixture of 4,6-dichloro-3-nitropyridin-2-amine (6.3 g), 3-methoxy-N,2,2-trimethylpropan-1-amine hydrochloride (6.6 g), DIPEA (16 mL), and 2-propanol (100 mL) was stirred at 60° C. for 1 hour. Water (50 mL) was added to the mixture at room temperature, and the precipitate was collected by filtration, washed sequentially with 2-propanol and water, and then dried to afford the title compound (8.0 g).

Reference Example 4: 6'-Cyclopropyl-$N^4$-{[1-(methoxymethyl)cyclohexyl]methyl}-$N^4$-methyl-5-nitro-5'-(trifluoromethyl)[2,3'-bipyridine]-4,6-diamine A mixture of 6-chloro-$N^4$-{[1-(methoxymethyl)cyclohexyl]methyl}-$N^4$-methyl-3-nitropyridine-2,4-diamine (2.5 g), 2-cyclopropyl-5-(4,4,5,5-tetramethyl-1,3,2-dioxaborolan-2-yl)-3-(trifluoromethyl)pyridine (2.7 g), potassium carbonate (3.0 g), 1,4-dioxane (29 mL), and water (11 mL) was degassed, Pd(dppf)Cl$_2$·CH$_2$Cl$_2$ (0.24 g) was added to the mixture with stirring at room temperature under an argon atmosphere, and the mixture was stirred at 95° C. for 2 hours. The reaction mixture was diluted with water and ethyl acetate at room temperature, and the aqueous layer was extracted with ethyl acetate. The combined organic layer was washed with water and saturated saline, dried over anhydrous magnesium sulfate, and then concentrated under reduced pressure. The residue was purified by silica gel column chromatography to afford the title compound (3.5 g).

Reference Example 5: 2'-Ethoxy-N$^4$-{[1-(ethoxymethyl)cyclopentyl]methyl}-N$^4$-methyl-6'-(trifluoromethyl)[2,4'-bipyridine]-4,5,6-triamine A mixture of 6-chloro-N$^4$-{[1-(ethoxymethyl)cyclopentyl]methyl}-N$^4$-methyl-3-nitropyridine-2,4-diamine (0.70 g), 2-ethoxy-4-(4,4,5,5-tetramethyl-1,3,2-dioxaborolan-2-yl)-6-(trifluoromethyl)pyridine (0.78 g), potassium carbonate (0.85 g), Pd(dppf)Cl$_2$·CH$_2$Cl$_2$ (67 mg), 1,4-dioxane (8.2 mL), and water (3.1 mL) was degassed, and stirred at 90° C. under an argon atmosphere for 2 hours. The reaction mixture was diluted with water and ethyl acetate at room temperature, and the aqueous layer was extracted with ethyl acetate. The combined organic layer was washed with water and saturated saline, dried over anhydrous sodium sulfate, and then concentrated under reduced pressure. The residue was purified by silica gel column chromatography to afford 2'-ethoxy-N$^4$-{[1-(ethoxymethyl)cyclopentyl]methyl}-N$^4$-methyl-5-nitro-6'-(trifluoromethyl)[2,4'-bipyridine]-4,6-diamine. This compound was mixed with 2-propanol (6.8 mL), water (3.4 mL), ammonium chloride (0.33 g), and zinc powder (0.67 mg), and the mixture was stirred at room temperature for 1 hour. The insolubles were filtered off through Celite, and the filtrate was concentrated under reduced pressure. The residue was purified by silica gel column chromatography to afford the title compound (0.83 g).

Reference Example 6: 6'-Ethoxy-N$^4$-{[1-(methoxymethyl)cyclohexyl]methyl}-N$^4$-methyl-5'-(trifluoromethyl)[2,3'-bipyridine]-4,5,6-triamine Ammonium chloride (165 mg) and reduced iron (powder, 172 mg) were added to a mixture of 6'-ethoxy-N$^4$-{[1-(methoxymethyl)cyclohexyl]methyl}-N$^4$-methyl-5-nitro-5'-(trifluoromethyl)[2,3'-bipyridine]-4,6-diamine (510 mg), 2-propanol (7.5 mL), and water (2.5 mL) at room temperature, and the mixture was stirred at 90° C. overnight. The mixture was diluted with ethyl acetate and water at room temperature, and the insolubles were filtered off. The filtrate was extracted with ethyl acetate, and the organic layer was washed with saturated saline and then dried over anhydrous sodium sulfate. The solvent was removed under reduced pressure, and the residue was purified by silica gel column chromatography to afford the title compound (429 mg).

Reference Example 7: 6'-Cyclopropyl-N$^4$-{[1-(ethoxymethyl)cyclopentyl]methyl}-N$^4$-methyl-5'-(trifluoromethyl)[2,3'-bipyridine]-4,5,6-triamine Zinc powder (3.9 g) was added to a mixture of 6'-cyclopropyl-N$^4$-{[1-(ethoxymethyl)cyclopentyl]methyl}-N$^4$-methyl-5-nitro-5'-(trifluoromethyl)[2,3'-bipyridine]-4,6-diamine (5.8 g), ammonium chloride (1.9 g), 2-propanol (39 mL), and water (20 mL) with stirring at room temperature, and the mixture was stirred at 50° C. for 4 hours. The reaction mixture was diluted with ethyl acetate at room temperature, and the insolubles were filtered off. The filtrate was concentrated under reduced pressure, and then the residue was purified by silica gel column chromatography to afford the title compound (5.3 g).

Reference Example 8: 5-[6-Ethoxy-5-(trifluoromethyl)pyridin-3-yl]-N$^7$-{[1-(methoxymethyl)cyclohexyl]methyl}-N$^7$-methyl-1H-imidazo[4,5-b]pyridine-2,7-diamine 6'-Ethoxy-N$^4$-{[1-(methoxymethyl)cyclohexyl]methyl}-N$^4$-methyl-5'-(trifluoromethyl)[2,3'-bipyridine]-4,5,6-triamine (0.39 g) was dissolved in methanol (4.2 mL), cyanogen bromide (0.18 g) was added to the solution under ice-cooling, and the mixture was stirred at room temperature for 10 minutes and then stirred at 50° C. for 6 hours. The mixture was cooled to room temperature, then diluted with water and saturated sodium bicarbonate aqueous solution, and extracted with ethyl acetate. The organic layer was washed sequentially with water and saturated saline, and then the solvent was removed under reduced pressure. The residue was purified by silica gel column chromatography to afford the title compound (0.27 g).

Reference Example 9: 5-[6-Cyclopropyl-5-(trifluoromethyl)pyridin-3-yl]-N$^7$-{[1-(methoxymethyl)cyclopentyl]methyl}-N$^7$-methyl-1H-imidazo[4,5-b]pyridine-2,7-diamine 6'-Cyclopropyl-N$^4$-{[1-(methoxymethyl)cyclopentyl]methyl}-N$^4$-methyl-5'-(trifluoromethyl)[2,3'-bipyridine]-4,5,6-triamine (0.42 g) was dissolved in methanol (4.6 mL), cyanogen bromide (0.20 g) was added to the solution under ice-cooling, and the mixture was stirred at room temperature for 10 minutes and then stirred at 50° C. for 6 hours. The mixture was cooled to room temperature, then diluted with water and saturated sodium bicarbonate aqueous solution, and extracted with ethyl acetate. The organic layer was washed sequentially with water and saturated saline, and then the solvent was removed under reduced pressure. The residue was purified by silica gel column chromatography to afford the title compound (0.31 g).

Reference Example 10: 5-(2-Ethoxy-2-oxoethyl)pyridine-2-carboxylic acid

[Step 1] Preparation of benzyl 5-(2-ethoxy-2-oxoethyl) picolinate

A mixture of ethyl 2-(6-bromopyridin-3-yl)acetate (100 mg), Pd(dppf)Cl$_2$·CH$_2$Cl$_2$ (34 mg), dppf (45 mg), TEA (0.57 mL), DMF (1 mL), and benzyl alcohol (1 mL) was degassed and purged with argon. The mixture was stirred at 80° C. under a carbon monoxide atmosphere at normal pressure overnight. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (105 mg).

[Step 2] Preparation of 5-(2-ethoxy-2-oxoethyl)pyridine-2-carboxylic acid

Benzyl 5-(2-ethoxy-2-oxoethyl) picolinate (105 mg) obtained in Step 1 was dissolved in isopropanol (1.5 mL), and 20% Pd(OH)$_2$—C (20 mg) was added to the solution. The mixture was degassed, purged with argon, and then stirred at room temperature under a hydrogen atmosphere at normal pressure for 5 hours. The insolubles of the reaction mixture were filtered off and washed with ethyl acetate. The resulting filtrate was concentrated under reduced pressure to afford the title compound (63 mg).

Reference Example 11: 5-(3-Ethoxy-3-oxopropyl)pyridine-2-carboxylic acid

[Step 1] Preparation of benzyl (E)-5-(3-ethoxy-3-oxoprop-1-en-1-yl) picolinate

A mixture of benzyl 5-bromopicolinate (2.2 g), Pd(OAc)$_2$ (166 mg), tri-o-tolylphosphine (451 mg), DIPEA (2.6 mL), ethyl acrylate (3.2 mL), and propionitrile (15 mL) was degassed, purged with argon, and then stirred at 110° C. overnight. The reaction mixture was diluted with water and ethyl acetate at room temperature, and the aqueous layer was extracted with ethyl acetate. The combined organic layer was washed with water and saturated saline, dried over anhydrous sodium sulfate, and then concentrated under reduced pressure. The residue was purified by silica gel column chromatography to afford the title compound (1.9 g).
[Step 2] Preparation of 5-(3-ethoxy-3-oxopropyl)pyridine-2-carboxylic acid Benzyl (E)-5-(3-ethoxy-3-oxoprop-1-en-1-yl) picolinate (1.9 g) obtained in Step 1 was dissolved in isopropanol (20 mL) and THF (5 mL), and 10% Pd—C (200 mg) was added to the solution. The mixture was degassed, purged with argon, and then stirred at room temperature under a 0.4 MPa hydrogen atmosphere overnight. The insolubles were filtered off and washed with ethyl acetate. The resulting filtrate was concentrated under reduced pressure, the residue was suspended in hexane-ethyl acetate (10:1) (200 mL), and the precipitate was collected by filtration. The collected precipitate was washed with hexane and then dried to afford the title compound (1.3 g).

Reference Example 12: 5-(3-Ethoxy-3-oxopropyl)-4-methoxypyridine-2-carboxylic acid

[Step 1] Preparation of benzyl 5-bromo-4-methoxypicolinate

Benzyl bromide (0.38 mL) was added to a mixture of 5-bromo-4-methoxypicolinic acid (622 mg), potassium carbonate (741 mg), and DMF (5 mL), and the mixture was stirred at 80° C. for 1 hour. The reaction mixture was cooled to room temperature and then diluted with water and ethyl acetate, and the aqueous layer was extracted with ethyl acetate. The combined organic layer was washed with water and saturated saline, dried over anhydrous sodium sulfate, and then concentrated under reduced pressure. The residue was purified by silica gel column chromatography to afford the title compound (779 mg).
[Step 2] Preparation of benzyl (E)-5-(3-ethoxy-3-oxoprop-1-en-1-yl)-4-methoxypicolinate Benzyl 5-bromo-4-methoxypicolinate (779 mg) obtained in Step 1 was mixed with Pd(OAc)$_2$ (54 mg), tri-o-tolylphosphine (147 mg), DIPEA (0.84 mL), ethyl acrylate (1.1 mL), and DMF (4.8 mL). The mixture was degassed, purged with argon, and then stirred at 110° C. overnight. The reaction mixture was diluted with water and ethyl acetate at room temperature, and the aqueous layer was extracted with ethyl acetate. The combined organic layer was washed with water and saturated saline, dried over anhydrous sodium sulfate, and then concentrated under reduced pressure. The residue was purified by silica gel column chromatography to afford the title compound (496 mg).
[Step 3] Preparation of 5-(3-ethoxy-3-oxopropyl)-4-methoxypyridine-2-carboxylic acid Benzyl (E)-5-(3-ethoxy-3-oxoprop-1-en-1-yl)-4-methoxypicolinate (496 mg) obtained in Step 2 was dissolved in isopropanol (5 mL), THF (5 mL), and ethanol (5 mL), and 10% Pd—C (100 mg) was added to the solution. The mixture was degassed, purged with argon, and then stirred at room temperature under a 0.4 MPa hydrogen atmosphere overnight. The insolubles were filtered off and washed with ethyl acetate. The resulting filtrate was concentrated under reduced pressure, the residue was suspended in hexane-ethyl acetate (10:1) (50 mL), and the precipitate was collected by filtration. The collected precipitate was washed with hexane and then dried to afford the title compound (297 mg).

Reference Example 13: 5-[2-(Ethoxycarbonyl)cyclopropyl]pyridine-2-carboxylic acid hydrochloride

[Step 1] Preparation of tert-butyl (E)-5-(3-ethoxy-3-oxoprop-1-en-1-yl) picolinate A mixture of tert-butyl 5-bromopicolinate (200 mg), Pd(OAc)$_2$ (35 mg), tri-o-tolylphosphine (94 mg), DIPEA (0.27 mL), ethyl acrylate (0.34 mL), and DMF (2 mL) was degassed and purged with argon. The mixture was stirred at 110° C. overnight. The reaction mixture was diluted with water and ethyl acetate at room temperature, and the aqueous layer was extracted with ethyl acetate. The combined organic layer was washed with water and saturated saline, dried over anhydrous sodium sulfate, and then concentrated under reduced pressure. The residue was purified by silica gel column chromatography to afford the title compound (197 mg).
[Step 2] Preparation of tert-butyl 5-[2-(ethoxycarbonyl)cyclopropyl]picolinate Sodium hydride (27 mg) was added to a mixture of trimethylsulfoxonium iodide (157 mg) and DMSO (1.8 mL), and the mixture was stirred at room temperature for 15 minutes. Tert-butyl (E)-5-(3-ethoxy-3-oxoprop-1-en-1-yl) picolinate (147 mg) obtained in Step 1 was added to the mixture, and the mixture was stirred at room temperature overnight. The reaction mixture was diluted with water and ethyl acetate, and the aqueous layer was extracted with ethyl acetate. The combined organic layer was washed with water and saturated saline, dried over anhydrous sodium sulfate, and then concentrated under reduced pressure. The residue was purified by silica gel column chromatography to afford the title compound (79 mg).
[Step 3] Preparation of 5-[2-(ethoxycarbonyl)cyclopropyl]pyridine-2-carboxylic acid hydrochloride Hydrogen chloride (4 M solution in 1,4-dioxane, 0.87 mL) was added to tert-butyl 5-[2-(ethoxycarbonyl)cyclopropyl]picolinate (101 mg) obtained in Step 2, and the mixture was stirred at room temperature overnight. Then, the mixture was stirred at 50° C. for 4 hours. The reaction mixture was concentrated under reduced pressure, the residue was suspended in hexane-chloroform (10:1) (10 mL), and the precipitate was collected by filtration. The collected precipitate was washed with hexane and then dried to afford the title compound (70 mg).

Reference Example 14: 6-(3-Ethoxy-3-oxopropyl)pyridine-3-carboxylic acid

[Step 1] Preparation of benzyl (E)-6-(3-ethoxy-3-oxoprop-1-en-1-yl) nicotinate

A mixture of benzyl 6-methylnicotinate (200 mg), ethyl 2-oxoacetate (47% solution in toluene, 440 mg), and acetic anhydride (0.80 mL) was stirred at 130° C. for 72 hours. The mixture was cooled to room temperature and then concentrated under reduced pressure. The residue was purified by silica gel column chromatography to afford the title compound (267 mg).
[Step 2] Preparation of 6-(3-ethoxy-3-oxopropyl)pyridine-3-carboxylic acid Benzyl (E)-6-(3-ethoxy-3-oxoprop-1-en-1-yl) nicotinate (267 mg) obtained in Step 1 was dissolved in ethanol (10 mL), and 10% Pd—C (27 mg) was added to the solution. The mixture was degassed, purged with argon, and then stirred at room temperature under a 0.4 MPa hydrogen atmosphere overnight. The insolubles were filtered off and washed with ethyl acetate. The resulting filtrate was concentrated under reduced pressure, the residue was suspended in hexane-chloroform (10:1, 30 mL), and the precipitate was collected by filtration. The collected precipitate was washed with hexane and then dried to afford the title compound (97 mg).

Reference Example 15: 5-(5-Ethoxy-5-oxopentyl)pyridine-2-carboxylic acid

[Step 1] Preparation of benzyl 5-(5-ethoxy-5-oxopent-1-yn-1-yl) picolinate

A mixture of benzyl 5-bromopicolinate (200 mg), Pd(PPh$_3$)$_4$ (158 mg), copper (I) iodide (26 mg), TEA (0.48 mL), and DMF (1.4 mL) was degassed and purged with argon. The mixture was stirred at 75° C. for 2 hours. Saturated aq. ammonium chloride was added to the reaction mixture at room temperature, and the mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography to afford the title compound (251 mg).

[Step 2] Preparation of 5-(5-ethoxy-5-oxopentyl)pyridine-2-carboxylic acid

Benzyl 5-(5-ethoxy-5-oxopent-1-yn-1-yl) picolinate (230 mg) obtained in Step 1 was dissolved in isopropanol (5 mL) and THF (2 mL), and 10% Pd—C (40 mg) was added to the solution. The mixture was degassed, purged with argon, and then stirred at room temperature under a 0.4 MPa hydrogen atmosphere overnight. The insolubles were filtered off through Celite and washed with methanol. The resulting filtrate was concentrated under reduced pressure, the residue was suspended in hexane-chloroform (10:1, 20 mL), and the precipitate was collected by filtration. The collected precipitate was washed with hexane and then dried to afford the title compound (139 mg).

Reference Example 16: 5-{[(1R,5S,6r)-6-(Methoxycarbonyl)-3-azabicyclo[3.1.0]hexan-3-yl]methyl}pyridine-2-carboxylic acid dihydrochloride

[Step 1] Preparation of methyl (1R,5S,6r)-3-{[6-(tert-butoxycarbonyl)pyridin-3-yl]methyl}-3-azabicyclo[3.1.0]hexane-6-carboxylate Methyl (1R,5S,6r)-3-azabicyclo[3.1.0]hexane-6-carboxylate hydrochloride (78 mg) was added to a mixture of tert-butyl 5-(bromomethyl) picolinate (100 mg), potassium carbonate (152 mg), and acetonitrile (0.74 mL), and the mixture was stirred at room temperature for 3 hours. The reaction mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography to afford the title compound (83 mg).

[Step 2] Preparation of 5-{[(1R,5S,6r)-6-(methoxycarbonyl)-3-azabicyclo[3.1.0]hexan-3-yl]methyl}pyridine-2-carboxylic acid Hydrogen chloride (4 M solution in 1,4-dioxane, 5 mL) was added to a solution of methyl (1R,5S,6r)-3-{[6-(tert-butoxycarbonyl)pyridin-3-yl]methyl}-3-azabicyclo[3.1.0] hexane-6-carboxylate (83 mg), obtained in Step 1, in 1,4-dioxane (1.5 mL), and the mixture was stirred at 50° C. overnight. The reaction mixture was concentrated under reduced pressure to afford the title compound (75 mg).

Reference Example 17: 5-[(2-Ethoxy-2-oxoethyl)(methyl)amino]pyridine-2-carboxylic acid

[Step 1] Preparation of ethyl N-(6-bromopyridin-3-yl)-N-methylglycinate

Ethyl 2-bromoacetate (0.29 mL) was added to a mixture of 6-bromo-N-methylpyridin-3-amine (622 mg), DIPEA (0.60 mL), and DMF (3.5 mL) with stirring at room temperature, and the mixture was stirred at 110° C. overnight. The reaction mixture was cooled to room temperature and then diluted with water and ethyl acetate, and the aqueous layer was extracted with ethyl acetate. The organic layer was washed with water and saturated saline, dried over anhydrous sodium sulfate, and then concentrated under reduced pressure. The residue was purified by silica gel column chromatography to afford the title compound (395 mg).

[Step 2] Preparation of benzyl 5-[(2-ethoxy-2-oxoethyl)(methyl)amino]picolinate

Ethyl N-(6-bromopyridin-3-yl)-N-methylglycinate (395 mg) obtained in Step 1 was mixed with Pd(dppf)Cl$_2$·CH$_2$Cl$_2$ (118 mg), TEA (0.61 mL), DMF (1.5 mL), and benzyl alcohol (1.5 mL). The mixture was degassed, purged with argon, and then stirred at 80° C. under a carbon monoxide atmosphere at normal pressure for 4 hours. The reaction mixture was cooled to room temperature and then diluted with water and ethyl acetate, and the aqueous layer was extracted with ethyl acetate. The combined organic layer was washed with water and saturated saline, dried over anhydrous sodium sulfate, and then concentrated under reduced pressure. The residue was purified by silica gel column chromatography to afford the title compound (512 mg).

[Step 3] Preparation of 5-[(2-ethoxy-2-oxoethyl)(methyl)amino]pyridine-2-carboxylic acid Benzyl 5-[(2-ethoxy-2-oxoethyl)(methyl)amino]picolinate (512 mg) obtained in Step 2 was dissolved in isopropanol (10 mL), and 10% Pd—C (55 mg) was added to the solution. The mixture was degassed, purged with argon, and stirred at room temperature under a 0.4 MPa hydrogen atmosphere overnight. The insolubles of the reaction mixture were filtered off through Celite and washed with methanol. The resulting filtrate was concentrated under reduced pressure, the residue was suspended in hexane-ethyl acetate (10:1) (50 mL), and the precipitate was collected by filtration. The collected precipitate was washed with hexane and then dried to afford the title compound (300 mg).

Reference Example 18: 5-[4-(Ethoxycarbonyl)piperidin-1-yl]pyridine-2-carboxylic acid

[Step 1] Preparation of benzyl 5-[4-(ethoxycarbonyl)piperidin-1-yl]picolinate

A mixture of benzyl 5-bromopicolinate (150 mg), ethyl piperidine-4-carboxylate (0.12 mL), Pd(OAc)$_2$ (12 mg), RuPhos (48 mg), cesium carbonate (251 mg), and 1,4-dioxane (2.6 mL) was degassed and purged with argon. The mixture was stirred at 100° C. overnight. The reaction mixture was cooled to room temperature and then concentrated under reduced pressure. The residue was purified by silica gel column chromatography to afford the title compound (151 mg).

[Step 2] Preparation of 5-[4-(ethoxycarbonyl)piperidin-1-yl]pyridine-2-carboxylic acid Benzyl 5-[4-(ethoxycarbonyl)piperidin-1-yl]picolinate (151 mg) obtained in Step 1 was dissolved in isopropanol (4 mL) and THF (2 mL), and 20% Pd(OH)$_2$—C (20 mg) was added to the solution. The mixture was degassed, purged with argon, and then stirred at room temperature under a hydrogen atmosphere at normal pressure overnight. The insolubles were filtered off and washed with ethyl acetate. The resulting filtrate was concentrated under reduced pressure, the residue was suspended in hexane-ethyl acetate (10:1) (15 mL), and the precipitate was collected by filtration. The collected precipitate was washed with hexane and then dried to afford the title compound (99 mg).

Reference Example 19: 5-[(3S)-3-(2-Ethoxy-2-oxoethoxy)pyrrolidin-1-yl]pyridine-2-carboxylic acid hydrochloride

[Step 1] Preparation of tert-butyl(S)-5-[3-(2-ethoxy-2-oxoethoxy)pyrrolidin-1-yl]picolinate A mixture of tert-butyl 5-bromopicolinate (100 mg), ethyl(S)-2-(pyrrolidin-3-yloxy)acetate hydrochloride (122 mg), Pd(OAc)$_2$ (8.7 mg), RuPhos (36 mg), cesium carbonate (379 mg), and 1,4-dioxane (1.9 mL) was degassed and purged with argon. The mixture was stirred at 100° C. overnight. The reaction mixture was cooled to room temperature and then concentrated under reduced pressure. The residue was purified by silica gel column chromatography to afford the title compound (120 mg).

[Step 2] Preparation of 5-[(3S)-3-(2-ethoxy-2-oxoethoxy)pyrrolidin-1-yl]pyridine-2-carboxylic acid hydrochloride Hydrogen chloride (4 M solution in 1,4-dioxane, 1.7 mL) was added to a solution of tert-butyl(S)-5-[3-(2-ethoxy-2-oxoethoxy)pyrrolidin-1-yl]picolinate (120 mg), obtained in Step 1, in 1,4-dioxane (0.50 mL), and the mixture was stirred at 50° C. for 5 hours. The reaction mixture was concentrated under reduced pressure to afford the title compound (89 mg).

Reference Example 20: 6-[(2-Ethoxy-2-oxoethyl)(methyl)amino]pyrimidine-4-carboxylic acid

[Step 1] Preparation of benzyl 6-[(2-ethoxy-2-oxoethyl)(methyl)amino]pyrimidine-4-carboxylate Ethyl 2-methylglycinate hydrochloride (37 mg) was added to a mixture of benzyl 6-chloropyrimidine-4-carboxylate (50 mg), TEA (0.084 mL), and acetonitrile (0.40 mL), and the mixture was stirred at 50° C. for 2 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (74 mg).

[Step 2] Preparation of 6-[(2-ethoxy-2-oxoethyl)(methyl)amino]pyrimidine-4-carboxylic acid Benzyl 6-[(2-ethoxy-2-oxoethyl)(methyl)amino]pyrimidine-4-carboxylate (102 mg) obtained in Step 1 was dissolved in isopropanol (1 mL), and 20% Pd(OH)$_2$—C (11 mg) was added to the solution. The mixture was degassed, purged with argon, and then stirred at room temperature under a hydrogen atmosphere at normal pressure overnight. The insolubles were filtered off and washed with ethyl acetate. The resulting filtrate was concentrated under reduced pressure, the residue was suspended in hexane-chloroform (10:1) (10 mL), and the precipitate was collected by filtration. The collected precipitate was washed with hexane and then dried to afford the title compound (64 mg).

Reference Example 21: 5-[2-(Methoxycarbonyl)pyrrolidine-1-carbonyl]pyridine-2-carboxylic acid

[Step 1] Preparation of benzyl 5-[2-(methoxycarbonyl)pyrrolidine-1-carbonyl]picolinate HATU (233 mg) was added to a mixture of 6-[(benzyloxy)carbonyl] nicotinic acid hydrochloride (100 mg), DIPEA (0.30 mL), and DMF (1 mL), and the mixture was stirred at room temperature for 10 minutes. Methyl prolinate hydrochloride (85 mg) was added to the mixture, and the mixture was stirred at room temperature for 2 hours. Saturated aq. sodium bicarbonate was added to the reaction mixture, and the mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography to afford the title compound (160 mg).

[Step 2] Preparation of 5-[2-(methoxycarbonyl)pyrrolidine-1-carbonyl]pyridine-2-carboxylic acid Benzyl 5-[2-(methoxycarbonyl)pyrrolidine-1-carbonyl]picolinate (160 mg) obtained in Step 1 was dissolved in isopropanol (4 mL) and THF (2 mL), and 20% Pd(OH)$_2$—C (40 mg) was added to the solution. The mixture was degassed, purged with argon, and then stirred at room temperature under a hydrogen atmosphere at normal pressure overnight. The insolubles were filtered off and washed with methanol. The resulting filtrate was concentrated under reduced pressure to afford the title compound (134 mg).

Reference Example 22: 5-[(2-Ethoxy-2-oxoethoxy)methyl]pyridine-2-carboxylic acid hydrochloride

[Step 1] Preparation of tert-butyl 5-[(2-ethoxy-2-oxoethoxy)methyl]picolinate

60% sodium hydride (17 mg) was added in several portions to a solution of tert-butyl 5-(hydroxymethyl) picolinate (73 mg) in THF (0.70 mL) under ice-cooling. The mixture was stirred under ice-cooling for 10 minutes, ethyl 2-bromoacetate (0.050 mL) was then added to the mixture, and the mixture was stirred at room temperature overnight. The reaction mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography to afford the title compound (33 mg).

[Step 2] Preparation of 5-[(2-ethoxy-2-oxoethoxy)methyl]pyridine-2-carboxylic acid hydrochloride Hydrogen chloride (4 M solution in 1,4-dioxane, 0.57 mL) was added to tert-butyl 5-[(2-ethoxy-2-oxoethoxy)methyl]picolinate (33 mg) obtained in Step 1, and the mixture was stirred at 50° C. for 3 hours. The reaction mixture was concentrated under reduced pressure, the residue was suspended in hexane-chloroform (10:1) (3 mL), and the precipitate was collected by filtration. The collected precipitate was washed with hexane and then dried to afford the title compound (26 mg).

Reference Example 23: 5-[2-(2-Ethoxy-2-oxoethoxy)ethyl]pyridine-2-carboxylic acid

[Step 1] Preparation of ethyl 2-[2-(6-chloropyridin-3-yl)ethoxy]acetate 15% ethyl diazoacetate (solution in toluene, 2.9 mL) was added dropwise to a mixture of 2-(6-chloro-pyridin-3-yl) ethan-1-ol (435 mg), Rh$_2$(OAc)$_4$ (24 mg), and dichloromethane (10 mL) with stirring at room temperature over 15 minutes, and the mixture was stirred at room temperature overnight. Subsequently, Rh$_2$(OAc)$_4$ (24 mg) was added to the mixture, 15% ethyl diazoacetate (solution in toluene, 2.9 mL) was then added dropwise to the mixture over 15 minutes, and the mixture was stirred at room temperature overnight. The reaction mixture was concentrated under reduced pressure, and then the residue was purified by silica gel column chromatography to afford the title compound (295 mg).

[Step 2] Preparation of benzyl 5-[2-(2-ethoxy-2-oxoethoxy)ethyl]picolinate

Ethyl 2-[2-(6-chloropyridin-3-yl) ethoxy]acetate (295 mg) obtained in Step 1 was mixed with Pd(dppf)Cl$_2$·CH$_2$Cl$_2$ (198 mg), TEA (0.51 mL), DMF (1.2 mL), and benzyl alcohol (1.2 mL). The mixture was degassed, purged with argon, and then stirred at 80° C. under a carbon monoxide atmosphere at normal pressure overnight. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (250 mg).

[Step 3] Preparation of 5-[2-(2-ethoxy-2-oxoethoxy)ethyl]pyridine-2-carboxylic acid Benzyl 5-[2-(2-ethoxy-2-oxoethoxy)ethyl]picolinate (250 mg) obtained in Step 2 was dissolved in isopropanol (5 mL) and THF (1 mL), and 20% Pd(OH)$_2$—C (50 mg) was added to the solution. The mixture was degassed, purged with argon, and then stirred at room temperature under a hydrogen atmosphere at normal pressure overnight. The insolubles were filtered off and washed with methanol. The resulting filtrate was concentrated under reduced pressure to afford the title compound (205 mg).

Reference Example 24:
5-(4-Ethoxy-4-oxobutoxy)pyridine-2-carboxylic acid

[Step 1] Preparation of benzyl 5-(4-ethoxy-4-oxobutoxy)picolinate

Ethyl 4-bromobutanoate (0.059 mL) was added to a mixture of benzyl 5-hydroxypicolinate (86 mg), potassium carbonate (103 mg), and DMF (1.9 mL), and the mixture was stirred at 80° C. overnight. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (131 mg).

[Step 2] Preparation of 5-(4-ethoxy-4-oxobutoxy)pyridine-2-carboxylic acid

Benzyl 5-(4-ethoxy-4-oxobutoxy) picolinate (131 mg) obtained in Step 1 was dissolved in isopropanol (4 mL) and THF (1 mL), and 20% Pd(OH)$_2$—C (30 mg) was added to the solution. The mixture was degassed, purged with argon, and then stirred at room temperature under a hydrogen atmosphere at normal pressure overnight. The insolubles were filtered off and washed with methanol. The resulting filtrate was concentrated under reduced pressure, the residue was suspended in hexane-chloroform (10:1) (15 mL), and the precipitate was collected by filtration. The collected precipitate was washed with hexane and then dried to afford the title compound (75 mg).

Reference Example 25:
4-(2-Ethoxy-2-oxoethoxy)pyridine-2-carboxylic acid

[Step 1] Preparation of benzyl 4-hydroxypicolinate

4-Hydroxypicolinic acid (500 mg) was dissolved in NMP (5 mL), and 60% sodium hydride (158 mg) was added in several portions to the solution with stirring under ice-cooling. The mixture was stirred at room temperature for 1 hour, benzyl bromide (0.43 mL) was then added to the mixture, and the mixture was stirred at 40° C. overnight. The reaction mixture was cooled to room temperature, then saturated aq. sodium bicarbonate was added to the reaction mixture, and the mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography to afford the title compound (346 mg).

[Step 2] Preparation of benzyl 4-(2-ethoxy-2-oxoethoxy)picolinate

Benzyl 4-hydroxypicolinate (346 mg) obtained in Step 1 was mixed with potassium carbonate (625 mg) and acetone (3 mL). Ethyl 2-bromoacetate (0.17 mL) was added to the mixture with stirring at room temperature, and the mixture was stirred at 60° C. for 2 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (58 mg).

[Step 3] Preparation of 4-(2-ethoxy-2-oxoethoxy)pyridine-2-carboxylic acid

Benzyl 4-(2-ethoxy-2-oxoethoxy) picolinate (58 mg) obtained in Step 2 was dissolved in isopropanol (1 mL), and 20% Pd(OH)$_2$—C (6.0 mg) was added to the solution. The mixture was degassed, purged with argon, and then stirred at room temperature under a hydrogen atmosphere at normal pressure overnight. The insolubles were filtered off and washed with methanol. The resulting filtrate was concentrated under reduced pressure to afford the title compound (21 mg).

Reference Example 26:
6-(2-Ethoxy-2-oxoethoxy)pyrimidine-4-carboxylic acid hydrochloride

[Step 1] Preparation of tert-butyl 6-(2-ethoxy-2-oxoethoxy)pyrimidine-4-carboxylate A mixture of tert-butyl 6-chloropyrimidine-4-carboxylate (274 mg), ethyl 2-hydroxyacetate (0.15 mL), potassium carbonate (529 mg), and DMF (2.6 mL) was stirred at 50° C. overnight. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (253 mg).

[Step 2] Preparation of 6-(2-ethoxy-2-oxoethoxy)pyrimidine-4-carboxylic acid hydrochloride Hydrogen chloride (4 M solution in 1,4-dioxane, 3.2 mL) was added to tert-butyl 6-(2-ethoxy-2-oxoethoxy)pyrimidine-4-carboxylate (300 mg) obtained in Step 1, and the mixture was stirred at room temperature overnight. The reaction mixture was concentrated under reduced pressure, the residue was suspended in hexane-diethyl ether (3:1) (12 mL), and the precipitate was collected by filtration. The collected precipitate was washed with hexane and then dried to afford the title compound (244 mg).

Reference Example 27: 1-(4-Ethoxy-4-oxobutan-2-yl)-1H-imidazole-4-carboxylic acid

[Step 1] Preparation of benzyl 1-(4-ethoxy-4-oxobutan-2-yl)-1H-imidazole-4-carboxylate Ethyl 3-bromobutanoate (0.20 mL) was added to a mixture of benzyl 1H-imidazole-4-carboxylate (205 mg), potassium carbonate (741 mg), and DMF (2 mL) with stirring under ice-cooling, and the mixture was stirred at room temperature overnight. The reaction mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography to afford the title compound (348 mg).

[Step 2] Preparation of 1-(4-ethoxy-4-oxobutan-2-yl)-1H-imidazole-4-carboxylic acid Benzyl 1-(4-ethoxy-4-oxobutan-2-yl)-1H-imidazole-4-carboxylate (348 mg) obtained in Step 1 was dissolved in isopropanol (3.5 mL) and THF (1 mL), and 20% Pd(OH)$_2$—C (35 mg) was added to the solution. The mixture was degassed, purged with argon, and then stirred at room temperature under a hydrogen atmosphere at normal pressure overnight. The insolubles were filtered off and washed with methanol. The resulting filtrate was concentrated under reduced pressure, the residue was suspended in hexane-ethyl acetate (10:1) (15 mL), and the precipitate was collected by filtration. The collected precipitate was washed with hexane and then dried to afford the title compound (184 mg).

Reference Example 28: 6-(3-Ethoxy-3-oxopropyl)-5,6,7,8-tetrahydroimidazo[1,2-a]pyridine-2-carboxylic acid

[Step 1] Preparation of benzyl 6-bromoimidazo[1,2-a]pyridine-2-carboxylate

Benzyl bromide (0.28 mL) was added to a mixture of 6-bromoimidazo[1,2-a]pyridine-2-carboxylic acid (468 mg), potassium carbonate (536 mg), and DMF (6.5 mL), and the mixture was stirred at 80° C. for 2 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (389 mg).

[Step 2] Preparation of benzyl (E)-6-(3-ethoxy-3-oxoprop-1-en-1-yl) imidazo[1,2-a]pyridine-2-carboxylate Benzyl 6-bromoimidazo[1,2-a]pyridine-2-carboxylate (300 mg) obtained in Step 1 was mixed with Pd(OAc)$_2$ (20 mg), tri-o-tolylphosphine (55 mg), DIPEA (0.31 mL), ethyl acrylate (0.30 mL), and DMF (1.8 mL). The mixture was degassed, purged with argon, and then stirred at 110° C. overnight. The reaction mixture was cooled to room temperature, then diluted with water and ethyl acetate, and after filtering off the insolubles through Celite, was extracted with ethyl acetate. The organic layer was washed with water and saturated saline, dried over anhydrous sodium sulfate, and then concentrated under reduced pressure. The residue was purified by silica gel column chromatography to afford the title compound (226 mg).

[Step 3] Preparation of 6-(3-ethoxy-3-oxopropyl)-5,6,7,8-tetrahydroimidazo[1,2-a]pyridine-2-carboxylic acid Benzyl (E)-6-(3-ethoxy-3-oxoprop-1-en-1-yl) imidazo[1,2-a]pyridine-2-carboxylate (226 mg) obtained in Step 2 was dissolved in isopropanol (2 mL), THF (2.5 mL), and methanol (5 mL), and 10% Pd—C (100 mg) was added to the solution. The mixture was degassed, purged with argon, and then stirred at 50° C. under a 0.4 MPa hydrogen atmosphere for 5 hours. The insolubles were filtered off and washed with methanol. The resulting filtrate was concentrated under reduced pressure, the residue was suspended in hexane-ethyl acetate (10:1) (20 mL), and the precipitate was collected by filtration. The collected precipitate was washed with hexane and then dried to afford the title compound (149 mg).

Reference Example 29: 5-[1-(3-Ethoxy-3-oxopropyl)piperidin-4-yl]pyridine-2-carboxylic acid dihydrochloride

[Step 1] Preparation of tert-butyl 5-[1-(3-ethoxy-3-oxopropyl)piperidin-4-yl]picolinate Ethyl 3-bromopropanoate (0.11 mL) was added to a mixture of tert-butyl 5-(piperidin-4-yl) picolinate (180 mg), DIPEA (0.24 mL), and acetonitrile (2 mL), and the mixture was stirred at room temperature for 3 hours. The reaction mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography to afford the title compound (203 mg).

[Step 2] Preparation of 5-[1-(3-ethoxy-3-oxopropyl)piperidin-4-yl]pyridine-2-carboxylic acid dihydrochloride Hydrogen chloride (4 M solution in 1,4-dioxane, 5.6 mL) was added to tert-butyl 5-[1-(3-ethoxy-3-oxopropyl)piperidin-4-yl]picolinate (203 mg) obtained in Step 1, and the mixture was stirred at 50° C. overnight. The reaction mixture was cooled to room temperature and then concentrated under reduced pressure, the residue was suspended in hexane-chloroform (10:1) (20 mL), and the precipitate was collected by filtration. The collected precipitate was washed with hexane and then dried to afford the title compound (158 mg).

Reference Example 30: 7-(3-Ethoxy-3-oxopropyl)-5,6,7,8-tetrahydro-2,7-naphthyridine-3-carboxylic acid dihydrochloride

[Step 1] Preparation of methyl 7-(2,2,2-trifluoroacetyl)-5,6,7,8-tetrahydro-2,7-naphthyridine-3-carboxylate A solution of 4-bromo-1-(2,2,2-trifluoroacetyl)-1,2,5,6-tetrahydropyridine-3-carbaldehyde (2.9 g) in 1,4-dioxane (50 mL) was degassed, Pd(OAc)$_2$ (0.23 g), Dave-Phos (0.81 g), sodium acetate (1.7 g), and methyl 2-acetamidoacrylate (1.9 g) were then added to the solution with stirring at room temperature under an argon atmosphere, and the mixture was stirred at 80° C. for 2 hours and then stirred at 100° C. for 2 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (1.7 g).

[Step 2] Preparation of 7-((benzyloxy)carbonyl)-5,6,7,8-tetrahydro-2,7-naphthyridine-3-carboxylic acid 4 M aq. sodium hydroxide (5.8 mL) was added to a solution of methyl 7-(2,2,2-trifluoroacetyl)-5,6,7,8-tetrahydro-2,7-naphthyridine-3-carboxylate (1.7 g), obtained in Step 1, in THF (20 mL) and water (20 mL) with stirring at room temperature, and the mixture was stirred at room temperature for 1 hour. Then, benzyl chloroformate (0.92 mL) was added to the mixture, and the mixture was stirred for 2 hours. 1 M hydrochloric acid was added to the reaction mixture under ice-cooling, and the mixture was extracted with ethyl acetate. The organic layer was washed with water and saturated saline, dried over anhydrous sodium sulfate, and then concentrated under reduced pressure. The residue was diluted with diethyl ether-hexane (1:1), and the insolubles were collected by filtration and dried to afford the title compound (1.2 g).

[Step 3] Preparation of 2-benzyl 6-(tert-butyl) 3,4-dihydro-2,7-naphthyridine-2,6 (1H)-dicarboxylate Tert-butanol (15 mL) and THF (15 mL) were added to 7-((benzyloxy)carbonyl)-5,6,7,8-tetrahydro-2,7-naphthyridine-3-carboxylic acid (1.2 g) obtained in Step 2 and DMAP (47 mg), di-tert-butyl dicarbonate (2.5 g) was added to the mixture with stirring at room temperature, and the mixture was stirred at 50° C. for 3 hours. The reaction mixture was concentrated under reduced pressure, and the residue was purified by silica gel column chromatography to afford the title compound (1.1 g).

[Step 4] Preparation of tert-butyl 5,6,7,8-tetrahydro-2,7-naphthyridine-3-carboxylate hydrochloride 5% Pd—C (0.62 g) was added to a solution of 2-benzyl 6-(tert-butyl) 3,4-dihydro-2,7-naphthyridine-2,6 (1H)-dicarboxylate (1.1 g), obtained in Step 3, in 2-propanol (10 mL) and THF (10 mL) with stirring at room temperature under an argon atmosphere, and the mixture was stirred at room temperature under a 0.4 MPa hydrogen atmosphere for 4 hours. The reaction mixture was diluted with ethyl acetate, the insolubles were filtered off, and then hydrogen chloride (4 M solution in 1,4-dioxane, 1.5 mL) was added to the mixture. The mixture was concentrated under reduced pressure, the residue was diluted with ethyl acetate, and the precipitate was collected by filtration and dried to afford the title compound (0.75 g).

[Step 5] Preparation of tert-butyl 7-(3-ethoxy-3-oxopropyl)-5,6,7,8-tetrahydro-2,7-naphthyridine-3-carboxylate DIPEA (0.89 mL) and ethyl 3-bromopropionate (0.25 mL) were added to a solution of tert-butyl 5,6,7,8-tetrahydro-2,7-naphthyridine-3-carboxylate hydrochloride (0.35 g), obtained in Step 4, in acetonitrile (5 mL) with stirring at room temperature, and the mixture was stirred at 80° C. for 4 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (0.29 g).

[Step 6] Preparation of 7-(3-ethoxy-3-oxopropyl)-5,6,7,8-tetrahydro-2,7-naphthyridine-3-carboxylic acid dihydrochloride Hydrogen chloride (4 M solution in 1,4-dioxane, 8.7 mL) was added to tert-butyl 7-(3-ethoxy-3-oxopropyl)-5,6,7,8-tetrahydro-2,7-naphthyridine-3-carboxylate (0.29 g) obtained in Step 5, and the mixture was stirred at 50° C. for 2 hours. The mixture was concentrated under reduced pressure, the residue was diluted with ethyl acetate, and the precipitate was collected by filtration and dried to afford the title compound (0.24 g).

Reference Example 31: 6-(3-Ethoxy-3-oxopropyl)-5,6,7,8-tetrahydro-1,6-naphthyridine-2-carboxylic acid hydrochloride

[Step 1] Preparation of tert-butyl 1,6-naphthyridine-2-carboxylate

THF (10 mL) was added to 1,6-naphthyridine-2-carboxylic acid (0.15 g) and DMAP (11 mg), di-tert-butyl dicarbonate (0.38 g) was added to the mixture with stirring at room temperature, and the mixture was stirred at room temperature overnight. The mixture was concentrated under reduced pressure, and the residue was purified by silica gel column chromatography to afford the title compound (0.19 g).

[Step 2] Preparation of 2-(tert-butoxycarbonyl)-6-(3-ethoxy-3-oxopropyl)-1,6-naphthyridine-6-ium bromide Ethyl 3-bromopropionate (0.79 mL) was added to a solution of tert-butyl 1,6-naphthyridine-2-carboxylate (100 mg), obtained in Step 1, in 1,4-dioxane (5 mL) with stirring at room temperature, and the mixture was stirred at 110° C. for 2 days. The mixture was concentrated under reduced pressure, and the residue was purified by silica gel column chromatography to afford the title compound (92 mg).

[Step 3] Preparation of 6-(3-ethoxy-3-oxopropyl)-5,6,7,8-tetrahydro-1,6-naphthyridine-2-carboxylic acid hydrochloride Acetic acid (0.062 mL) and sodium cyanoborohydride (41 mg) were added to a solution of 2-(tert-butoxycarbonyl)-6-(3-ethoxy-3-oxopropyl)-1,6-naphthyridine-6-ium bromide (90 mg), obtained in Step 2, in THF (3 mL) with stirring at room temperature, and the mixture was stirred at room temperature overnight. Saturated aq. sodium bicarbonate was added to the reaction mixture, and then the mixture was diluted with water and ethyl acetate and extracted with ethyl acetate. The organic layer was washed with water and saturated saline, dried over anhydrous sodium sulfate, and then concentrated under reduced pressure. The residue was purified by silica gel column chromatography, the obtained crude product was dissolved in hydrogen chloride (4 M solution in 1,4-dioxane, 2 mL), and the mixture was stirred at 70° C. for 1 hour. The reaction mixture was cooled to room temperature and then diluted with ethyl acetate, and the precipitate was collected by filtration and dried to afford the title compound (42 mg).

Reference Example 32: 7-(2-Ethoxy-2-oxoethyl)-5,6,7,8-tetrahydro-2,7-naphthyridine-3-carboxylic acid dihydrochloride

[Step 1] Preparation of tert-butyl 7-(2-ethoxy-2-oxoethyl)-5,6,7,8-tetrahydro-2,7-naphthyridine-3-carboxylate DIPEA (0.13 mL) and ethyl bromoacetate (0.029 mL) were added to a solution of tert-butyl 5,6,7,8-tetrahydro-2,7-naphthyridine-3-carboxylate hydrochloride (60 mg), obtained in Step 4, Reference Example 30, in acetonitrile (2 mL) with stirring at room temperature, and the mixture was stirred at room temperature for 4 hours. The reaction mixture was purified by silica gel column chromatography to afford the title compound (57 mg).

[Step 2] Preparation of 7-(2-ethoxy-2-oxoethyl)-5,6,7,8-tetrahydro-2,7-naphthyridine-3-carboxylic acid dihydrochloride Dichloromethane (2 mL) and trifluoroacetic acid (2 mL) were added to tert-butyl 7-(2-ethoxy-2-oxoethyl)-5,6,7,8-tetrahydro-2,7-naphthyridine-3-carboxylate (55 mg) obtained in Step 1, and the mixture was stirred at room temperature for 3 hours. The mixture was concentrated under reduced pressure, the residue was diluted with ethyl acetate, hydrogen chloride (4 M solution in 1,4-dioxane, 0.095 mL) was added to the dilution, and the mixture was stirred at room temperature for 1 hour. The precipitate was collected by filtration and dried to afford the title compound (47 mg).

Reference Example 33: 7-(Ethoxycarbonyl)-5,6,7,8-tetrahydroisoquinoline-3-carboxylic acid

[Step 1] Preparation of ethyl 4-bromo-3-formylcyclohexa-3-ene-1-carboxylate

Phosphorus tribromide (1.4 mL) was added to a solution of DMF (1.4 mL) in chloroform (15 mL) with stirring at room temperature, and the mixture was stirred at 70° C. for 1 hour. The mixture was cooled to room temperature, then a solution of ethyl 4-oxocyclohexane-1-carboxylate (1 g) in chloroform (5 mL) was added to the mixture, and the mixture was stirred at 70° C. for 5 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (0.82 g).

[Step 2] Preparation of 7-ethyl 3-methyl 5,6,7,8-tetrahydroisoquinoline-3,7-dicarboxylate A solution of ethyl 4-bromo-3-formylcyclohexa-3-ene-1-carboxylate (0.2 g), obtained in Step 1, in 1,4-dioxane (5 mL) was degassed, then Pd(OAc)$_2$ (17 mg), tri (o-tolyl) phosphine (47 mg), DIPEA (0.27 mL), and methyl 2-acetamidoacrylate (0.14 g) were added to the solution with stirring at room temperature under an argon atmosphere, and the mixture was stirred at 100° C. for 2 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (70 mg).

[Step 3] Preparation of 7-(ethoxycarbonyl)-5,6,7,8-tetrahydroisoquinoline-3-carboxylic acid Lithium iodide (30 mg) was added to a solution of 7-ethyl 3-methyl 5,6,7,8-tetrahydroisoquinoline-3,7-dicarboxylate (20 mg), obtained in Step 2, in acetonitrile (1 mL) with stirring at room temperature, and the mixture was stirred at 90° C. overnight. The reaction mixture was cooled to room temperature and then diluted with water and ethyl acetate, 1 M hydrochloric acid was added to the dilution, and the mixture was extracted with ethyl acetate. The organic layer was washed with water and saturated saline, dried over anhydrous sodium sulfate, and then concentrated under reduced pressure to afford the title compound (17 mg).

Reference Example 34: 6-(Methoxycarbonyl)-5,6,7,8-tetrahydroimidazo[1,2-a]pyridine-2-carboxylic acid

[Step 1] Preparation of 2-benzyl 6-methyl imidazo[1,2-a]pyridine-2,6-dicarboxylate 3-Bromopyruvic acid (0.724 g) was added to a solution of methyl 6-aminonicotinate (0.60 g) in 1,4-dioxane (10 mL) with stirring at room temperature, and the mixture was stirred at 110° C. for 5 hours. The mixture was cooled to room temperature and then concentrated under reduced pressure. DMF (10 mL) was added to the residue, potassium carbonate (1.6 g) and benzyl bromide (0.94 mL) were added to the mixture with stirring at room temperature, and the mixture was stirred at 60° C. for 2 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (0.58 g).

[Step 2] Preparation of 6-(methoxycarbonyl)-5,6,7,8-tetrahydroimidazo[1,2-a]pyridine-2-carboxylic acid 10% Pd—C (68 mg) was added to a solution of 2-benzyl 6-methyl imidazo[1,2-a]pyridine-2,6-dicarboxylate (0.20 g), obtained in Step 1, in methanol (10 mL) with stirring at room temperature under an argon atmosphere, and the mixture was stirred at 50° C. under a 0.4 MPa hydrogen atmosphere for 4 hours. The reaction mixture was diluted with methanol, and after filtering off the insolubles, was concentrated under reduced pressure to afford the title compound (0.14 g).

Reference Example 35: 5-(Methoxycarbonyl)-4,5,6,7-tetrahydropyrazolo[1,5-a]pyridine-2-carboxylic acid

[Step 1] Preparation of benzyl 5-bromopyrazolo[1,5-a]pyridine-2-carboxylate

Lithium hydroxide monohydrate (28 mg) was added to a solution of ethyl 5-bromopyrazolo[1,5-a]pyridine-2-carboxylate (60 mg) in THF (1 mL) and water (1 mL) with stirring at room temperature, and the mixture was stirred at room temperature for 2 hours. The reaction mixture was diluted with water and ethyl acetate, 1 M hydrochloric acid was added to the dilution, and the mixture was extracted with ethyl acetate. The organic layer was washed with water and saturated saline, dried over anhydrous sodium sulfate, and then concentrated under reduced pressure. DMF (2 mL) was added to the residue, potassium carbonate (93 mg) and benzyl bromide (0.053 mL) were added to the mixture with stirring at room temperature, and the mixture was stirred at 50° C. for 3 hours. The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (54 mg).

[Step 2] Preparation of 2-benzyl 5-ethyl pyrazolo[1,5-a]pyridine-2,5-dicarboxylate Pd(dppf)Cl$_2$·CH$_2$Cl$_2$ (12 mg) and DIPEA (0.052 mL) were added to a solution of benzyl 5-bromopyrazolo[1,5-a]pyridine-2-carboxylate (50 mg), obtained in Step 1, in ethanol (1 mL) and DMF (1 mL) with stirring at room temperature, and the mixture was degassed and then stirred at 80° C. under a carbon monoxide atmosphere for 4 hours.

The reaction mixture was cooled to room temperature, then diluted with water and ethyl acetate, and extracted with ethyl acetate. The organic layer was washed with water and saturated saline, dried over anhydrous sodium sulfate, and then concentrated under reduced pressure. The residue was purified by silica gel column chromatography to afford the title compound (32 mg).
[Step 3] Preparation of 5-(methoxycarbonyl)-4,5,6,7-tetrahydropyrazolo[1,5-a]pyridine-2-carboxylic acid 10% Pd—C (20 mg) was added to a solution of 2-benzyl 5-ethyl pyrazolo[1,5-a]pyridine-2,5-dicarboxylate (30 mg), obtained in Step 2, in ethanol (5 mL) with stirring at room temperature under an argon atmosphere, and the mixture was stirred at 50° C. under a 0.4 MPa hydrogen atmosphere for 5 hours. The reaction mixture was diluted with methanol, and after filtering off the insolubles, was concentrated under reduced pressure to afford the title compound (18 mg).

Reference Example 36: 5-(3-Ethoxy-2-fluoro-3-oxopropyl)pyridine-2-carboxylic acid hydrochloride

[Step 1] Preparation of tert-butyl 5-(3-ethoxy-2-fluoro-3-oxoprop-1-en-1-yl)pyridine-2-carboxylate DBU (0.12 mL) was added dropwise to a solution of tert-butyl 5-formylpyridine-2-carboxylate (83 mg), lithium chloride (34 mg), and triethyl 2-fluoro-2-phosphonoacetate (0.17 mL) in THF (4 mL) under ice-cooling, and the mixture was stirred at the same temperature for 1 hour and then stirred at room temperature overnight. The mixture was diluted with water and saturated aq. ammonium chloride under ice-cooling and extracted with ethyl acetate. The organic layer was washed sequentially with water and saturated saline and dried over anhydrous magnesium sulfate, and then the solvent was removed under reduced pressure. The residue was purified by silica gel column chromatography to afford the title compound (110 mg).
[Step 2] Preparation of tert-butyl 5-(3-ethoxy-2-fluoro-3-oxopropyl)pyridine-2-carboxylate A mixture of tert-butyl 5-(3-ethoxy-2-fluoro-3-oxoprop-1-en-1-yl)pyridine-2-carboxylate (60 mg) obtained in Step 1, 10% Pd—C (43 mg), THF (2 mL), and isopropanol (2 mL) was stirred at room temperature under a 0.38 MPa hydrogen atmosphere overnight. The insolubles were filtered off and washed with ethyl acetate, and then the resulting filtrate was concentrated under reduced pressure. The residue was purified by silica gel column chromatography to afford the title compound (43 mg).
[Step 3] Preparation of 5-(3-ethoxy-2-fluoro-3-oxopropyl)pyridine-2-carboxylic acid hydrochloride Hydrogen chloride (4 M solution in 1,4-dioxane, 0.80 mL) was added to a solution of tert-butyl 5-(3-ethoxy-2-fluoro-3-oxopropyl)pyridine-2-carboxylate (43 mg), obtained in Step 2, in 1,4-dioxane (0.40 mL) with stirring at room temperature, and the mixture was stirred at 50° C. overnight. The mixture was cooled to room temperature, and then the solvent was removed under reduced pressure to afford the title compound (50 mg).

Reference Example 37: 5-(4-Ethoxy-4-oxobutyl)pyridine-2-carboxylic acid

[Step 1] Preparation of benzyl 5-(4-ethoxy-4-oxobutyl)pyridine-2-carboxylate

A solution of benzyl 5-bromopyridine-2-carboxylate (0.70 g) in THF (4 mL) was degassed, SPhos (39 mg) and Pd(OAc)$_2$ (11 mg) were added to the solution at room temperature under an argon atmosphere and degassed, and the mixture was stirred at the same temperature under an argon atmosphere for 15 minutes. 4-Ethoxy-4-oxobutyl zinc bromide (0.5 M solution in THF, 5.8 mL) was added dropwise to the mixture under ice-cooling, and the mixture was stirred at room temperature for 2 hours. The mixture was diluted with saturated aq. ammonium chloride under ice-cooling and extracted with ethyl acetate. The organic layer was washed with saturated saline and dried over anhydrous magnesium sulfate. The solvent was removed under reduced pressure, and then the residue was purified by silica gel column chromatography to afford the title compound (0.41 g).
[Step 2] Preparation of 5-(4-ethoxy-4-oxobutyl)pyridine-2-carboxylic acid A mixture of benzyl 5-(4-ethoxy-4-oxobutyl)pyridine-2-carboxylate (0.41 g) obtained in Step 1, 10% Pd—C (0.40 g), and isopropanol (11 mL) was stirred at room temperature under a 0.27 MPa hydrogen atmosphere overnight. The insolubles were filtered off and washed with ethyl acetate, and then the resulting filtrate was concentrated under reduced pressure. Hexane-diethyl ether-ethyl acetate (3:3:1) (3 mL) was added to the residue to cause precipitation, the solvent was removed, and then the precipitate was dried to afford the title compound (0.27 g).

Reference Example 38: 5-{[(1-Methoxy-2-methyl-1-oxopropan-2-yl)amino]methyl}pyridine-2-carboxylic acid dihydrochloride

[Step 1] Preparation of tert-butyl 5-{[(1-methoxy-2-methyl-1-oxopropan-2-yl)amino]methyl}pyridine-2-carboxylate A mixture of tert-butyl 5-formylpyridine-2-carboxylate (0.10 g), methyl 2-amino-2-methylpropanoate hydrochloride (0.15 g), anhydrous magnesium sulfate (0.17 g), TEA (0.14 mL), and dichloromethane (4 mL) was stirred at room temperature for 3 hours. Sodium triacetoxyborohydride (0.26 g) was added to the mixture with stirring under ice-cooling, and the mixture was stirred at room temperature for 3 days. The mixture was diluted with saturated sodium bicarbonate aqueous solution under ice-cooling and extracted with ethyl acetate. The organic layer was washed with saturated saline and dried over anhydrous magnesium sulfate. The solvent was removed under reduced pressure, and then the residue was purified by silica gel column chromatography to afford the title compound (92 mg).
[Step 2] Preparation of 5-{[(1-methoxy-2-methyl-1-oxopropan-2-yl)amino]methyl}pyridine-2-carboxylic acid dihydrochloride Hydrogen chloride (4 M solution in 1,4-dioxane, 1.5 mL) was added to a solution of tert-butyl 5-{[(1-methoxy-2-methyl-1-oxopropan-2-yl)amino]methyl}pyridine-2-carboxylate (92 mg), obtained in Step 1, in 1,4-dioxane (0.5 mL) with stirring at room temperature, and the mixture was stirred at 50° C. for 8 hours. The mixture was cooled to room temperature, and hexane (3 mL) was added to the mixture. Then, the precipitate was collected by filtration, washed with hexane, and then dried to afford the title compound (88 mg).

Reference Example 39: Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoate DIPEA (0.022 mL) and HATU (31 mg) were added to a mixture of 5-[6-cyclopropyl-5-(trifluoromethyl)pyridin-3-yl]-N$^7$-{[1-(methoxymethyl)cyclopentyl]methyl}-N$^7$- methyl-1H-imidazo[4,5-b]pyridine-2,7-diamine (30 mg), 5-(3-ethoxy-3-oxopropyl)pyridine-2-carboxylic acid (17 mg), and DMA (0.3 mL) with stirring at room temperature, and the mixture was stirred at 50° C. for 7 hours. The reaction mixture was cooled to room temperature, then diluted with saturated sodium bicarbonate aqueous solution, and extracted with ethyl acetate. The organic layer was dried over anhydrous sodium sulfate, then the solvent was removed under reduced pressure, and the residue was purified by silica gel column chromatography to afford the title compound (42 mg).

Reference Example 40: Ethyl 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoate DIPEA (0.033 mL) and HATU (31 mg) were added to a mixture of 5-[2-ethoxy-6-(trifluoromethyl)pyridin-4-yl]-$N^7$-{[1-(methoxymethyl)cyclopentyl]methyl}-$N^7$-methyl-1H-imidazo[4,5-b]pyridine-2,7-diamine (30 mg), 5-(3-ethoxy-3-oxopropyl)pyridine-2-carboxylic acid trifluoroacetate (25 mg), and DMA (0.5 mL) with stirring at room temperature, and the mixture was stirred at 50° C. for 7 hours. The reaction mixture was cooled to room temperature, then diluted with saturated sodium bicarbonate aqueous solution, and extracted with ethyl acetate. The organic layer was dried over anhydrous sodium sulfate, then the solvent was removed under reduced pressure, and the residue was purified by silica gel column chromatography to afford the title compound (34 mg).

Reference Example 41: Ethyl 3-[6-({5-[2-cyclopropyl-6-(trifluoromethyl)pyridin-4-yl]-7-{[1-(methoxymethyl)cyclopentyl]methyl}(methyl)amino)-1H-imidazo[4,5-b]pyridin-2-yl}carbamoyl)pyridin-3-yl]propanoate DIPEA (0.033 mL) and HATU (31 mg) were added to a mixture of 5-[2-cyclopropyl-6-(trifluoromethyl)pyridin-4-yl]-$N^7$-{[1-(methoxymethyl)cyclopentyl]methyl}-$N^7$-methyl-1H-imidazo[4,5-b]pyridine-2,7-diamine (30 mg), 5-(3-ethoxy-3-oxopropyl)pyridine-2-carboxylic acid trifluoroacetate (26 mg), and DMA (0.5 mL) with stirring at room temperature, and the mixture was stirred at 50° C. for 7 hours. The reaction mixture was cooled to room temperature, then diluted with saturated sodium bicarbonate aqueous solution, and extracted with ethyl acetate. The organic layer was dried over anhydrous sodium sulfate, then the solvent was removed under reduced pressure, and the residue was purified by silica gel column chromatography to afford the title compound (34 mg).

Reference Example 42: Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-methylpropanoate The title compound (35 mg) was obtained according to the method as described in Reference Example 39, using 5-(3-ethoxy-2-methyl-3-oxopropyl)pyridine-2-carboxylic acid (18 mg) instead of 5-(3-ethoxy-3-oxopropyl)pyridine-2-carboxylic acid.

Reference Example 43: Methyl 2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-6-carboxylate COMU (41 mg) and DIPEA (0.022 mL) were added to a mixture of 5-[6-cyclopropyl-5-(trifluoromethyl)pyridin-3-yl]-$N^7$-{[1-(methoxymethyl)cyclopentyl]methyl}-$N^7$-methyl-1H-imidazo[4,5-b]pyridine-2,7-diamine (30 mg), 6-(methoxycarbonyl)-5,6,7,8-tetrahydroimidazo[1,2-a]pyridine-2-carboxylic acid (17 mg), and NMP (0.5 mL) with stirring at room temperature, and the mixture was stirred at 70° C. overnight. The reaction mixture was cooled to room temperature and then purified by silica gel column chromatography to afford the title compound (23 mg).

Reference Example 44: Ethyl 2-({[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}(methyl)amino)acetate DIPEA (0.049 mL) and HATU (31 mg) were added to a mixture of 5-[6-cyclopropyl-5-(trifluoromethyl)pyridin-3-yl]-$N^7$-{[1-(methoxymethyl)cyclopentyl]methyl}-$N^7$-methyl-1H-imidazo[4,5-b]pyridine-2,7-diamine (30 mg), 5-{[(2-ethoxy-2-oxoethyl)(methyl)amino]methyl}pyridine-2-carboxylic acid dihydrochloride (25 mg), and DMA (0.3 mL) with stirring at room temperature, and the mixture was stirred at 50° C. for 7 hours. The reaction mixture was cooled to room temperature, then diluted with saturated sodium bicarbonate aqueous solution, and extracted with ethyl acetate. The organic layer was dried over anhydrous sodium sulfate, then the solvent was removed under reduced pressure, and the residue was purified by silica gel column chromatography to afford the title compound (33 mg).

Reference Example 45: Ethyl 4-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]butanoate DIPEA (0.022 mL) and COMU (35 mg) were added to a mixture of 5-[6-cyclopropyl-5-(trifluoromethyl)pyridin-3-yl]-$N^7$-{[1-(methoxymethyl)cyclopentyl]methyl}-$N^7$-methyl-1H-imidazo[4,5-b]pyridine-2,7-diamine (30 mg), 1-(4-ethoxy-4-oxobutyl)-1H-imidazole-4-carboxylic acid (17 mg), and DMA (0.3 mL) with stirring at room temperature, and the mixture was stirred at 50° C. overnight. 1-(4-ethoxy-4-oxobutyl)-1H-imidazole-4-carboxylic acid (17 mg), DIPEA (0.022 mL), and COMU (35 mg) were added to the mixture, and the mixture was stirred at 50° C. for 7 hours. The reaction mixture was cooled to room temperature, then diluted with saturated sodium bicarbonate aqueous solution, and extracted with ethyl acetate. The organic layer was dried over anhydrous sodium sulfate, then the solvent was removed under reduced pressure, and the residue was purified by silica gel column chromatography to afford the title compound (23 mg).

Reference Example 46: Ethyl 4-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoate DIPEA (0.12 mL) and HATU (90 mg) were added to a mixture of 5-[6-cyclopropyl-5-(trifluoromethyl)pyridin-3- yl]-N⁷-{[1-(methoxymethyl)cyclopentyl]methyl}-N⁷-methyl-1H-imidazo[4,5-b]pyridine-2,7-diamine (80 mg), 5-(4-ethoxy-4-oxobutyl)pyridine-2-carboxylic acid (56 mg), and DMA (2.1 mL) with stirring at room temperature, and the mixture was stirred at 55° C. overnight. The reaction mixture was cooled to room temperature, then diluted with saturated sodium bicarbonate aqueous solution, and extracted with ethyl acetate. The organic layer was washed sequentially with saturated sodium bicarbonate aqueous solution, water, and saturated saline and dried over anhydrous magnesium sulfate. The solvent was removed under reduced pressure, and the residue was purified by silica gel column chromatography to afford the title compound (65 mg).

Reference Example 47: Ethyl 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoate HATU (29 mg) and DIPEA (0.049 mL) were added to a mixture of 5-[2-ethoxy-6-(trifluoromethyl)pyridin-4-yl]-N⁷-{[1-(methoxymethyl)cyclopentyl]methyl}-N⁷-methyl-1H-imidazo[4,5-b]pyridine-2,7-diamine (30 mg), 7-(3-ethoxy-3-oxopropyl)-5,6,7,8-tetrahydro-2,7-naphthyridine-3-carboxylic acid dihydrochloride (26 mg), and DMA (0.4 mL) with stirring at room temperature, and the mixture was stirred at 55° C. overnight. The reaction mixture was cooled to room temperature and then purified by silica gel column chromatography to afford the title compound (23 mg).

Reference Example 48: Ethyl 3-[6-({5-[2-cyclopropyl-6-(trifluoromethyl)pyridin-4-yl]-7-{[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoate The title compound (22 mg) was obtained according to the method as described in Reference Example 47, using 5-[2-cyclopropyl-6-(trifluoromethyl)pyridin-4-yl]-N⁷-{[1-(methoxymethyl)cyclopentyl]methyl}-N⁷-methyl-1H-imidazo[4,5-b]pyridine-2,7-diamine (30 mg) instead of 5-[2-ethoxy-6-(trifluoromethyl)pyridin-4-yl]-N⁷-{[1-(methoxymethyl)cyclopentyl]methyl}-N⁷-methyl-1H-imidazo[4,5-b]pyridine-2,7-diamine.

Reference Example 49: Ethyl 4-[6-({5-[6-cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoate DIPEA (0.027 mL) and HATU (37 mg) were added to a mixture of 5-[6-cyclopropyl-5-(trifluoromethyl)pyridin-3-yl]-N⁷-{[1-(methoxymethyl)cyclohexyl]methyl}-N⁷-methyl-1H-imidazo[4,5-b]pyridine-2,7-diamine (30 mg), 5-(4-ethoxy-4-oxobutyl)pyridine-2-carboxylic acid (22 mg), and DMA (0.3 mL) with stirring at room temperature, and the mixture was stirred at 55° C. for 6 hours. The reaction mixture was cooled to room temperature, then diluted with saturated sodium bicarbonate aqueous solution, and extracted with ethyl acetate. The organic layer was dried over anhydrous sodium sulfate, and the solvent was removed under reduced pressure. The residue was purified by silica gel column chromatography to afford the title compound (36 mg).

Reference Example 50: Ethyl 4-[6-({5-[6-ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoate DIPEA (0.027 mL) and HATU (38 mg) were added to a mixture of 5-[6-ethoxy-5-(trifluoromethyl)pyridin-3-yl]-N⁷-{[1-(methoxymethyl)cyclopentyl]methyl}-N⁷-methyl-1H-imidazo[4,5-b]pyridine-2,7-diamine (30 mg), 5-(4-ethoxy-4-oxobutyl)pyridine-2-carboxylic acid (22 mg), and DMA (0.3 mL) with stirring at room temperature, and the mixture was stirred at 55° C. for 6 hours. The reaction mixture was cooled to room temperature, then diluted with saturated sodium bicarbonate aqueous solution, and extracted with ethyl acetate. The organic layer was dried over anhydrous sodium sulfate, and the solvent was removed under reduced pressure. The residue was purified by silica gel column chromatography to afford the title compound (33 mg).

Reference Example 51: Ethyl 3-[6-({5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]propanoate DIPEA (0.021 mL) and HATU (30 mg) were added to a mixture of 5-[6-ethoxy-5-(trifluoromethyl)pyridin-3-yl]-N⁷-{[1-(methoxymethyl)cyclohexyl]methyl}-N⁷-methyl-1H-imidazo[4,5-b]pyridine-2,7-diamine (30 mg), 5-(3-ethoxy-3-oxopropyl)pyridine-2-carboxylic acid (16 mg), and DMA (0.3 mL) with stirring at room temperature, and the mixture was stirred at 50° C. for 7 hours. The reaction mixture was cooled to room temperature, then diluted with saturated sodium bicarbonate aqueous solution, and extracted with ethyl acetate. The organic layer was dried over anhydrous sodium sulfate, then the solvent was removed under reduced pressure, and the residue was purified by silica gel column chromatography to afford the title compound (38 mg).

Reference Example 52: Ethyl 4-[6-({5-[6-ethoxy-5-(trifluoromethyl)pyridin-3-yl]-7-{[1-(methoxymethyl)cyclohexyl]methyl}(methyl)amino)-1H-imidazo[4,5-b]pyridin-2-yl}carbamoyl)pyridin-3-yl]butanoate DIPEA (0.026 mL) and HATU (37 mg) were added to a mixture of 5-[6-ethoxy-5-(trifluoromethyl)pyridin-3-yl]-N⁷-{[1-(methoxymethyl)cyclohexyl]methyl}-N⁷-methyl-1H-imidazo[4,5-b]pyridine-2,7-diamine (30 mg), 5-(4-ethoxy-4-oxobutyl)pyridine-2-carboxylic acid (22 mg), and DMA (0.3 mL) with stirring at room temperature, and the mixture was stirred at 55° C. for 6 hours. The reaction mixture was cooled to room temperature, then diluted with saturated sodium bicarbonate aqueous solution, and extracted with ethyl acetate. The organic layer was dried over anhydrous sodium sulfate, and the solvent was removed under reduced pressure. The residue was purified by silica gel column chromatography to afford the title compound (35 mg).

Reference Example 53: Ethyl N-[6-({5-[6-cyclopropyl-5-(trifluoromethyl)pyridin-3-yl]-7-[{(1-(methoxymethyl)cyclopentyl]methyl}(methyl)amino)-1H-imidazo[4,5-b]pyridin-2-yl}carbamoyl)pyridine-3-carbonyl]-N-methylglycinate HATU (15 mg) was added to a mixture of 6-({5-[6-cyclopropyl-5-(trifluoromethyl)pyridin-3-yl]-7-({[1-

(methoxymethyl)cyclopentyl]methyl}(methyl)amino)-1H-imidazo[4,5-b]pyridin-2-yl}carbamoyl)pyridine-3-carboxylic acid (20 mg), DIPEA (0.019 mL), and DMF (0.3 mL), and the mixture was stirred at room temperature for 10 minutes. Ethyl methylglycinate hydrochloride (5.9 mg) was added to the mixture, and the mixture was stirred at the same temperature for 2 hours. DIPEA (0.011 mL) and HATU (15 mg) were added to the mixture, and the mixture was stirred at room temperature overnight. Saturated sodium bicarbonate aqueous solution, water, and ethyl acetate were added to the reaction mixture, and the mixture was extracted with ethyl acetate. The organic layer was washed with water and saturated saline, dried over anhydrous sodium sulfate, and then concentrated under reduced pressure. The residue was purified by silica gel column chromatography to afford the title compound (9.4 mg).

Reference Example 129: Ethyl 2-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl] acetate DIPEA (0.022 mL), HATU (31 mg), and DMAP (0.77 mg) were added to a mixture of 5-[6-cyclopropyl-5-(trifluoromethyl)pyridin-3-yl]-$N^7$-{[1-(methoxymethyl)cyclopentyl]methyl}-$N^7$-methyl-1H-imidazo[4,5-b]pyridine-2,7-diamine (30 mg), 1-(2-ethoxy-2-oxoethyl)-1H-imidazole-4-carboxylic acid (15 mg), and DMA (0.5 mL) with stirring at room temperature, and the mixture was stirred at the same temperature overnight and then stirred at 50° C. overnight. 1-(2-Ethoxy-2-oxoethyl)-1H-imidazole-4-carboxylic acid (6.3 mg), DIPEA (0.011 mL), and HATU (14 mg) were added to the mixture, and the mixture was stirred at 50° C. for 7 hours. The reaction mixture was cooled to room temperature, then diluted with saturated sodium bicarbonate aqueous solution, and extracted with ethyl acetate. The extract was dried over anhydrous sodium sulfate, then the solvent was removed under reduced pressure, and the residue was purified by silica gel column chromatography to afford the title compound (14 mg).

Example 1: 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoic acid 1 M aq. sodium hydroxide (0.16 mL) was added dropwise to a solution of ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoate (21 mg) in ethanol (0.5 mL) with stirring at room temperature, and the mixture was stirred at the same temperature for 2 hours. The reaction mixture was concentrated under reduced pressure and then neutralized with 6 M hydrochloric acid. Water was added to the mixture, and the resulting precipitate was collected by filtration and dried to afford the title compound (17 mg).

Example 2: 3-[6-({5-[2-Ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoic acid 1M aq. sodium hydroxide (0.25 mL) was added dropwise to a solution of ethyl 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoate (34 mg) in ethanol (0.5 mL) with stirring at room temperature, and the mixture was stirred at the same temperature for 2 hours. The reaction mixture was neutralized with 6 M hydrochloric acid and concentrated under reduced pressure. Water was added to the residue, and the resulting precipitate was collected by filtration and dried to afford the title compound (29 mg).

Example 3: 3-[6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoic acid 1 M aq. sodium hydroxide (0.25 mL) was added dropwise to a solution of ethyl 3-[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoate (34 mg) in ethanol (0.5 mL) with stirring at room temperature, and the mixture was stirred at the same temperature for 2 hours. The reaction mixture was concentrated under reduced pressure and then neutralized with 6 M hydrochloric acid. Water was added to the mixture, and the resulting precipitate was collected by filtration and dried to afford the title compound (27 mg).

Example 4: 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-methylpropanoic acid 1 M aq. sodium hydroxide (0.25 mL) was added dropwise to a solution of ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-methylpropanoate (35 mg) in ethanol (0.5 mL) with stirring at room temperature, and the mixture was stirred at the same temperature for 2.5 hours. 1 M aq. sodium hydroxide (0.25 mL) was added to the mixture, and the mixture was stirred at room temperature for 30 minutes. The reaction mixture was neutralized with 6 M hydrochloric acid and concentrated under reduced pressure. Water was added to the residue, and the resulting precipitate was collected by filtration and dried to afford the title compound (27 mg).

Example 5: 2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-6-carboxylic acid 4 M aq. sodium hydroxide (0.042 mL) was added to a mixture of methyl 2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-6-carboxylate (23 mg), THF (0.5 mL), and water (0.5 mL) with stirring at room temperature, and the mixture was stirred at the same temperature for 2 hours. The reaction mixture was diluted with water and neutralized with 6 M hydrochloric acid. The resulting precipitate was collected by filtration and dried to afford the title compound (18 mg).

Example 6: 2-({[6-({5-[6-Cyclopropyl-5-(trifluoromethyl)pyridin-3-yl]-7-{[1-(methoxymethyl)cyclopentyl]methyl}(methyl)amino)-1H-imidazo[4,5-b]pyridin-2-yl}carbamoyl)pyridin-3-yl]methyl}(methyl)amino)acetic acid 1 M aq. sodium hydroxide (0.23 mL) was added to a mixture of ethyl 2-({[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}(methyl)amino)acetate (33 mg), THF (0.1 mL), and ethanol (0.5 mL) with stirring at room temperature, and the mixture was stirred at the same temperature for 1.5 hours. The reaction mixture was neutralized with 6 M hydrochloric acid, and the solvent was removed under reduced pressure. Water was added to the residue, and the resulting precipitate was collected by filtration and dried to afford the title compound (21 mg).

Example 7: 4-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]butanoic acid 1 M aq. sodium hydroxide (0.17 mL) was added to a mixture of ethyl 4-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]butanoate (23 mg), THF (0.2 mL), and ethanol (0.5 mL) with stirring at room temperature, and the mixture was stirred at the same temperature for 2 hours. The reaction mixture was neutralized with 6 M hydrochloric acid and concentrated under reduced pressure. Water and 1 M hydrochloric acid were added to the residue, and the resulting precipitate was collected by filtration and dried to afford the title compound (17 mg).

Example 8: 4-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoic acid 1 M aq. sodium hydroxide (0.22 mL) was added to a mixture of ethyl 4-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoate (30 mg), THF (0.1 mL), and ethanol (0.5 mL) with stirring at room temperature, and the mixture was stirred at the same temperature for 1.5 hours. The reaction mixture was neutralized with 6 M hydrochloric acid and concentrated under reduced pressure. Water and 1 M hydrochloric acid were added to the residue, and the resulting precipitate was collected by filtration and dried to afford the title compound (24 mg).

Example 9: 3-[6-({5-[2-Ethoxy-6-(trifluoromethyl)pyridin-4-yl]-7-{[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid 4 M aq. sodium hydroxide (0.037 mL) was added to a mixture of ethyl 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoate (22 mg), THF (0.5 mL), and water (0.5 mL) with stirring at room temperature, and the mixture was stirred at the same temperature for 2 hours. The reaction mixture was diluted with water and neutralized with 6 M hydrochloric acid. The resulting precipitate was collected by filtration and dried to afford the title compound (18 mg).

Example 10: 3-[6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid 4 M aq. sodium hydroxide (0.037 mL) was added to a mixture of ethyl 3-[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoate (22 mg), THF (0.5 mL), and water (0.5 mL) with stirring at room temperature, and the mixture was stirred at the same temperature for 2 hours. The reaction mixture was diluted with water and neutralized with 6 M hydrochloric acid. The resulting precipitate was collected by filtration and dried to afford the title compound (18 mg).

Example 11: 4-[6-({5-[6-Cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoic acid 1 M aq. sodium hydroxide (0.26 mL) was added dropwise to a mixture of ethyl 4-[6-({5-[6-cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoate (36 mg), THF (0.1 mL), and ethanol (0.5 mL) with stirring at room temperature, and the mixture was stirred at the same temperature for 1.5 hours. The reaction mixture was neutralized with 6 M hydrochloric acid and concentrated under reduced pressure. Water and 1 M hydrochloric acid were added to the residue, and the resulting precipitate was collected by filtration and dried to afford the title compound (30 mg).

Example 12: 4-[6-({5-[6-Ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoic acid 1 M aq. sodium hydroxide (0.23 mL) was added dropwise to a mixture of ethyl 4-[6-({5-[6-ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoate (33 mg), THF (0.1 mL), and ethanol (0.5 mL) with stirring at room temperature, and the mixture was stirred at the same temperature for 1.5 hours. The reaction mixture was neutralized with 6 M hydrochloric acid and concentrated under reduced pressure. Water and 1 M hydrochloric acid were added to the residue, and the resulting precipitate was collected by filtration and dried to afford the title compound (26 mg).

Example 13: 3-[6-({5-[6-Ethoxy-5-(trifluoromethyl)pyridin-3-yl]-7-{[1-(methoxymethyl)cyclohexyl]methyl}(methyl)amino)-1H-imidazo[4,5-b]pyridin-2-yl}carbamoyl)pyridin-3-yl]propanoic acid 1 M aq. sodium hydroxide (0.27 mL) was added dropwise to a mixture of ethyl 3-[6-({5-[6-ethoxy-5-(trifluoromethyl)

pyridin-3-yl]-7-({[1-(methoxymethyl)cyclohexyl]methyl} (methyl)amino)-1H-imidazo[4,5-b]pyridin-2-yl}carbamoyl) pyridin-3-yl]propanoate (38 mg), THF (0.2 mL), and ethanol (0.5 mL) with stirring at room temperature, and the mixture was stirred at the same temperature for 2 hours. The reaction mixture was neutralized with 6 M hydrochloric acid and concentrated under reduced pressure. Water and 1 M hydrochloric acid were added to the residue, and the resulting precipitate was collected by filtration and dried to afford the title compound (34 mg).

Example 14: 4-[6-({5-[6-Ethoxy-5-(trifluoromethyl) pyridin-3-yl]-7-({[1-(methoxymethyl)cyclohexyl] methyl}(methyl)amino)-1H-imidazo[4,5-b]pyridin-2-yl}carbamoyl)pyridin-3-yl]butanoic acid 1 M aq. sodium hydroxide (0.25 mL) was added dropwise to a mixture of ethyl 4-[6-({5-[6-ethoxy-5-(trifluoromethyl) pyridin-3-yl]-7-({[1-(methoxymethyl)cyclohexyl]methyl} (methyl)amino)-1H-imidazo[4,5-b]pyridin-2-yl}carbamoyl) pyridin-3-yl]butanoate (35 mg), THF (0.1 mL), and ethanol (0.5 mL) with stirring at room temperature, and the mixture was stirred at the same temperature for 1.5 hours. The reaction mixture was neutralized with 6 M hydrochloric acid and concentrated under reduced pressure. Water and 1 M hydrochloric acid were added to the residue, and the resulting precipitate was collected by filtration and dried to afford the title compound (30 mg).

Example 27: 3-[6-({5-[6-Ethoxy-5-(trifluoromethyl) pyridin-3-yl]-7-({[1-(ethoxymethyl)cyclopentyl] methyl}(methyl)amino)-1H-imidazo[4,5-b]pyridin-2-yl}carbamoyl)pyridin-3-yl]propanoic acid Lithium hydroxide monohydrate (12 mg) was added to a mixture of ethyl 3-[6-({5-[6-ethoxy-5-(trifluoromethyl)pyridin-3-yl]-7-({[1-(ethoxymethyl)cyclopentyl]methyl} (methyl)amino)-1H-imidazo[4,5-b]pyridin-2-yl}carbamoyl) pyridin-3-yl]propanoate (36 mg), THF (0.52 mL), methanol (0.52 mL), and water (0.52 mL) with stirring at room temperature, and the mixture was stirred at the same temperature for 2 hours. The reaction mixture was concentrated under reduced pressure, and the residue was diluted with water and then neutralized with 2 M hydrochloric acid. The resulting precipitate was collected by filtration and dried to afford the title compound (27 mg).

Example 40: 1-[6-({5-[6-Ethoxy-5-(trifluoromethyl) pyridin-3-yl]-7-({[1-(ethoxymethyl)cyclopentyl] methyl}(methyl)amino)-1H-imidazo[4,5-b]pyridin-2-yl}carbamoyl)pyridazin-3-yl]azetidine-3-carboxylic acid

[Step 1] Preparation of 6-chloro-N-{5-[6-ethoxy-5-(trifluoromethyl)pyridin-3-yl]-7-({[1-(ethoxymethyl)cyclopentyl] methyl}(methyl)amino)-1H-imidazo[4,5-b]pyridin-2-yl}pyridazine-3-carboxamide EEDQ (26 mg) was added to a solution of 5-[6-ethoxy-5-(trifluoromethyl)pyridin-3-yl]-$N^7$-{[1-(ethoxymethyl)cyclopentyl]methyl}-$N^7$-methyl-1H-imidazo[4,5-b]pyridine-2,7-diamine (51 mg) and 6-chloropyridazine-3-carboxylic acid (16 mg) in DMF (1 mL) with stirring at room temperature, and the mixture was stirred at the same temperature for 26 hours. 6-Chloropyridazine-3-carboxylic acid (4.9 mg) and EEDQ (7.6 mg) were added to the mixture under ice-cooling, and the mixture was stirred at room temperature overnight. The reaction mixture was diluted with water and extracted with ethyl acetate. The organic layer was washed sequentially with water, saturated sodium bicarbonate aqueous solution, water, dilute hydrochloric acid, and saturated saline and then dried over anhydrous magnesium sulfate. The solvent was removed under reduced pressure, and then the residue was purified by silica gel column chromatography to afford the title compound (34 mg).

[Step 2] Preparation of ethyl 1-[6-({5-[6-ethoxy-5-(trifluoromethyl)pyridin-3-yl]-7-({[1-(ethoxymethyl)cyclopentyl] methyl}(methyl)amino)-1H-imidazo[4,5-b]pyridin-2-yl}carbamoyl)pyridazin-3-yl]azetidine-3-carboxylate A mixture of 6-chloro-N-{5-[6-ethoxy-5-(trifluoromethyl)pyridin-3-yl]-7-({[1-(ethoxymethyl)cyclopentyl] methyl}(methyl)amino)-1H-imidazo[4,5-b]pyridin-2-yl}pyridazine-3-carboxamide (15 mg) obtained in Step 1, ethyl azetidine-3-carboxylate hydrochloride (7.9 mg), DIPEA (0.021 mL), and NMP (0.5 mL) was stirred at 70° C. for 2 hours. The reaction mixture was cooled to room temperature and then purified by silica gel column chromatography to afford the title compound (11 mg).

[Step 3] Preparation of 1-[6-({5-[6-ethoxy-5-(trifluoromethyl)pyridin-3-yl]-7-({[1-(ethoxymethyl)cyclopentyl] methyl}(methyl)amino)-1H-imidazo[4,5-b]pyridin-2-yl}carbamoyl)pyridazin-3-yl]azetidine-3-carboxylic acid 2 M aq. sodium hydroxide (0.047 mL) was added dropwise to a mixture of ethyl 1-[6-({5-[6-ethoxy-5-(trifluoromethyl)pyridin-3-yl]-7-({[1-(ethoxymethyl)cyclopentyl] methyl}(methyl)amino)-1H-imidazo[4,5-b]pyridin-2-yl}carbamoyl)pyridazin-3-yl]azetidine-3-carboxylate (11 mg) obtained in Step 2, THF (0.5 mL), and ethanol (0.5 mL) with stirring at room temperature, and the mixture was stirred at the same temperature overnight. The reaction mixture was concentrated under reduced pressure, and then the residue was diluted with water and neutralized with 2 M hydrochloric acid. The resulting precipitate was collected by filtration and dried to afford the title compound (7.5 mg).

Example 93: N-{5-[6-Cyclopropyl-5-(trifluoromethyl)pyridin-3-yl]-7-{[1-(methoxymethyl)cyclopentyl]methyl}(methyl)amino)-1H-imidazo[4,5-b]pyridin-2-yl}-5-[2-(methanesulfonylcarbamoyl)ethyl] pyridine-2-carboxamide DMAP (20 mg) and EDCI (15 mg) were added to a solution of 3-[6-({5-[6-cyclopropyl-5-(trifluoromethyl)pyridin-3-yl]-7-({[1-(methoxymethyl)cyclopentyl]methyl} (methyl)amino)-1H-imidazo[4,5-b]pyridin-2-yl}carbamoyl) pyridin-3-yl]propanoic acid (40 mg) in dichloromethane (0.5 mL) under ice-cooling, methanesulfonamide (7.0 mg) was subsequently added to the mixture, and the mixture was stirred at room temperature overnight. DMAP (7.5 mg) and EDCI (5.9 mg) were added to the mixture under ice-cooling, and the mixture was stirred at room temperature overnight. The reaction mixture was diluted with 1 M hydrochloric acid and extracted with ethyl acetate, and then the organic layer was dried over anhydrous sodium sulfate. The solvent was removed under reduced pressure, and then the residue was purified by reverse phase silica gel column chromatography. The solvent was removed under reduced pressure, a hexanediethyl ether mixed solvent was added to the residue, and the resulting precipitate was collected by filtration and dried to afford the title compound (30 mg).

Example 111: N-{5-[6-Cyclopropyl-5-(trifluoromethyl)pyridin-3-yl]-7-{[1-(methoxymethyl)cyclopentyl]methyl}(methyl)amino)-1H-imidazo[4,5-b]pyridin-2-yl}-5-[2-(methoxycarbamoyl)ethyl]pyridine-2-carboxamide DIPEA (0.016 mL) and HATU (15 mg) were added to a solution of 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoic acid (20 mg) in DMF (0.5 mL) at room temperature, and the mixture was stirred at the same temperature for 10 minutes. O-methyl hydroxylamine hydrochloride (3.3 mg) was added to the mixture, and the mixture was stirred at room temperature overnight. The reaction mixture was diluted with saturated sodium bicarbonate aqueous solution and extracted with ethyl acetate. The organic layer was dried over anhydrous sodium sulfate, and the solvent was removed under reduced pressure. The residue was purified by silica gel column chromatography, and the solvent was removed under reduced pressure. Then, the residue was diluted with a hexane-chloroform mixed solvent and subjected to slurry stirring, and then the precipitate was collected by filtration and dried to afford the title compound (15 mg).

Example 116: 5-{2-[(Cyclopropanesulfonyl)carbamoyl] ethyl}-N-{5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}pyridine-2-carboxamide CDI (10 mg) was added to a solution of 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoic acid (20 mg) in THF (0.61 mL) at room temperature, and the mixture was stirred at the same temperature overnight. Cyclopropane sulfonamide (5.6 mg) and DBU (0.014 mL) were added to the mixture, and the mixture was stirred at room temperature for 6 hours. The reaction mixture was diluted with 1 M hydrochloric acid and extracted with ethyl acetate. The organic layer was washed sequentially with water and saturated saline and then dried over anhydrous sodium sulfate. The solvent was removed under reduced pressure, then the residue was purified by silica gel column chromatography, and the solvent was removed under reduced pressure. The residue was diluted with a hexane-chloroform mixed solvent and subjected to slurry stirring, and then the precipitate was collected by filtration and dried to afford the title compound (19 mg).

Example 122: 1-({[6-({5-[6-Ethoxy-5-(trifluoromethyl)pyridin-3-yl]-7-{[1-(methoxymethyl)cyclohexyl]methyl}(methyl)amino)-1H-imidazo[4,5-b]pyridin-2-yl}carbamoyl)pyridin-3-yl]methyl}amino)cyclobutane-1-carboxylic acid DIPEA (0.047 mL) and HATU (32 mg) were added to a mixture of 5-[6-ethoxy-5-(trifluoromethyl)pyridin-3-yl]-$N^7$-{[1-(methoxymethyl)cyclohexyl]methyl}-$N^7$-methyl-1H-imidazo[4,5-b]pyridine-2,7-diamine (30 mg), 5-({[1-(methoxycarbonyl)cyclobutyl]amino}methyl)pyridine-2-carboxylic acid dihydrochloride (27 mg), and DMA (0.61 mL) at room temperature, and the mixture was stirred at 55° C. for 11 hours. The reaction mixture was cooled to room temperature, then diluted with water and saturated sodium bicarbonate aqueous solution, and extracted with ethyl acetate. The organic layer was concentrated under reduced pressure, and then the residue was purified by silica gel column chromatography to afford methyl 1-({[6-({5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]methyl}amino)cyclobutane-1-carboxylate (41 mg). This compound was diluted with ethanol (1.1 mL) and THF (0.18 mL), 2 M aq. sodium hydroxide (0.14 mL) was added to the dilution under ice-cooling, and the mixture was stirred at room temperature for 3 hours. The reaction mixture was neutralized with 2 M hydrochloric acid and then diluted with water, and the resulting precipitate was collected by filtration and dried to afford the title compound (29 mg).

Compounds of Reference Examples and Examples are further provided below in Tables 1 to 65.

In the tables, PREx means the Reference Example No. where the compound at issue was prepared according to the method as described in said Reference Example using a corresponding starting material. For example, the compound of a Reference Example with the indication of PREx No. as 1 was prepared using the method as described in Reference Example 1.

In the tables, PEx means the Example No. where the compound at issue was prepared according to the method as described in said Example using a corresponding starting material. For example, the compound of an Example with the indication of PEx No. as 1 was prepared using the method as described in Example 1.

In the tables, Compound Name refers to the name of the compound corresponding to the number of the Reference Example (REx) or the Example (Ex) at issue.

In the tables, Data means the instrumental analytical data of the compound at issue, such as mass spectrometric data (m/z values), $^1$H NMR data (δ (ppm) of peaks), and elemental analytical data (composition (%) of C, H, and N).

TABLE 1

| REx | PREx | Compound Name | Data |
| --- | --- | --- | --- |
| 1 | 1 | 1-[1-(Ethoxymethyl)cyclopentyl]-N-methylmethaneamine hydrochloride | $^1$H-NMR (400 MHz, CDCl$_3$) δ: 3.58 (dd, 2H), 3.44 (s, 2H), 3.02 (t, 2H), 2.74(t, 3H), 1.76-1.58 (m, 8H), 1.21 (t, 3H) |
| 2 | 2 | 1-[1-(Methoxymethyl)cyclopentyl]-N-methylmethaneamine hydrochloride | $^1$H-NMR (400 MHz, CDCl$_3$) δ: 3.42 (s, 3H), 3.41 (s, 2H), 3.02-2.99 (m, 2H), 2.75 (t, 3H), 2.17-2.12 (m, 2H), 1.75-1.56 (m, 6H) |
| 3 | 3 | 6-Chloro-$N^4$-(3-methoxy-2,2-dimethylpropyl)-$N^4$-methyl-3-nitropyridine-2,4-diamine | MS (ESI+) m/z 303.6 (M + H)$^+$ |
| 4 | 4 | 6'-Cyclopropyl-$N^4$-{[1-(methoxymethyl)cyclohexyl]methyl}-$N^4$-methyl-5-nitro-5'-(trifluoromethyl)[2,3'-bipyridine]-4,6-diamine | MS (ESI+) m/z 494.4 (M + H)$^+$ |

TABLE 1-continued

| REx | PREx | Compound Name | Data |
|---|---|---|---|
| 5 | 5 | 2'-Ethoxy-$N^4$-{[1-(ethoxymethyl)cyclopentyl]methyl}-$N^4$-methyl-6'-(trifluoromethyl)[2,4'-bipyridine]-4,5,6-triamine | MS (ESI+) m/z 468.4 (M + H)+ |
| 6 | 6 | 6'-Ethoxy-$N^4$-{[1-(methoxymethyl)cyclohexyl]methyl}-$N^4$-methyl-5'-(trifluoromethyl)[2,3'-bipyridine]-4,5,6-triamine | $^1$H-NMR (400 MHz, CDCl$_3$) δ: 8.74 (d, 1H), 8.38 (d, 1H), 7.05 (s, 1H), 4.51 (q, 2H), 4.23 (br, 2H), 3.72 (br, 2H), 3.14(s, 2H), 3.12(s, 3H), 3.08 (s, 2H), 2.72 (s, 3H), 1.24-1.46 (m, 13H) |

TABLE 2

| REx | PREx | Compound Name | Data |
|---|---|---|---|
| 7 | 7 | 6'-Cyclopropyl-$N^4$-{[1-(ethoxymethyl)cyclopentyl]methyl}-$N^4$-methyl-5'-(trifluoromethyl)[2,3'-bipyridine]-4,5,6-triamine | MS (ESI+) m/z 464.3 (M + H)+ |
| 8 | 8 | 5-[6-Ethoxy-5-(trifluoromethyl)pyridin-3-yl]-$N^7$-{[1-(methoxymethyl)cyclohexyl]methyl}-$N^7$-methyl-1H-imidazo[4,5-b]pyridine-2,7-diamine | MS (ESI+) m/z 493.4 (M + H)+ |
| 9 | 9 | 5-[6-Cyclopropyl-5-(trifluoromethyl)pyridin-3-yl]-$N^7$-{[1-(methoxymethyl)cyclopentyl]methyl}-$N^7$-methyl-1H-imidazo[4,5-b]pyridine-2,7-diamine | MS (ESI+) m/z 475.5 (M + H)+ |
| 10 | 10 | 5-(2-Ethoxy-2-oxoethyl)pyridine-2-carboxylic acid | MS (ESI+) m/z 210.4 (M + H)+ |
| 11 | 11 | 5-(3-Ethoxy-3-oxopropyl)pyridine-2-carboxylic acid | MS (ESI+) m/z 224.2 (M + H)+ |
| 12 | 12 | 5-(3-Ethoxy-3-oxopropyl)-4-methoxypyridine-2-carboxylic acid | MS (ESI+) m/z 254.4 (M + H)+ |
| 13 | 13 | 5-2-(Ethoxycarbonyl)cyclopropyl]pyridine-2-carboxylic acid hydrochloride | MS (ESI+) m/z 236.4 (M + H)+ |
| 14 | 14 | 6-(3-Ethoxy-3-oxopropyl)pyridine-3-carboxylic acid | MS (ESI+) m/z 224.4 (M + H)+ |

TABLE 3

| REx | PREx | Compound Name | Data |
|---|---|---|---|
| 15 | 15 | 5-(5-Ethoxy-5-oxopentyl)pyridine-2-carboxylic acid | MS (ESI+) m/z 252.4 (M + H)+ |
| 16 | 16 | 5-{[(1R,5S,6r)-6-(Methoxycarbonyl)-3-azabicyclo[3.1.0]hexan-3-yl]methyl}pyridine-2-carboxylic acid dihydrochloride | MS (ESI+) m/z 277.4 (M + H)+ |
| 17 | 17 | 5-[(2-Ethoxy-2-oxoethyl)(methyl)amino]pyridine-2-carboxylic acid | MS (ESI+) m/z 239.4 (M + H)+ |
| 18 | 18 | 5-[4-(Ethoxycarbonyl)piperidin-1-yl]pyridine-2-carboxylic acid | MS (ESI+) m/z 279.4 (M + H)+ |
| 19 | 19 | 5-[(3S)-3-(2-Ethoxy-2-oxoethoxy)pyrrolidin-1-yl]pyridine-2-carboxylic acid hydrochloride | MS (ESI+) m/z 295.4 (M + H)+ |
| 20 | 20 | 6-[(2-Ethoxy-2-oxoethyl)(methyl)amino]pyrimidine-4-carboxylic acid | MS (ESI+) m/z 240.4 (M + H)+ |
| 21 | 21 | 5-[2-(Methoxycarbonyl)pyrrolidine-1-carbonyl]pyridine-2-carboxylic acid | MS (ESI+) m/z 279.4 (M + H)+ |
| 22 | 22 | 5-[(2-Ethoxy-2-oxoethoxy)methyl]pyridine-2-carboxylic acid hydrochloride | MS (ESI+) m/z 240.2 (M + H)+ |
| 23 | 23 | 5-[2-(2-Ethoxy-2-oxoethoxy)ethyl]pyridine-2-carboxylic acid | MS (ESI+) m/z 226.4 (M + H)+ |
| 24 | 24 | 5-(4-Ethoxy-4-oxobutoxy)pyridine-2-carboxylic acid | MS (ESI+) m/z 254.0 (M + H)+ |
| 25 | 25 | 4-(2-Ethoxy-2-oxoethoxy)pyridine-2-carboxylic acid | MS (ESI+) m/z 226.2 (M + H)+ |

TABLE 4

| REx | PREx | Compound Name | Data |
|---|---|---|---|
| 26 | 26 | 6-(2-Ethoxy-2-oxoethoxy)pyrimidine-4-carboxylic acid hydrochloride | MS (ESI+) m/z 227.3 (M + H)+ |
| 27 | 27 | 1-(4-Ethoxy-4-oxobutan-2-yl)-1H-imidazole-4-carboxylic acid | MS (ESI+) m/z 227.4 (M + H)+ |
| 28 | 28 | 6-(3-Ethoxy-3-oxopropyl)-5,6,7,8-tetrahydroimidazo[1,2-a]pyridine-2-carboxylic acid | MS (ESI+) m/z 267.0 (M + H)+ |
| 29 | 29 | 5-[1-(3-Ethoxy-3-oxopropyl)piperidin-4-yl]pyridine-2-carboxylic acid dihydrochloride | MS (ESI+) m/z 307.4 (M + H)+ |
| 30 | 30 | 7-(3-Ethoxy-3-oxopropyl)-5,6,7,8-tetrahydro-2,7-naphthyridine-3-carboxylic acid dihydrochloride | MS (ESI+) m/z 279.4 (M + H)+ |
| 31 | 31 | 6-(3-Ethoxy-3-oxopropyl)-5,6,7,8-tetrahydro-1,6-naphthyridine-2-carboxylic acid hydrochloride | MS (ESI+) m/z 279.4 (M + H)+ |
| 32 | 32 | 7-(2-Ethoxy-2-oxoethyl)-5,6,7,8-tetrahydro-2,7-naphthyridine-3-carboxylic acid dihydrochloride | MS (ESI+) m/z 265.5 (M + H)+ |
| 33 | 33 | 7-(Ethoxycarbonyl)-5,6,7,8-tetrahydroisoquinoline-3-carboxylic acid | MS (ESI+) m/z 250.4 (M + H)+ |
| 34 | 34 | 6-(Methoxycarbonyl)-5,6,7,8-tetrahydroimidazo[1,2-a]pyridine-2-carboxylic acid | MS (ESI+) m/z 225.4 (M + H)+ |
| 35 | 35 | 5-(Methoxycarbonyl)-4,5,6,7-tetrahydropyrazolo[1,5-a]pyridine-2-carboxylic acid | MS (ESI+) m/z 239.4 (M + H)+ |

TABLE 5

| REx | PREx | Compound Name | Data |
|---|---|---|---|
| 36 | 36 | 5-(3-Ethoxy-2-fluoro-3-oxopropyl)pyridine-2-carboxylic acid hydrochloride | MS (ESI+) m/z 242.1 (M + H)+ |
| 37 | 37 | 5-(4-Ethoxy-4-oxobutyl)pyridine-2-carboxylic acid | MS (ESI+) m/z 238.1 (M + H)+ |
| 38 | 38 | 5-{[(1-Methoxy-2-methyl-1-oxopropan-2-yl)amino]methyl}pyridine-2-carboxylicacid dihydrochloride | MS (ESI+) m/z 253.1 (M + H)+ |
| 39 | 39 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoate | MS (ESI+) m/z 680.4 (M + H)+ |
| 40 | 40 | Ethyl 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoate | MS (ESI+) m/z 684.7 (M + H)+ |
| 41 | 41 | Ethyl 3-[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoate | MS (ESI+) m/z 680.7 (M + H)+ |

TABLE 6

| REx | PREx | Compound Name | Data |
|---|---|---|---|
| 42 | 39 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-methylpropanoate | MS (ESI+) m/z 694.7 (M + H)+ |
| 43 | 43 | Methyl 2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-6-carboxylate | MS (ESI+) m/z 681.9 (M + H)+ |
| 44 | 44 | Ethyl 2-({[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}(methyl)amino)acetate | MS (ESI+) m/z 709.6 (M + H)+ |
| 45 | 45 | Ethyl 4-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]butanoate | MS (ESI+) m/z 683.7 (M + H)+ |

TABLE 7

| REx | PREx | Compound Name | Data |
|---|---|---|---|
| 46 | 46 | Ethyl 4-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoate | MS (ESI+) m/z 694.3 (M + H)+ |
| 47 | 47 | Ethyl 3-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoate | MS (ESI+) m/z 739.8 (M + H)+ |
| 48 | 47 | Ethyl 3-[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoate | MS (ESI+) m/z 735.7 (M + H)+ |
| 49 | 49 | Ethyl 4-[6-({5-[6-cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoate | MS (ESI+) m/z 708.6 (M + H)+ |

TABLE 8

| REx | PREx | Compound Name | Data |
|---|---|---|---|
| 50 | 50 | Ethyl 4-[6-({5-[6-ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoate | MS (ESI+) m/z 698.6 (M + H)$^+$ |
| 51 | 51 | Ethyl 3-[6-({5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]propanoate | MS (ESI+) m/z 698.8 (M + H)$^+$ |
| 52 | 52 | Ethyl 4-[6-({5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoate | MS (ESI+) m/z 712.8 (M + H)$^+$ |
| 53 | 53 | Ethyl N-[6-({5-[6-cyclopropyl-5-(trifluoromethyl)pyridin-3-7-[{(1-(methoxymethyl)cyclopentyl]methyl}(methyl)amino]-yl]-1H-imidazo[4,5-b]pyridin-2-yl}carbamoyl)pyridine-3-carbonyl]-N-methylglycinate | MS (ESI+) m/z 723.7 (M + H)$^+$ |

TABLE 9

| REx | PREx | Compound Name | Data |
|---|---|---|---|
| 54 | 2 | 1-[1-(Methoxymethyl)cyclohexyl]-N-methylmethaneamine hydrochloride | $^1$H-NMR (400 MHz, CDCl$_3$) δ: 9.16 (brs, 2H), 3.49 (s, 2H), 3.41 (s, 3H), 2.94 (s, 2H), 2.74 (s, 3H), 1.62-1.39 (m, 10H) |
| 55 | 3 | 6-Chloro-N$^4$-{[1-(methoxymethyl)cyclobutyl]methyl}-N$^4$-methyl-3-nitropyridine-2,4-diamine | MS (ESI+) m/z 315.5 (M + H)$^+$ |
| 56 | 3 | 6-Chloro-N$^4$-{[1-(methoxymethyl)cyclopentyl]methyl}-N$^4$-methyl-3-nitropyridine-2,4-diamine | MS (ESI+) m/z 329.1 (M + H)$^+$ |
| 57 | 3 | 6-Chloro-N$^4$-{[1-(methoxymethyl)cyclohexyl]methyl}-N$^4$-methyl-3-nitropyridine-2,4-diamine | MS (ESI+) m/z 343.5 (M + H)$^+$ |
| 58 | 3 | 6-Chloro-N$^4$-{[1-(ethoxymethyl)cyclopentyl]methyl}-N$^4$-methyl-3-nitropyridine-2,4-diamine | MS (ESI+) m/z 343.2 (M + H)$^+$ |
| 59 | 4 | 6-[4-Cyclopropyl-3-(trifluoromethyl)phenyl]-N$^4$-{[1-(methoxymethyl)cyclopentyl]methyl}-N$^4$-methyl-3-nitropyridine-2,4-diamine | MS (ESI+) m/z 479.3 (M + H)$^+$ |

TABLE 10

| REx | PREx | Compound Name | Data |
|---|---|---|---|
| 60 | 4 | 6'-Ethoxy-N$^4$-{[1-(methoxymethyl)cyclopentyl]methyl}-N$^4$-methyl-5-nitro-5'-(trifluoromethyl)[2,3'-bipyridine]-4,6-diamine | MS (ESI+) m/z 484.1 (M + H)$^+$ |
| 61 | 4 | 6'-Ethoxy-N$^4$-{[1-(methoxymethyl)cyclohexyl]methyl}-N$^4$-methyl-5-nitro-5'-(trifluoromethyl)[2,3'-bipyridine]-4,6-diamine | MS (ESI+) m/z 498.7 (M + H)$^+$ |
| 62 | 4 | 2'-Ethoxy-N$^4$-{[1-(methoxymethyl)cyclopentyl]methyl}-N$^4$-methyl-5-nitro-6'-(trifluoromethyl)[[2,4'-bipyridine]-4,6-diamine | MS (ESI+) m/z 484.7 (M + H)$^+$ |
| 63 | 4 | 2'-Ethoxy-N4-{[1-(methoxymethyl)cyclohexyl]methyl}-N4-methyl-5-nitro-6'-(trifluoromethyl)[[2,4'-bipyridine]-4,6-diamine | MS (ESI+) m/z 498.7 (M + H)$^+$ |
| 64 | 4 | 6'-Cyclopropyl-N$^4$-{[1-(methoxymethyl)cyclopentyl]methyl}-N$^4$-methyl-5-nitro-5'-(trifluoromethyl)[2,3'-bipyridine]-4,6-diamine | MS (ESI+) m/z 480.6 (M + H)$^+$ |

TABLE 11

| REx | PREx | Compound Name | Data |
|---|---|---|---|
| 65 | 4 | 6'-Cyclopropyl-N$^4$-{[1-(ethoxymethyl)cyclopentyl]methyl}-N$^4$-methyl-5-nitro-5'-(trifluoromethyl)[2,3'-bipyridine]-4,6-diamine | MS (ESI+) m/z 494.3 (M + H)$^+$ |
| 66 | 4 | 2'-Cyclopropyl-N$^4$-(3-methoxy-2,2-dimethylpropyl)-N4-methyl-5-nitro-6'-(trifluoromethyl)[[2,4'-bipyridine]-4,6-diamine | MS (ESI+) m/z 454.7 (M + H)$^+$ |
| 67 | 4 | 2'-Cyclopropyl-N$^4$-{[1-(methoxymethyl)cyclobutyl]methyl}-N$^4$-methyl-5-nitro-6'-(trifluoromethyl)[[2,4'-bipyridine]-4,6-diamine | MS (ESI+) m/z 466.7 (M + H)$^+$ |
| 68 | 4 | 2'-Cyclopropyl-N$^4$-{[1-(methoxymethyl)cyclopentyl]methyl}-N$^4$-methyl-5-nitro-6'-(trifluoromethyl)[[2,4'-bipyridine]-4,6-diamine | MS (ESI+) m/z 480.6 (M + H)$^+$ |
| 69 | 6 | 6-[4-Cyclopropyl-3-(trifluoromethyl)phenyl]-N$^4$-{[1-(methoxymethyl)cyclopentyl]methyl}-N4-methylpyridine-2,3,4-triamine | MS (ESI+) m/z 449.7 (M + H)$^+$ |

TABLE 12

| REx | PREx | Compound Name | Data |
|---|---|---|---|
| 70 | 7 | 6'-Ethoxy-N$^4$-{[1-(methoxymethyl)cyclopentyl]methyl}-N$^4$-methyl-5'-(trifluoromethyl)[2,3'-bipyridine]-4,5,6-triamine | MS (ESI+) m/z 454.7 (M + H)$^+$ |
| 71 | 7 | 2'-Ethoxy-N$^4$-{[1-(methoxymethyl)cyclopentyl]methyl}-N$^4$-methyl-6'-(trifluoromethyl)[2,4'-bipyridine]-4,5,6-triamine | MS (ESI+) m/z 454.4 (M + H)$^+$ |
| 72 | 6 | 2'-Ethoxy-N$^4$-{[1-(methoxymethyl)cyclohexyl]methyl}-N$^4$-methyl-6'-(trifluoromethyl)[2,4'-bipyridine]-4,5,6-triamine | MS (ESI+) m/z 468.7 (M + H)$^+$ |

TABLE 12-continued

| REx | PREx | Compound Name | Data |
|---|---|---|---|
| 73 | 7 | 6'-Cyclopropyl-$N^4$-{[1-(methoxymethyl)cyclopentyl]methyl}-$N^4$-methyl-5'-(trifluoromethyl)[2,3'-bipyridine]-4,5,6-triamine | MS (ESI+) m/z 450.6 (M + H)$^+$ |
| 74 | 7 | 6'-Cyclopropyl-$N^4$-{[1-(methoxymethyl)cyclohexyl]methyl}-$N^4$-methyl-5'-(trifluoromethyl)[2,3'-bipyridine]-4,5,6-triamine | MS (ESI+) m/z 464.5 (M + H)$^+$ |

TABLE 13

| REx | PREx | Compound Name | Data |
|---|---|---|---|
| 75 | 6 | 2'-Cyclopropyl-$N^4$-(3-methoxy-2,2-dimethylpropyl)-$N^4$-methyl-6'-(trifluoromethyl)[2,4'-bipyridine]-4,5,6-triamine | MS (ESI+) m/z 424.7 (M + H)$^+$ |
| 76 | 6 | 2'-Cyclopropyl-$N^4$-{[1-(methoxymethyl)cyclobutyl]methyl}-$N^4$-methyl-6'-(trifluoromethyl) [2,4'-bipyridine]-4,5,6-triamine | MS (ESI+) m/z 436.7 (M + H)$^+$ |
| 77 | 7 | 2'-Cyclopropyl-$N^4$-{[1-(methoxymethyl)cyclopentyl]methyl}-$N^4$-methyl-6'-(trifluoromethyl)[2,4'-bipyridine]-4,5,6-triamine | MS (ESI+) m/z 450.6 (M + H)$^+$ |
| 78 | 5 | 2'-Cyclopropyl-$N^4$-{[1-(methoxymethyl)cyclohexyl]methyl}-$N^4$-methyl-6'-(trifluoromethyl)[2,4'-bipyridine]-4,5,6-triamine | MS (ESI+) m/z 464.8 (M + H)$^+$ |
| 79 | 5 | 6'-Ethoxy-$N^4$-{[1-(ethoxymethyl)cyclopentyl]methyl}-$N^4$-methyl-5'-(trifluoromethyl)-[2,3'-bipyridine]-4,5,6-triamine | MS (ESI+) m/z 468.8 (M + H)$^+$ |

TABLE 14

| REx | PREx | Compound Name | Data |
|---|---|---|---|
| 80 | 8 | 5-[4-Cyclopropyl-3-(trifluoromethyl)phenyl]-$N^7$-{[1-(methoxymethyl)cyclopentyl]methyl}-$N^7$-methyl-1H-imidazo[4,5-b]pyridine-2,7-diamine | MS (ESI+) m/z 474.6 (M + H)$^+$ |
| 81 | 8 | 5-[6-Ethoxy-5-(trifluoromethyl)pyridin-3-yl]-$N^7$-{[1-(methoxymethyl)cyclopentyl]methyl}-$N^7$-methyl-1H-imidazo[4,5-b]pyridine-2,7-diamine | MS (ESI+) m/z 479.4 (M + H)$^+$ |
| 82 | 8 | 5-[6-Ethoxy-5-(trifluoromethyl)pyridin-3-yl]-$N^7$-{[1-(ethoxymethyl)cyclopentyl]methyl}-$N^7$-methyl-1H-imidazo[4,5-b]pyridine-2,7-diamine | MS (ESI+) m/z 493.4 (M + H)$^+$ |
| 83 | 8 | 5-[2-Ethoxy-6-(trifluoromethyl)pyridin-4-yl]-$N^7$-{[1-(methoxymethyl)cyclopentyl]methyl}-$N^7$-methyl-1H-imidazo[4,5-b]pyridine-2,7-diamine | MS (ESI+) m/z 479.3 (M + H)$^+$ |

TABLE 15

| REx | PREx | Compound Name | Data |
|---|---|---|---|
| 84 | 8 | 5-[2-Ethoxy-6-(trifluoromethyl)pyridin-4-yl]-$N^7$-{[1-(methoxymethyl)cyclohexyl]methyl}-$N^7$-methyl-1H-imidazo[4,5-b]pyridine-2,7-diamine | MS (ESI+) m/z 493.7 (M + H)$^+$ |
| 85 | 8 | 5-[2-Ethoxy-6-(trifluoromethyl)pyridin-4-yl]-$N^7$-{[1-(ethoxymethyl)cyclopentyl]methyl}-$N^7$-methyl-1H-imidazo[4,5-b]pyridine-2,7-diamine | MS (ESI+) m/z 493.6 (M + H)$^+$ |
| 86 | 8 | 5-[6-Cyclopropyl-5-(trifluoromethyl)pyridin-3-yl]-$N^7$-{[1-(methoxymethyl)cyclohexyl]methyl}-$N^7$-methyl-1H-imidazo[4,5-b]pyridine-2,7-diamine | MS (ESI+) m/z 489.6 (M + H)$^+$ |
| 87 | 8 | 5-[6-Cyclopropyl-5-(trifluoromethyl)pyridin-3-yl]-$N^7$-{[1-(ethoxymethyl)cyclopentyl]methyl}-$N^7$-methyl-1H-imidazo[4,5-b]pyridine-2,7-diamine | MS (ESI+) m/z 489.6 (M + H)$^+$ |

TABLE 16

| REx | PREx | Compound Name | Data |
|---|---|---|---|
| 88 | 8 | 5-[2-Cyclopropyl-6-(trifluoromethyl)pyridin-4-yl]-$N^7$-(3-methoxy-2,2-dimethylpropyl)-$N^7$-methyl-1H-imidazo[4,5-b]pyridine-2,7-diamine | MS (ESI+) m/z 449.6 (M + H)$^+$ |
| 89 | 8 | 5-[2-Cyclopropyl-6-(trifluoromethyl)pyridin-4-yl]-$N^7$-{[1-(methoxymethyl)cyclobutyl]methyl}-$N^7$-methyl-1H-imidazo[4,5-b]pyridine-2,7-diamine | MS (ESI+) m/z 461.4 (M + H)$^+$ |
| 90 | 8 | 5-[2-Cyclopropyl-6-(trifluoromethyl)pyridin-4-yl]-$N^7$-{[1-(methoxymethyl)cyclopentyl]methyl}-$N^7$-methyl-1H-imidazo[4,5-b]pyridine-2,7-diamine | MS (ESI+) m/z 475.5 (M + H)$^+$ |
| 91 | 8 | 5-[2-Cyclopropyl-6-(trifluoromethyl)pyridin-4-yl]-$N^7$-{[1-(methoxymethyl)cyclohexyl]methyl}-$N^7$-methyl-1H-imidazo[4,5-b]pyridine-2,7-diamine | MS (ESI+) m/z 489.6 (M + H)$^+$ |

TABLE 17

| REx | PREx | Compound Name | Data |
|---|---|---|---|
| 92 | 11 | 4-(3-Ethoxy-3-oxopropyl)pyridine-2-carboxylic acid | MS (ESI+) m/z 224.2 (M + H)$^+$ |
| 93 | 12 | 5-(3-Ethoxy-3-oxopropyl)-6-methoxypyridine-2-carboxylic acid | MS (ESI+) m/z 254.2 (M + H)$^+$ |
| 94 | 12 | 5-(3-Ethoxy-3-oxopropyl)-6-methylpyridine-2-carboxylic acid | MS (ESI+) m/z 238.1 (M + H)$^+$ |
| 95 | 12 | 5-(3-Ethoxy-3-oxopropyl)-4-methylpyridine-2-carboxylic acid | MS (ESI+) m/z 238.4 (M + H)$^+$ |
| 96 | 12 | 5-(3-Ethoxy-3-oxopropyl)-3-methylpyridine-2-carboxylic acid | MS (ESI+) m/z 238.4 (M + H)$^+$ |
| 97 | 11 | 5-(3-Ethoxy-2-methyl-3-oxopropyl)pyridine-2-carboxylic acid | MS (ESI+) m/z 238.4 (M + H)$^+$ |
| 98 | 16 | 5-{[(2-Ethoxy-2-oxoethyl)(methyl)amino]methyl}pyridine-2-carboxylic acid dihydrochloride | MS (ESI+) m/z 253.4 (M + H)$^+$ |

TABLE 17-continued

| REx | PREx | Compound Name | Data |
|---|---|---|---|
| 99 | 16 | 5-{[(2-Ethoxy-2-oxoethyl)(ethyl)amino]methyl}pyridine-2-carboxylic acid dihydrochloride | MS (ESI+) m/z 267.5 (M + H)+ |
| 100 | 16 | 5-({[1-(Ethoxycarbonyl)cyclopropyl]amino}methyl)pyridine-2-carboxylic acid dihydrochloride | MS (ESI+) m/z 265.2 (M + H)+ |
| 101 | 38 | 5-({[1-(Methoxycarbonyl)cyclobutyl]amino}methyl)pyridine-2-carboxylic acid dihydrochloride | MS (ESI+) m/z 265.4 (M + H)+ |
| 102 | 16 | 5-{[(3R)-3-(Methoxycarbonyl)pyrrolidin-1-yl]methyl}pyridine-2-carboxylic acid dihydrochloride | MS (ESI+) m/z 265.5 (M + H)+ |

TABLE 18

| REx | PREx | Compound Name | Data |
|---|---|---|---|
| 103 | 16 | 5-{[(3S)-3-(Methoxycarbonyl)pyrrolidin-1-yl]methyl}pyridine-2-carboxylic acid dihydrochloride | MS (ESI+) m/z 265.5 (M + H)+ |
| 104 | 16 | 5-{[3-(Ethoxycarbonyl)-3-methylpyrrolidin-1-yl]methyl}pyridine-2-carboxylic acid dihydrochloride | MS (ESI+) m/z 293.5 (M + H)+ |
| 105 | 16 | 5-{[(3R)-3-(2-Ethoxy-2-oxoethoxy)pyrrolidin-1-yl]methyl}pyridine-2-carboxylic acid dihydrochloride | MS (ESI+) m/z 309.5 (M + H)+ |
| 106 | 16 | 5-{[3S)-3-(2-Ethoxy-2-oxoethoxy)pyrrolidin-1-yl]methyl}pyridine-2-carboxylic acid dihydrochloride | MS (ESI+) m/z 309.5 (M + H)+ |
| 107 | 16 | 5-{[(3S)-3-[(2-Ethoxy-2-oxoethyl)(methyl)amino]pyrrolidin-1-yl]methyl}pyridine-2-carboxylic acid dihydrochloride | MS (ESI+) m/z 322.4 (M + H)+ |
| 108 | 16 | 5-{[(3R)-3-[(2-Ethoxy-2-oxoethyl)(methyl)amino]pyrrolidin-1-yl]methyl}pyridine-2-carboxylic acid dihydrochloride | MS (ESI+) m/z 322.4 (M + H)+ |
| 109 | 16 | 5-{[2-(Methoxycarbonyl)pyrrolidin-1-yl]methyl}pyridine-2-carboxylic acid dihydrochloride | MS (ESI+) m/z 265.2 (M + H)+ |
| 110 | 16 | 5-{[3-(Ethoxycarbonyl)piperidin-1-yl]methyl}pyridine-2-carboxylic acid dihydrochloride | MS (ESI+) m/z 293.3 (M + H)+ |

TABLE 19

| REx | PREx | Compound Name | Data |
|---|---|---|---|
| 111 | 16 | 5-([3-(Methoxycarbonyl)morpholin-4-yl]methyl}pyridine-2-carboxylic acid dihydrochloride | MS (ESI+) m/z 281.5 (M + H)+ |
| 112 | 16 | 5-{[2-(Methoxycarbonyl)morpholin-4-yl]methyl}pyridine-2-carboxylic acid dihydrochloride | MS (ESI+) m/z 281.4 (M + H)+ |
| 113 | 18 | 5-[3-(Ethoxycarbonyl)azetidin-1-yl]pyridine-2-carboxylic acid | MS (ESI+) m/z 251.4 (M + H)+ |
| 114 | 19 | 5-[(3R)-3-(2-Ethoxy-2-oxoethoxy)pyrrolidin-1-yl]pyridine-2-carboxylic acid hydrochloride | MS (ESI+) m/z 295.4 (M + H)+ |
| 115 | 18 | 4-[2-(Methoxycarbonyl)pyrrolidin-1-yl]pyridine-2-carboxylic acid | MS (ESI+) m/z 251.4 (M + H)+ |
| 116 | 27 | 1-[(2S)-3-Methoxy-2-methyl-3-oxopropyl]-1H-imidazole-4-carboxylic acid | MS (ESI+) m/z 213.4 (M + H)+ |

TABLE 19-continued

| REx | PREx | Compound Name | Data |
|---|---|---|---|
| 117 | 27 | 1-[(2R)-3-Methoxy-2-methyl-3-oxopropyl]-1H-imidazole-4-carboxylic acid | MS (ESI+) m/z 213.4 (M + H)+ |
| 118 | 27 | 1-(3-Ethoxy-3-oxopropyl)-1H-pyrazole-3-carboxylic acid | MS (ESI+) m/z 213.1 (M + H)+ |
| 119 | 34 | 7-(Methoxycarbonyl)-5,6,7,8-tetrahydroimidazo[1,2-a]pyridine-2-carboxylic acid | MS (ESI+) m/z 225.4 (M + H)+ |
| 120 | 16 | 5-{[3-Fluoro-3-(methoxycarbonyl)pyrrolidin-1-yl]methyl}pyridine-2-carboxylic acid dihydrochloride | MS (ESI+) m/z 283.4 (M + H)+ |

TABLE 20

| REx | PREx | Compound Name | Data |
|---|---|---|---|
| 121 | 39 | Methyl 6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carboxylate | MS (ESI+) m/z 638.7 (M + H)+ |
| 122 | 39 | Ethyl 2-{6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]oxy}acetate | MS (ESI+) m/z 682.7 (M + H)+ |
| 123 | 39 | Methyl 4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-3-fluorobenzoate | MS (ESI+) m/z 655.7 (M + H)+ |
| 124 | 39 | Ethyl 5-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrazine-2-carboxylate | MS (ESI+) m/z 653.7 (M + H)+ |

TABLE 21

| REx | PREx | Compound Name | Data |
|---|---|---|---|
| 125 | 39 | Ethyl 2-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)phenyl]acetate | MS (ESI+) m/z 651.7 (M + H)+ |
| 126 | 39 | Methyl 6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridine-3-carboxylate | MS (ESI+) m/z 642.7 (M + H)+ |
| 127 | 39 | Methyl 6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridine-3-carboxylate | MS (ESI+) m/z 638.6 (M + H)+ |
| 128 | 39 | Ethyl 3-[5-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-2-yl]propanoate | MS (ESI+) m/z 680.7 (M + H)+ |

TABLE 22

| REx | PREx | Compound Name | Data |
|---|---|---|---|
| 129 | 129 | Ethyl 2-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]acetate | MS (ESI+) m/z 655.4 (M + H)+ |
| 130 | 129 | Ethyl 3-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]propanoate | MS (ESI+) m/z 669.5 (M + H)+ |
| 131 | 129 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5-methylpyridin-3-yl]propanoate | MS (ESI+) m/z 694.4 (M + H)+ |
| 132 | 39 | Ethyl 3-[6-({5-[6-cyclopropyl-5-(trifluoromethyl)pyridin-3-yl]-7-({[1-(ethoxymethyl)cyclopentyl]methyl}(methyl)amino)-1H-imidazo[4,5-b]pyridin-2-yl}carbamoyl)pyridin-3-yl]propanoate | MS (ESI+) m/z 694.7 (M + H)+ |

TABLE 23

| REx | PREx | Compound Name | Data |
|---|---|---|---|
| 133 | 39 | Ethyl 3-[6-({5-[6-ethoxy-5-(trifluoromethyl)pyridin-3-yl]-7-({[1-(ethoxymethyl)cyclopentyl]methyl}(methyl)amino)-1H-imidazo[4,5-b]pyridin-2-yl}carbamoyl)pyridin-3-yl]propanoate | MS (ESI+) m/z 698.8 (M + H)+ |
| 134 | 39 | Ethyl 3-[6-({5-[6-cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]propanoate | MS (ESI+) m/z 694.7 (M + H)+ |
| 135 | 39 | Ethyl 3-[6-({5-[4-cyclopropyl-3-(trifluoromethyl)phenyl]-7-({[1-(methoxymethyl)cyclopentyl]methyl}(methyl)amino)-1H-imidazo[4,5-b]pyridin-2-yl}carbamoyl)pyridin-3-yl]propanoate | MS (ESI+) m/z 679.7 (M + H)+ |
| 136 | 39 | Ethyl 3-[6-({5-[2-cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]propanoate | MS (ESI+) m/z 694.8 (M + H)+ |

TABLE 24

| REx | PREx | Compound Name | Data |
|---|---|---|---|
| 137 | 39 | Ethyl 3-[6-({5-[2-cyclopropyl-6-(trifluoromethyl)pyridin-4-yl]-7-({[1-(methoxymethyl)cyclobutyl]methyl}(methyl)amino)-1H-imidazo[4,5-b]pyridin-2-yl}carbamoyl)pyridin-3-yl]propanoate | MS (ESI+) m/z 666.7 (M + H)+ |
| 138 | 39 | Ethyl 3-[6-({5-[2-cyclopropyl-6-(trifluoromethyl)pyridin-4-yl]-7-[(3-methoxy-2,2-dimethylpropyl)(methyl)amino]-1H-imidazo[4,5-b]pyridin-2-yl}carbamoyl)pyridin-3-yl]propanoate | MS (ESI+) m/z 654.7 (M + H)+ |
| 139 | 39 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-4-methylpyridin-3-yl]propanoate | MS (ESI+) m/z 694.4 (M + H)+ |
| 140 | 39 | Ethyl 3-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-3-fluorophenyl]propanoate | MS (ESI+) m/z 697.7 (M + H)+ |

TABLE 25

| REx | PREx | Compound Name | Data |
|---|---|---|---|
| 141 | 39 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-2-methylpyridin-3-yl]propanoate | MS (ESI+) m/z 694.7 (M + H)+ |
| 142 | 39 | Ethyl 3-[6-({5-[6-ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoate | MS (ESI+) m/z 684.7 (M + H)+ |
| 143 | 39 | Ethyl 3-[2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-4-yl]propanoate | MS (ESI+) m/z 680.9 (M + H)+ |
| 144 | 43 | Ethyl 3-[3-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-pyrazol-1-yl]propanoate | MS (ESI+) m/z 669.8 (M + H)+ |

TABLE 26

| REx | PREx | Compound Name | Data |
|---|---|---|---|
| 145 | 39 | Ethyl 2-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]acetate | MS (ESI+) m/z 666.8 (M + H)+ |
| 146 | 43 | Ethyl 3-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-3-methoxyphenyl]propanoate | MS (ESI+) m/z 709.5 (M + H)+ |
| 147 | 39 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-2-methoxypyridin-3-yl]propanoate | MS (ESI+) m/z 710.6 (M + H)+ |
| 148 | 39 | Ethyl 2-{[2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-4-yl]oxy}acetate | MS (ESI+) m/z 682.7 (M + H)+ |

TABLE 27

| REx | PREx | Compound Name | Data |
|---|---|---|---|
| 149 | 39 | Ethyl 1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]azetidine-3-carboxylate | MS (ESI+) m/z 707.7 (M + H)+ |
| 150 | 39 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-4-methoxypyridin-3-yl]propanoate | MS (ESI+) m/z 710.7 (M + H)+ |
| 151 | 43 | Ethyl 2-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrimidin-4-yl](methyl)amino}acetate | MS (ESI+) m/z 696.7 (M + H)+ |
| 152 | 43 | Ethyl 2-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]propanoate | MS (ESI+) m/z 669.6 (M + H)+ |

TABLE 28

| REx | PREx | Compound Name | Data |
|---|---|---|---|
| 153 | 43 | Ethyl 3-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl]-1H-imidazol-1-yl]butanoate | MS (ESI+) m/z 683.6 (M + H)+ |
| 154 | 44 | Ethyl 2-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]cyclopropane-1-carboxylate | MS (ESI+) m/z 692.6 (M + H)+ |
| 155 | 43 | Methyl 2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-7-carboxylate | MS (ESI+) m/z 681.9 (M + H)+ |
| 156 | 43 | Ethyl 2-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrimidin-4-yl]oxy}acetate | MS (ESI+) m/z 683.9 (M + H)+ |

TABLE 29

| REx | PREx | Compound Name | Data |
|---|---|---|---|
| 157 | 44 | Ethyl 3-[2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydro-1,6-naphthyridin-6-yl]propanoate | MS (ESI+) m/z 735.7 (M + H)+ |
| 158 | 43 | Methyl (2R)-3-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]-2-methylpropanoate | MS (ESI+) m/z 669.9 (M + H)+ |
| 159 | 43 | Methyl (2S)-3-[4-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]-2-methylpropanoate | MS (ESI+) m/z 669.9 (M + H)+ |

TABLE 30

| REx | PREx | Compound Name | Data |
|---|---|---|---|
| 160 | 43 | Ethyl 2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-4,5,6,7-tetrahydropyrazolo[1,5-a]pyridine-5-carboxylate | MS (ESI+) m/z 695.6 (M + H)+ |
| 161 | 44 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoate | MS (ESI+) m/z 735.7 (M + H)+ |
| 162 | 44 | Methyl 1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidine-2-carboxylate | MS (ESI+) m/z 721.7 (M + H)+ |

TABLE 31

| REx | PREx | Compound Name | Data |
|---|---|---|---|
| 163 | 44 | Ethyl 1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}piperidine-3-carboxylate | MS (ESI+) m/z 749.8 (M + H)+ |
| 164 | 43 | Ethyl 1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]piperidine-4-carboxylate | MS (ESI+) m/z 735.7 (M + H)+ |
| 165 | 39 | Ethyl 1-[5-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrazin-2-yl]piperidine-4-carboxylate | MS (ESI+) m/z 736.7 (M + H)+ |

TABLE 32

| REx | PREx | Compound Name | Data |
|---|---|---|---|
| 166 | 43 | Methyl 1-[2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-4-yl]pyrrolidine-2-carboxylate | MS (ESI+) m/z 707.7 (M + H)+ |
| 167 | 39 | Ethyl 3-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroisoquinoline-7-carboxylate | MS (ESI+) m/z 706.7 (M + H)+ |
| 168 | 44 | Ethyl 2-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methoxy}acetate | MS (ESI+) m/z 696.6 (M + H)+ |
| 169 | 39 | Methyl 1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]pyrrolidine-2-carboxylate | MS (ESI+) m/z 735.7 (M + H)+ |

TABLE 33

| REx | PREx | Compound Name | Data |
|---|---|---|---|
| 170 | 44 | Ethyl 3-{4-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]piperidin-1-yl}propanoate | MS (ESI+) m/z 763.8 (M + H)+ |
| 171 | 44 | Ethyl 2-({[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]methyl}(methyl)amino)acetate | MS (ESI+) m/z 709.7 (M + H)+ |
| 172 | 44 | Ethyl 2-({[6-({5-[2-cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]methyl}(methyl)amino)acetate | MS (ESI+) m/z 723.8 (M + H)+ |

TABLE 34

| REx | PREx | Compound Name | Data |
|---|---|---|---|
| 173 | 44 | Methyl 1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]pyrrolidine-3-carboxylate | MS (ESI+) m/z 735.7 (M + H)+ |
| 174 | 53 | Ethyl 1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperidine-3-carboxylate | MS (ESI+) m/z 763.7 (M + H)+ |
| 175 | 53 | Ethyl 1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperidine-4-carboxylate | MS (ESI+) m/z 763.7 (M + H)+ |
| 176 | 44 | Methyl 4-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}morpholine-2-carboxylate | MS (ESI+) m/z 737.7 (M + H)+ |

TABLE 35

| REx | PREx | Compound Name | Data |
|---|---|---|---|
| 177 | 44 | Ethyl 2-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]acetate | MS (ESI+) m/z 721.8 (M + H)+ |
| 178 | 53 | Methyl 1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperidine-2-carboxylate | MS (ESI+) m/z 749.8 (M + H)+ |
| 179 | 53 | Ethyl 2-{4-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperazin-1-yl}acetate | MS (ESI+) m/z 778.8 (M + H)+ |

TABLE 36

| REx | PREx | Compound Name | Data |
|---|---|---|---|
| 180 | 53 | Ethyl 3-{4-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperazin-1-yl}propanoate | MS (ESI+) m/z 792.9 (M + H)+ |
| 181 | 44 | Ethyl 3-[6-({5-[2-ethoxy-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)-1,2,3,4-tetrahydro-2,7-naphthyridin-2-yl]propanoate | MS (ESI+) m/z 753.7 (M + H)+ |
| 182 | 44 | Ethyl 3-[6-({5-[2-cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)-1,2,3,4-tetrahydro-2,7-naphthyridin-2-yl]propanoate | MS (ESI+) m/z 749.8 (M + H)+ |

TABLE 37

| REx | PREx | Compound Name | Data |
|---|---|---|---|
| 183 | 44 | Methyl (3R)-1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidine-3-carboxylate | MS (ESI+) m/z 721.7 (M + H)+ |
| 184 | 44 | Methyl (3S)-1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidine-3-carboxylate | MS (ESI+) m/z 721.7 (M + H)+ |
| 185 | 44 | Methyl (1R,5S,6r)-3-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}-3-azabicyclo[3.1,0]hexane-6-carboxylate | MS (ESI+) m/z 733.7 (M + H)+ |

TABLE 38

| REx | PREx | Compound Name | Data |
|---|---|---|---|
| 186 | 44 | Ethyl 2-{[(3R)-1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl]oxy}acetate | MS (ESI+) m/z 765.8 (M + H)+ |
| 187 | 44 | Ethyl 2-{[(3S)-1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl]oxy}acetate | MS (ESI+) m/z 765.8 (M + H)+ |
| 188 | 44 | Ethyl 2-{[3R)-1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]pyrrolidin-3-yl]oxy}acetate | MS (ESI+) m/z 751.8 (M + H)+ |

TABLE 39

| REx | PREx | Compound Name | Data |
|---|---|---|---|
| 189 | 44 | Ethyl 2-{[(3S)-1-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]pyrrolidin-3-yl]oxy}acetate | MS (ESI+) m/z 751.8 (M + H)+ |
| 190 | 44 | Ethyl 2-{[(3R)-1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl](methyl)amino}acetate | MS (ESI+) m/z 778.8 (M + H)+ |
| 191 | 44 | Ethyl 2-{[(3S)-1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl](methyl)amino}acetate | MS (ESI+) m/z 778.8 (M + H)+ |

TABLE 40

| REx | PREx | Compound Name | Data |
|---|---|---|---|
| 192 | 43 | Ethyl 2-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl](methyl)amino}acetate | MS (ESI+) m/z 695.8 (M + H)+ |
| 193 | 44 | Ethyl 1-({[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}amino)cyclopropane-1-carboxylate | MS (ESI+) m/z 721.8 (M + H)+ |
| 194 | 44 | Ethyl 2-({[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}(ethyl)amino)acetate | MS (ESI+) m/z 723.3 (M + H)+ |

TABLE 41

| REx | PREx | Compound Name | Data |
|---|---|---|---|
| 195 | 44 | Ethyl 1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}-3-methylpyrrolidine-3-carboxylate | MS (ESI+) m/z 749.4 (M + H)+ |
| 196 | 44 | Methyl 4-{[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]methyl}morpholine-3-carboxylate | MS (ESI+) m/z 741.8 (M + H)+ |
| 197 | 44 | Ethyl 1-({[6-({5-[2-cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]methyl}amino)cyclopropane-1-carboxylate | MS (ESI+) m/z 735.4 (M + H)+ |
| 198 | 39 | Ethyl 4-[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]butanoate | MS (ESI+) m/z 694.3 (M + H)+ |

TABLE 42

| REx | PREx | Compound Name | Data |
|---|---|---|---|
| 199 | 39 | Ethyl 4-[6-({5-[2-ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]butanoate | MS (ESI+) m/z 694.3 (M + H)+ |
| 200 | 43 | Ethyl 2-{[6-({5-[2-cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl](methyl)amino}acetate | MS (ESI+) m/z 695.3 (M + H)+ |
| 201 | 43 | Ethyl 2-{[6-({5-[2-cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetate | MS (ESI+) m/z 709.3 (M + H)+ |
| 202 | 43 | Ethyl 2-{[6-({5-[2-ethoxy-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetate | MS (ESI+) m/z 713.3 (M + H)+ |

TABLE 43

| REx | PREx | Compound Name | Data |
|---|---|---|---|
| 203 | 39 | Ethyl 4-[6-({5-[2-cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]butanoate | MS (ESI+) m/z 708.4 (M + H)+ |
| 204 | 39 | Ethyl 4-[6-({5-[2-ethoxy-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]butanoate | MS (ESI+) m/z 712.3 (M + H)+ |

TABLE 43-continued

| REx | PREx | Compound Name | Data |
|---|---|---|---|
| 205 | 39 | Ethyl 4-[6-({5-[2-cyclopropyl-6-(trifluoromethyl)pyridin-4-yl]-7-({[1-(methoxymethyl)cyclobutyl]methyl}(methyl)amino)-1H-imidazo[4,5-b]pyridin-2-yl}carbamoyl)pyridin-3-yl]butanoate | MS (ESI+) m/z 680.3 (M + H)+ |
| 206 | 39 | Ethyl 4-[6-({5-[2-cyclopropyl-6-(trifluoromethyl)pyridin-4-yl]-7-[(3-methoxy-2,2-dimethylpropyl)(methyl)amino]-1H-imidazo[4,5-b]pyridin-2-yl}carbamoyl)pyridin-3-yl]butanoate | MS (ESI+) m/z 668.6 (M + H)+ |

TABLE 44

| REx | PREx | Compound Name | Data |
|---|---|---|---|
| 207 | 43 | Ethyl 2-{[6-({5-[6-cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetate | MS (ESI+) m/z 709.4 (M + H)+ |
| 208 | 43 | Ethyl 2-{[6-({5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetate | MS (ESI+) m/z 713.8 (M + H)+ |
| 209 | 44 | Ethyl 3-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-fluoropropanoate | MS (ESI+) m/z 698.3 (M + H)+ |
| 210 | 39 | Ethyl 5-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]pentanoate | MS (ESI+) m/z 708.7 (M + H)+ |

TABLE 45

| REx | PREx | Compound Name | Data |
|---|---|---|---|
| 211 | 39 | Ethyl 2-{2-[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]ethoxy}acetate | MS (ESI+) m/z 710.6 (M + H)+ |
| 212 | 39 | Ethyl 4-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]oxy}butanoate | MS (ESI+) m/z 710.3 (M + H)+ |
| 213 | 39 | Ethyl 4-[6-({5-[2-ethoxy-6-(trifluoromethyl)pyridin-4-yl]-7-({[1-(ethoxymethyl)cyclopentyl]methyl}(methyl)amino)-1H-imidazo[4,5-b]pyridin-2-yl}carbamoyl)pyridin-3-yl]butanoate | MS (ESI+) m/z 712.3 (M + H)+ |
| 214 | 39 | Ethyl 4-[6-({5-[6-ethoxy-5-(trifluoromethyl)pyridin-3-yl]-7-({[1-(ethoxymethyl)cyclopentyl]methyl}(methyl)amino)-1H-imidazo[4,5-b]pyridin-2-yl}carbamoyl)pyridin-3-yl]butanoate | MS (ESI+) m/z 712.3 (M + H)+ |

TABLE 46

| REx | PREx | Compound Name | Data |
|---|---|---|---|
| 215 | 39 | Ethyl 3-[2-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridin-6-yl]propanoate | MS (ESI+) m/z 723.7 (M + H)+ |
| 216 | 44 | Methyl 2-({[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}amino)-2-methylpropanoate | MS (ESI+) m/z 709.4 (M + H)+ |
| 217 | 39 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoic acid | MS (ESI+) m/z 741.2 (M + H)+ |

TABLE 46-continued

| REx | PREx | Compound Name | Data |
|---|---|---|---|
| 218 | 44 | Methyl 1-{[6-({5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}-3-fluoropyrrolidine-3-carboxylate | MS (ESI+) m/z 739.4 (M + H)+ |

TABLE 47

| Ex | PEx | Compound Name |
|---|---|---|
| 1 | 1 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoic acid |
| 2 | 2 | 3-[6-({5-[2-Ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoic acid |
| 3 | 3 | 3-[6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]propanoic acid |
| 4 | 4 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-methylpropanoic acid |
| 5 | 5 | 2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-6-carboxylic acid |
| 6 | 6 | 2-({[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}(methyl)amino)acetic acid |
| 7 | 7 | 4-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]butanoic acid |

TABLE 48

| Ex | PEx | Compound Name |
|---|---|---|
| 8 | 8 | 4-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoic acid |
| 9 | 9 | 3-[6-({5-[2-Ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid |
| 10 | 10 | 3-[6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid |
| 11 | 11 | 4-[6-({5-[6-Cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoic acid |
| 12 | 12 | 4-[6-({5-[6-Ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]butanoic acid |
| 13 | 13 | 3-[6-({5-[6-Ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]propanoic acid |
| 14 | 14 | 4-[6-({5-[6-Ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]butanoic acid |

TABLE 48-continued

| Ex | PEx | Compound Name |
|---|---|---|
| 15 | 2 | 6-({5-[6-Cyclopropyl-5-(trifluoromethyl)pyridin-3-yl]-7-({[1-(methoxymethyl)cyclopentyl]methyl}(methyl)amino)-1H-imidazor4,5-b]pyridin-2-yl}carbamoyl)pyridine-3-carboxylic acid |

TABLE 49

| Ex | PEx | Compound Name |
|---|---|---|
| 16 | 2 | 2-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]oxy}acetic acid |
| 17 | 2 | 4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-3-fluorobenzoic acid |
| 18 | 2 | 5-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrazine-2-carboxylic acid |
| 19 | 2 | 2-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)phenyl]acetic acid |
| 20 | 2 | 6-({5-[2-Ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridine-3-carboxylic acid |
| 21 | 2 | 6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridine-3-carboxylic acid |
| 22 | 2 | 3-[5-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-2-yl]propanoic acid |
| 23 | 2 | 2-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]acetic acid |

TABLE 50

| Ex | PEx | Compound Name |
|---|---|---|
| 24 | 2 | 3-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]propanoic acid |
| 25 | 2 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5-methylpyridin-3-yl]propanoic acid |
| 26 | 2 | 3-[6-({5-[6-Cyclopropyl-5-(trifluoromethyl)pyridin-3-yl]-7-({[1-(ethoxymethyl)cyclopentyl]methyl}(methyl)amino)-1H-imidazo[4,5-b]pyridin-2-yl}carbamoyl)pyridin-3-yl]propanoic acid |
| 27 | 27 | 3-[6-({5-[6-Ethoxy-5-(trifluoromethyl)pyridin-3-yl]-7-({[1-(ethoxymethyl)cyclopentyl]methyl}(methyl)amino)-1H-imidazo[4,5-b]pyridin-2-yl}carbamoyl)pyridin-3-yl]propanoic acid |

TABLE 50-continued

| Ex | PEx | Compound Name |
|---|---|---|
| 28 | 2 | 3-[6-({5-[6-Cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]propanoic acid |
| 29 | 2 | 3-[6-({5-[4-Cyclopropyl-3-(trifluoromethyl)phenyl]-7-({[1-(methoxymethyl)cyclopentyl]methyl}(methyl)amino)-1H-imidazo[4,5-b]pyridin-2-yl}carbamoyl)pyridin-3-yl]propanoic acid |
| 30 | 2 | 3-[6-({5-[2-Cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]propanoic acid |
| 31 | 2 | 3-[6-({5-[2-Cyclopropyl-6-(trifluoromethyl)pyridin-4-yl]-7-({[1-(methoxymethyl)cyclobutyl]methyl}(methyl)amino)-1H-imidazo[4,5-b]pyridin-2-yl}carbamoyl)pyridin-3-yl]propanoic acid |

TABLE 51

| Ex | PEx | Compound Name |
|---|---|---|
| 32 | 2 | 3-[6-({5-[2-Cyclopropyl-6-(trifluoromethyl)pyridin-4-yl]-7-[(3-methoxy-2,2-dimethylpropyl)(methyl)amino]-1H-imidazo[4,5-b]pyridin-2-yl}carbamoyl)pyridin-3-yl]propanoic acid |
| 33 | 2 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-4-methylpyridin-3-yl]propanoic acid |
| 34 | 2 | 3-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-3-fluorophenyl]propanoic acid |
| 35 | 2 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-2-methylpyridin-3-yl]propanoic acid |
| 36 | 2 | 3-[6-({5-[6-Ethoxy-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]propanoic acid |
| 37 | 2 | 3-[2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-4-yl]propanoic acid |
| 38 | 2 | 3-[3-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-pyrazol-1-yl]propanoic acid |
| 39 | 2 | 2-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]acetic acid |

TABLE 52

| Ex | PEx | Compound Name |
|---|---|---|
| 40 | 40 | 1-[6-({5-[6-Ethoxy-5-(trifluoromethyl)pyridin-3-yl]-7-({[1-(ethoxymethyl)cyclopentyl]methyl}(methyl)amino)-1H-imidazo[4,5-b]pyridin-2-yl}carbamoyl)pyridazin-3-yl]azetidine-3-carboxylic acid |
| 41 | 2 | 3-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-3-methoxyphenyl]propanoic acid |
| 42 | 2 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-2-methoxypyridin-3-yl]propanoic acid |
| 43 | 2 | 2-{[2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-4-yl]oxy}acetic acid |

TABLE 52-continued

| Ex | PEx | Compound Name |
|---|---|---|
| 44 | 2 | 1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]azetidine-3-carboxylic acid |
| 45 | 2 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-4-methoxypyridin-3-yl]propanoic acid |
| 46 | 2 | 2-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrimidin-4-yl](methyl)amino}acetic acid |
| 47 | 2 | 2-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]propanoic acid |

TABLE 53

| Ex | PEx | Compound Name |
|---|---|---|
| 48 | 2 | 3-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]butanoic acid |
| 49 | 2 | 2-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]cyclopropane-1-carboxylic acid |
| 50 | 5 | 2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[1,2-a]pyridine-7-carboxylic acid |
| 51 | 2 | 2-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrimidin-4-yl]oxy}acetic acid |
| 52 | 5 | 3-[2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydro-1,6-naphthyridin-6-yl]propanoic acid |
| 53 | 7 | (2R)-3-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]-2-methylpropanoic acid |
| 54 | 7 | (2S)-3-[4-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1H-imidazol-1-yl]-2-methylpropanoic acid |

TABLE 54

| Ex | PEx | Compound Name |
|---|---|---|
| 55 | 5 | 2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-4,5,6,7-tetrahydropyrazolo[1,5-a]pyridine-5-carboxylic acid |
| 56 | 5 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid |
| 57 | 6 | 1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidine-2-carboxylic acid |
| 58 | 6 | 1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}piperidine-3-carboxylic acid |

TABLE 54-continued

| Ex | PEx | Compound Name |
|---|---|---|
| 59 | 6 | 1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]piperidine-4-carboxylic acid |
| 60 | 6 | 1-[5-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyrazin-2-yl]piperidine-4-carboxylic acid |

TABLE 55

| Ex | PEx | Compound Name |
|---|---|---|
| 61 | 6 | 1-[2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-4-yl]pyrrolidine-2-carboxylic acid |
| 62 | 5 | 3-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroisoquinoline-7-carboxylic acid |
| 63 | 6 | 2-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methoxy}acetic acid |
| 64 | 6 | 1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]pyrrolidine-2-carboxylic acid |
| 65 | 6 | 3-{4-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]piperidin-1-yl}propanoic acid |
| 66 | 6 | 2-({[6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]methyl}(methyl)amino)acetic acid |
| 67 | 6 | 2-({[6-({5-[2-Cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]methyl}(methyl)amino)acetic acid |

TABLE 56

| Ex | PEx | CompoundName |
|---|---|---|
| 68 | 6 | 1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]pyrrolidine-3-carboxylic acid |
| 69 | 6 | 1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperidine-3-carboxylic acid |
| 70 | 6 | 1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperidine-4-carboxylic acid |
| 71 | 1 | 4-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}morpholine-2-carboxylic acid |
| 72 | 9 | 2-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]acetic acid |
| 73 | 1 | 1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperidine-2-carboxylic acid |

TABLE 56-continued

| Ex | PEx | CompoundName |
|---|---|---|
| 74 | 1 | 2-{1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-N-methylformamide}acetic acid |

TABLE 57

| Ex | PEx | Compound Name |
|---|---|---|
| 75 | 1 | 2-{4-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperazin-1-yl}acetic acid |
| 76 | 1 | 3-{4-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridine-3-carbonyl]piperazin-1-yl}propanoic acid |
| 77 | 1 | 3-[6-({5-[2-Ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)-1,2,3,4-tetrahydro-2,7-naphthyridin-2-yl]propanoic acid |
| 78 | 1 | 3-[6-({5-[2-Cyclopropyl-6-(trifluoromethyl)pyridin-4-yl]-7-({[1-methoxymethyl)cyclohexyl]methyl}(methyl)amino)-1H-imidazo[4,5-b]pyridin-2-yl}carbamoyl)-1,2,3,4-tetrahydro-2,7-naphthyridin-2-yl]propanoic acid |
| 79 | 1 | (3R)-1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidine-3-carboxylic acid |
| 80 | 1 | (3S)-1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidine-3-carboxylic acid |
| 81 | 1 | (1R,5S,6r)-3-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}-3-azabicyclo[3.1.0]hexane-6-carboxylic acid |

TABLE 58

| Ex | PEx | Compound Name |
|---|---|---|
| 82 | 1 | 2-{[(3R)-1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl]oxy}acetic acid |
| 83 | 1 | 2-{[(3S)-1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl]oxy}acetic acid |
| 84 | 1 | 2-{[(3R)-1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]pyrrolidin-3-yl]oxy}acetic acid |
| 85 | 1 | 2-{[(3S)-1-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]pyrrolidin-3-yl]oxy}acetic acid |
| 86 | 1 | 2-{[(3R)-1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl](methyl)amino}acetic acid |
| 87 | 1 | 2-{[(3S)-1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}pyrrolidin-3-yl](methyl)amino}acetic acid |
| 88 | 1 | 2-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl](methyl)amino}acetic acid |

TABLE 59

| Ex | PEx | Compound Name |
|---|---|---|
| 89 | 1 | 1-({[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}amino)cyclopropane-1-carboxylic acid |
| 90 | 1 | 2-({[6-({5-6-Cyclopropy1-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}(ethyl)amino)acetic acid |
| 91 | 1 | 1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}-3-methylpyrrolidine-3-carboxylic acid |
| 92 | 1 | 4-{[6-({5-[2-Ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]methyl}morpholine-3-carboxylic acid |
| 93 | 93 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-[2-(methanesulfonylcarbamoyl)ethyl]pyridine-2-carboxamide |
| 94 | 1 | 1-({[6-({5-[2-Cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]methyl}amino)cyclopropane-1-carboxylic acid |
| 95 | 8 | 4-[6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]butanoic acid |

TABLE 60

| Ex | PEx | Compound Name |
|---|---|---|
| 96 | 8 | 4-[6-({5-[2-Ethoxy-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl]butanoic acid |
| 97 | 8 | 2-{[6-({5-[2-Cyclopropyl-6-(trifluoromethyl)pyridin-4-yl]-7-({[1-(methoxymethyl)cyclopentyl]methyl}(methyl)amino)-1H-imidazo[4,5-b]pyridin-2-yl}carbamoyl)pyridin-3-yl](methyl)amino}acetic acid |
| 98 | 8 | 2-{[6-({5-[2-Cyclopropyl-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetic acid |
| 99 | 8 | 2-{[6-({5-[2-Ethoxy-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetic acid |
| 100 | 8 | 4-[6-({5-[2-Cyclopropyl-6-(trifluoromethyl)pyridin-4-yl]-7-(({[1-methoxymethyl)cyclohexyl]methyl}(methyl)amino)-1H-imidazo[4,5-b]pyridin-2-yl}carbamoyl)pyridin-3-yl]butanoic acid |
| 101 | 8 | 4-[6-({5-[2-Ethoxy-6-(trifluoromethyl)pyridin-4-yl]-7-({[1-(methoxymethyl)cyclohexyl]methyl}(methyl)amino)-1H-imidazo[4,5-b]pyridin-2-yl}carbamoyl)pyridin-3-yl]butanoic acid |
| 102 | 8 | 4-[6-({5-[2-Cyclopropyl-6-(trifluoromethyl)pyridin-4-yl]-7-({[1-(methoxymethyl)cyclobutyl]methyl}(methyl)amino)-1H-imidazo[4,5-b]pyridin-2-yl}carbamoyl)pyridin-3-yl]butanoic acid |
| 103 | 8 | 4-[6-({5-[2-Cyclopropyl-6-(trifluoromethyl)pyridin-4-yl]-7-[(3-methoxy-2,2-dimethylpropyl)(methyl)amino]-1H-imidazo[4,5-b]pyridin-2-yl}carbamoyl)pyridin-3-yl]butanoic acid |

TABLE 61

| Ex | PEx | Compound Name |
|---|---|---|
| 104 | 8 | 2-{[6-({5-[6-Cyclopropyl-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetic acid |
| 105 | 8 | 2-{[6-({5-[6-Ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl](methyl)amino}acetic acid |
| 106 | 93 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-[2-(trifluoromethanesulfonylcarbamoyl)ethyl]pyridine-2-carboxamide |
| 107 | 93 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-{2-[(propane-2-sulfonyl)carbamoyl]ethyl}pyridine-2-carboxamide |
| 108 | 93 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-{2-[(dimethylsulfamoyl)carbamoyl]ethyl}pyridine-2-carboxamide |
| 109 | 93 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-[3-(methanesulfonylcarbamoyl)propyl]pyridine-2-carboxamide |
| 110 | 1 | 3-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]-2-fluoropropanoic acid |

TABLE 62

| Ex | PEx | Compound Name |
|---|---|---|
| 111 | 111 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-[2-(methoxycarbamoyl)ethyl]pyridine-2-carboxamide |
| 112 | 8 | 5-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]pentanoic acid |
| 113 | 8 | 2-{2-[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl]ethoxy}acetic acid |
| 114 | 8 | 4-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]oxy}butanoic acid |
| 115 | 1 | 4-[6-({5-[2-Ethoxy-6-(trifluoromethyl)pyridin-4-yl]-7-({[1-(ethoxymethyl)cyclopentyl]methyl}(methyl)amino)-1H-imidazo[4,5-b]pyridin-2-yl}carbamoyl)pyridin-3-yl]butanoic acid |
| 116 | 116 | 5-{2-[(Cyclopropanesulfonyl)carbamoyl]ethyl}-N-{5-[6-cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}pyridine-2-carboxamide |
| 117 | 116 | 5-{2-[(Dimethylsulfamoyl)carbamoyl]ethyl}-N-{5-[6-ethoxy-5-(trifluoromethyl)pyridin-3-yl]-7-({[1-(methoxymethyl)cyclohexyl]methyl}(methyl)amino)-1H-imidazo[4,5-b]pyridin-2-yl}pyridine-2-carboxamide |
| 118 | 1 | 4-[6-({5-[6-Ethoxy-5-(trifluoromethyl)pyridin-3-yl]-7-({[1-(ethoxymethyl)cyclopentyl]methyl}(methyl)amino)-1H-imidazo[4,5-b]pyridin-2-yl}carbamoyl)pyridin-3-yl]butanoic acid |

TABLE 63

| Ex | PEx | Compound Name |
|---|---|---|
| 119 | 8 | 3-[2-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)-5,6,7,8-tetrahydroimidazo[l,2-a]pyridin-6-yl]propanoic acid |
| 120 | 1 | 2-({[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}amino)-2-methylpropanoic acid |
| 121 | 116 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-[2-[(methylsulfamoyl)carbamoyl]ethyl}pyridine-2-carboxamide |
| 122 | 122 | 1-({[6-({5-[6-Ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)pyridin-3-yl]methyl}amino)cyclobutane-1-carboxylic acid |
| 123 | 116 | N-{5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}-5-[2-(methylcarbamoyl)ethyl]pyridine-2-carboxamide |
| 124 | 8 | 3-[2-({5-[6-Ethoxy-5-(trifluoromethyl)pyridin-3-yl]-7-({[1-(methoxymethyl)cyclohexyl]methyl}(methyl)amino)-1H-imidazo[4,5-b]pyridin-2-yl}carbamoyl)-5,6,7,8-tetrahydroimidazo[l,2-a]pyridin-6-yl]propanoic acid |
| 125 | 1 | 1-{[6-({5-[6-Cyclopropyl-5-(trifluoromethyl)pyridin-3-yl]-7-({[1-(methoxymethyl)cyclopentyl]methyl}(methyl)amino)-1H-imidazo[4,5-b]pyridin-2-yl}carbamoyl)pyridin-3-yl]methyl}-3-fluoropyrrolidine-3-carboxylic acid |

TABLE 64

| Ex | Data |
|---|---|
| 1 | MS (ESI+) m/z 652.7 (M + H)$^+$ |
| 2 | MS (ESI+) m/z 656.6 (M + H)$^+$ |
| 3 | MS (ESI+) m/z 652.6 (M + H)$^+$ |
| 4 | MS (ESI+) m/z 666.7 (M + H)$^+$ |
| 5 | MS (ESI+) m/z 667.6 (M + H)$^+$ |
| 6 | MS (ESI+) m/z 681.7 (M + H)$^+$ |
| 7 | MS (ESI+) m/z 655.7 (M + H)$^+$ |
| 8 | MS (ESI+) m/z 666.9 (M + H)$^+$ |
| 9 | MS (ESI+) m/z 711.8 (M + H)$^+$ |
| 10 | MS (ESI+) m/z 707.7 (M + H)$^+$ |
| 11 | MS (ESI+) m/z 680.6 (M + H)$^+$ |
| 12 | MS (ESI+) m/z 670.3 (M + H)$^+$ |
| 13 | MS (ESI+) m/z 670.3 (M + H)$^+$ |
| 14 | MS (ESI+) m/z 684.3 (M + H)$^+$ |
| 15 | MS (ESI+) m/z 624.7 (M + H)$^+$ |
| 16 | MS (ESI+) m/z 654.6 (M + H)$^+$ |
| 17 | MS (ESI+) m/z 641.6 (M + H)$^+$ |
| 18 | MS (ESI+) m/z 625.6 (M + H)$^+$ |
| 19 | MS (ESI+) m/z 637.6 (M + H)$^+$ |
| 20 | MS (ESI+) m/z 628.6 (M + H)$^+$ |
| 21 | MS (ESI+) m/z 624.6 (M + H)$^+$ |
| 22 | MS (ESI+) m/z 652.7 (M + H)$^+$ |
| 23 | MS (ESI+) m/z 627.4 (M + H)$^+$ |
| 24 | MS (ESI+) m/z 641.4 (M + H)$^+$ |
| 25 | MS (ESI+) m/z 666.4 (M + H)$^+$ |
| 26 | MS (ESI+) m/z 666.7 (M + H)$^+$ |
| 27 | MS (ESI+) m/z 670.5 (M + H)$^+$ |
| 28 | MS (ESI+) m/z 666.7 (M + H)$^+$ |
| 29 | MS (ESI+) m/z 651.7 (M + H)$^+$ |
| 30 | MS (ESI+) m/z 666.7 (M + H)$^+$ |
| 31 | MS (ESI+) m/z 638.7 (M + H)$^+$ |
| 32 | MS (ESI+) m/z 626.5 (M + H)$^+$ |
| 33 | MS (ESI+) m/z 666.6 (M + H)$^+$ |
| 34 | MS (ESI+) m/z 669.6 (M + H)$^+$ |
| 35 | MS (ESI+) m/z 666.6 (M + H)$^+$ |
| 36 | MS (ESI+) m/z 656.8 (M + H)$^+$ |
| 37 | MS (ESI+) m/z 652.8 (M + H)$^+$ |
| 38 | MS (ESI+) m/z 641.8 (M + H)$^+$ |
| 39 | MS (ESI+) m/z 638.4 (M + H)$^+$ |
| 40 | MS (ESI+) m/z 698.7 (M + H)$^+$ |
| 41 | MS (ESI+) m/z 681.4 (M + H)$^+$ |
| 42 | MS (ESI+) m/z 682.6 (M + H)$^+$ |
| 43 | MS (ESI+) m/z 654.7 (M + H)$^+$ |
| 44 | MS (ESI+) m/z 679.7 (M + H)$^+$ |
| 45 | MS (ESI+) m/z 682.7 (M + H)$^+$ |
| 46 | MS (ESI+) m/z 668.7 (M + H)$^+$ |
| 47 | MS (ESI+) m/z 641.6 (M + H)$^+$ |
| 48 | MS (ESI+) m/z 655.7 (M + H)$^+$ |
| 49 | MS (ESI+) m/z 664.7 (M + H)$^+$ |
| 50 | MS (ESI+) m/z 667.6 (M + H)$^+$ |
| 51 | MS (ESI+) m/z 655.6 (M + H)$^+$ |
| 52 | MS (ESI+) m/z 707.6 (M + H)$^+$ |
| 53 | MS (ESI+) m/z 655.9 (M + H)$^+$ |
| 54 | MS (ESI+) m/z 655.9 (M + H)$^+$ |
| 55 | MS (ESI+) m/z 667.6 (M + H)$^+$ |
| 56 | MS (ESI+) m/z 707.6 (M + H)$^+$ |
| 57 | MS (ESI+) m/z 707.7 (M + H)$^+$ |
| 58 | MS (ESI+) m/z 721.7 (M + H)$^+$ |
| 59 | MS (ESI+) m/z 707.7 (M + H)$^+$ |
| 60 | MS (ESI+) m/z 708.7 (M + H)$^+$ |
| 61 | MS (ESI+) m/z 693.7 (M + H)$^+$ |
| 62 | MS (ESI+) m/z 678.7 (M + H)$^+$ |
| 63 | MS (ESI+) m/z 668.5 (M + H)$^+$ |
| 64 | MS (ESI+) m/z 721.7 (M + H)$^+$ |

TABLE 65

| Ex | Data |
|---|---|
| 65 | MS (ESI+) m/z 735.7 (M + H)$^+$ |
| 66 | MS (ESI+) m/z 681.7 (M + H)$^+$ |
| 67 | MS (ESI+) m/z 695.7 (M + H)$^+$ |
| 68 | MS (ESI+) m/z 721.7 (M + H)$^+$ |
| 69 | MS (ESI+) m/z 735.7 (M + H)$^+$ |
| 70 | MS (ESI+) m/z 735.7 (M + H)$^+$ |
| 71 | MS (ESI+) m/z 723.7 (M + H)$^+$ |
| 72 | MS (ESI+) m/z 693.7 (M + H)$^+$ |
| 73 | MS (ESI+) m/z 735.7 (M + H)$^+$ |
| 74 | MS (ESI+) m/z 695.7 (M + H)$^+$ |
| 75 | MS (ESI+) m/z 750.6 (M + H)$^+$ |
| 76 | MS (ESI+) m/z 764.8 (M + H)$^+$ |
| 77 | MS (ESI+) m/z 725.7 (M + H)$^+$ |
| 78 | MS (ESI+) m/z 721.8 (M + H)$^+$ |
| 79 | MS (ESI+) m/z 707.7 (M + H)$^+$ |
| 80 | MS (ESI+) m/z 707.7 (M + H)$^+$ |
| 81 | MS (ESI+) m/z 719.7 (M + H)$^+$ |
| 82 | MS (ESI+) m/z 737.8 (M + H)$^+$ |
| 83 | MS (ESI+) m/z 737.8 (M + H)$^+$ |
| 84 | MS (ESI+) m/z 723.8 (M + H)$^+$ |
| 85 | MS (ESI+) m/z 723.8 (M + H)$^+$ |
| 86 | MS (ESI+) m/z 750.8 (M + H)$^+$ |
| 87 | MS (ESI+) m/z 750.8 (M + H)$^+$ |
| 88 | MS (ESI+) m/z 667.7 (M + H)$^+$ |
| 89 | MS (ESI+) m/z 693.4 (M + H)$^+$ |
| 90 | MS (ESI+) m/z 695.5 (M + H)$^+$ |
| 91 | MS (ESI+) m/z 721.5 (M + H)$^+$ |
| 92 | MS (ESI+) m/z 727.8 (M + H)$^+$ |
| 93 | MS (ESI+) m/z 729.6 (M + H)$^+$ |
| 94 | MS (ESI+) m/z 707.5 (M + H)$^+$ |
| 95 | MS (ESI+) m/z 666.4 (M + H)$^+$ |
| 96 | MS (ESI+) m/z 670.3 (M + H)$^+$ |
| 97 | MS (ESI+) m/z 667.4 (M + H)$^+$ |
| 98 | MS (ESI+) m/z 681.3 (M + H)$^+$ |
| 99 | MS (ESI+) m/z 685.3 (M + H)$^+$ |
| 100 | MS (ESI+) m/z 680.3 (M + H)$^+$ |
| 101 | MS (ESI+) m/z 684.3 (M + H)$^+$ |
| 102 | MS (ESI+) m/z 652.5 (M + H)$^+$ |
| 103 | MS (ESI+) m/z 640.5 (M + H)$^+$ |
| 104 | MS (ESI+) m/z 681.6 (M + H)$^+$ |
| 105 | MS (ESI+) m/z 685.4 (M + H)$^+$ |
| 106 | MS (ESI+) m/z 783.6 (M + H)$^+$ |
| 107 | MS (ESI+) m/z 757.7 (M + H)$^+$ |
| 108 | MS (ESI+) m/z 758.7 (M + H)$^+$ |
| 109 | MS (ESI+) m/z 743.3 (M + H)$^+$ |
| 110 | MS (ESI+) m/z 670.4 (M + H)$^+$ |
| 111 | MS (ESI+) m/z 681.7 (M + H)$^+$ |
| 112 | MS (ESI+) m/z 680.4 (M + H)$^+$ |

TABLE 65-continued

| Ex | Data |
|---|---|
| 113 | MS (ESI+) m/z 682.6 (M + H)+ |
| 114 | MS (ESI+) m/z 682.7 (M + H)+ |
| 115 | MS (ESI+) m/z 684.3 (M + H)+ |
| 116 | MS (ESI+) m/z 755.3 (M + H)+ |
| 117 | MS (ESI+) m/z 776.3 (M + H)+ |
| 118 | MS (ESI+) m/z 684.3 (M + H)+ |
| 119 | MS (ESI+) m/z 695.6 (M + H)+ |
| 120 | MS (ESI+) m/z 695.4 (M + H)+ |
| 121 | MS (ESI+) m/z 744.5 (M + H)+ |
| 122 | MS (ESI+) m/z 725.5 (M + H)+ |
| 123 | MS (ESI+) m/z 665.6 (M + H)+ |
| 124 | MS (ESI+) m/z 713.3 (M + H)+ |
| 125 | MS (ESI+) m/z 725.8 (M + H)+ |

Biological test examples of the compounds used in the present invention are described below.

The pharmacological activity of the compound of each Example was examined by the following tests. In the following description, the compound of each Example is sometimes referred to as "test compound".

Test Example 1: Evaluation of M3 PAM Activity

CHO-K1 cells in which human muscarinic M3 receptor gene (GenBank registration number: NM_000740.2) was introduced and M3 receptors were stably expressed (hereinafter, sometimes referred to as "M3R-expressing cells") were subcultured under the conditions of 37° C., 5% $CO_2$ using a growth medium. As the growth medium, alpha Modified Eagle Minimum Essential Medium (α-MEM, D8042, manufactured by Sigma) containing inactivated fetal bovine serum (Cat. No. 172012, manufactured by Sigma) having a final concentration of 10%, GlutaMAX (registered trademark) (Cat. No. 35050, manufactured by GIBCO) having a final concentration of 2 mM, penicillin having a final concentration 20 U/mL and 20 µg/mL streptomycin (penicillin-streptomycin mixed solution, Cat. No. 26253-84, manufactured by NACALAI TESQUE, INC.), and G418 (Cat. No. 16513-26, manufactured by NACALAI TESQUE, INC.) having a final concentration of 0.2 mg/mL, was used.

On the day before the measurement of intracellular $Ca^{2+}$ concentration, the M3R-expressing cells were suspended in the growth medium and seeded at 40,000 cells/well on a 96-well plate with a black transparent bottom (Cat. No. 215006, manufactured by Porvair Sciences). The M3R-expressing cells seeded on the 96-well plate were cultured overnight under the conditions of 37° C., 5% $CO_2$.

Using a calcium measurement assay kit (Screen Quest-Fluo-8 Medium Removal Calcium Assay Kit, Cat. No. 36309, manufactured by AAT Bioquest), the $Ca^{2+}$ concentration in the M3R-expressing cells was measured according to the attached instructions. On the day of measurement, the growth medium was removed, a loading buffer was added to the 96-well plate in an amount of 100 µL/well, the cells were cultured under the conditions of 37° C., 5% $CO_2$ for 30 minutes, and then the plate was allowed to stand at room temperature for 30 minutes. This way, the M3R-expressing cells were loaded with a visible light-excited calcium indicator (Fluo-8 (registered trademark), manufactured by AAT Bioquest). As the loading buffer, a buffer containing the calcium indicator was used. As the buffer, a Hanks' balanced salt solution (HBSS buffer) with pH 7.4 containing HEPES (Cat. No. 340-01371, manufactured by DOJINDO LABORATORIES) having a final concentration of 20 mM and probenecid (165-15472, manufactured by Fujifilm Wako Pure Chemical Industries, Ltd.) having a final concentration of 2.5 mM was used. The Hanks' balanced salt solution was prepared by diluting 10×HBSS (Cat. No. 14065-056, manufactured by GIBCO) 10-fold with ultrapure water.

Then, the 96-well plate was transferred into a fluorescence screening system (FLIPR TETRA (registered trademark), manufactured by Molecular Devices), and the intracellular $Ca^{2+}$ concentration-dependent fluorescence intensity by a test compound was measured. In the measurement of the fluorescence intensity, the excitation wavelength was set to 470 nm-495 nm, and the fluorescence wavelength was set to 515 nm-575 nm.

A vehicle containing the test compound or a vehicle alone was added to the 96-well plate, and the fluorescence intensity was measured for 2 minutes. HBSS buffer was used as the vehicle. The test compound was dissolved in dimethylsulfoxide and then added to the HBSS buffer. At this time, the final concentration of dimethylsulfoxide was set to 2.5%. In addition, the final concentration of the test compound was varied in the range of 0 µM to 30 µM. Then, acetylcholine with $EC_{20}$ (20% Effective Concentration), which gives an action of about 20% of the maximum activity, was added, and the fluorescence intensity was measured for 1 minute. At this time, $EC_{20}$ was in the range of about 10 nM to 30 nM.

A fluorescence intensity Lb when the HBSS buffer alone was added instead of the test compound, and acetylcholine having a final concentration of 100 µM was added, was defined as 100%, and a fluorescence intensity La when the HBSS buffer alone was added instead of the test compound in the presence of acetylcholine with $EC_{20}$ was defined as 0%. In addition, the fluorescence intensity when the test compound was added was denoted by Lc, and an enhancement ratio Gr (unit: %) of the fluorescence intensity by the test compound was calculated according to the following equation (1). The M3 PAM activity of the test compound was evaluated based on the enhancement ratio Gr.

$$Gr=100\times(Lc-La)/(Lb-La) \quad (1)$$

On the basis of the enhancement ratio Gr at each concentration of the test compound, $EC_{50}$ (50% Effective Concentration) for the enhancement ratio Gr was estimated from a logistic formula using a statistical program (SAS system, SAS Institute Japan). The results of this test are shown in Tables 66 to 68. It was determined that the lower the $EC_{50}$ for the enhancement ratio Gr, the higher the M3 PAM activity.

TABLE 66

| Test Compound (Example No.) | $EC_{50}$ (nM) |
|---|---|
| 1 | 3.01 |
| 2 | 8.78 |
| 3 | 9.46 |
| 4 | 10.9 |
| 5 | 2.37 |
| 6 | 2.75 |
| 7 | 1.20 |
| 8 | 9.96 |
| 9 | 5.77 |
| 10 | 17.5 |
| 11 | 5.15 |
| 12 | 13.5 |
| 13 | 7.50 |
| 14 | 8.40 |
| 15 | 3.52 |
| 16 | 1.27 |
| 17 | 5.95 |
| 18 | 0.578 |

TABLE 66-continued

| Test Compound (Example No.) | EC$_{50}$ (nM) |
|---|---|
| 19 | 48.9 |
| 20 | 2.90 |
| 21 | 8.40 |
| 22 | 21.2 |
| 23 | 2.90 |
| 24 | 1.29 |
| 25 | 14.1 |
| 26 | 10.0 |
| 27 | 11.1 |
| 28 | 4.12 |
| 29 | 22.4 |
| 30 | 8.00 |
| 31 | 21.9 |
| 32 | 29.6 |
| 33 | 14.6 |
| 34 | 28.7 |
| 35 | 18.6 |
| 36 | 30.1 |
| 37 | 37.5 |
| 38 | 74.0 |
| 39 | 11.2 |
| 40 | 7.16 |
| 41 | 24.6 |
| 42 | 19.9 |
| 43 | 4.50 |
| 44 | 8.60 |
| 45 | 5.38 |
| 46 | 3.87 |
| 47 | 6.09 |
| 48 | 4.26 |
| 49 | 7.57 |
| 50 | 9.89 |

TABLE 67

| Test Compound (Example No.) | EC$_{50}$ (nM) |
|---|---|
| 51 | 6.34 |
| 52 | 13.7 |
| 53 | 5.42 |
| 54 | 2.02 |
| 55 | 5.93 |
| 56 | 14.2 |
| 57 | 4.35 |
| 58 | 10.4 |
| 59 | 88.8 |
| 60 | 65.3 |
| 61 | 7.79 |
| 62 | 6.52 |
| 63 | 1.36 |
| 64 | 5.38 |
| 65 | 14.9 |
| 66 | 9.28 |
| 67 | 2.60 |
| 68 | 1.69 |
| 69 | 2.83 |
| 70 | 2.76 |
| 71 | 2.88 |
| 72 | 7.92 |
| 73 | 1.79 |
| 74 | 1.93 |
| 75 | 0.728 |
| 76 | 2.04 |
| 77 | 11.8 |
| 78 | 9.78 |
| 79 | 9.20 |
| 80 | 8.80 |
| 81 | 9.31 |
| 82 | 2.99 |
| 83 | 2.11 |
| 84 | 10.6 |
| 85 | 7.95 |
| 86 | 2.47 |

TABLE 67-continued

| Test Compound (Example No.) | EC$_{50}$ (nM) |
|---|---|
| 87 | 3.81 |
| 88 | 5.12 |
| 89 | 4.02 |
| 90 | 6.38 |
| 91 | 12.9 |
| 92 | 3.62 |
| 93 | 0.383 |
| 94 | 7.44 |
| 95 | 9.70 |
| 96 | 14.8 |
| 97 | 8.19 |
| 98 | 6.59 |
| 99 | 7.51 |
| 100 | 23.3 |

TABLE 68

| Test Compound (Example No.) | EC$_{50}$ (nM) |
|---|---|
| 101 | 9.46 |
| 102 | 27.2 |
| 103 | 26.8 |
| 104 | 4.71 |
| 105 | 4.80 |
| 106 | 1.60 |
| 107 | 1.80 |
| 108 | 1.60 |
| 109 | 1.10 |
| 110 | 0.800 |
| 111 | 7.70 |
| 112 | 10.5 |
| 113 | 1.50 |
| 114 | 3.40 |
| 115 | 12.9 |
| 116 | 2.60 |
| 117 | 4.30 |
| 118 | 7.30 |
| 119 | 1.40 |
| 120 | 3.40 |
| 121 | 0.700 |
| 122 | 5.60 |
| 123 | 13.8 |
| 124 | 32.2 |
| 125 | 1.53 |

As shown in Tables 66 to 68, it was found that all the test compounds exhibit high M3 PAM activity.

The fluorescence intensity did not increase when the test compound was added alone in the absence of acetylcholine. From this, it was found that the test compounds do not exhibit M3 receptor agonist activity.

Test Example 2: Effect on Increase in Intravesical Pressure Induced by Pelvic Nerve Electrical Stimulation in Anesthetized Rats As the action of nerve stimulation-dependent bladder contraction in vivo, the action of the test compound on increase in intravesical pressure induced by pelvic nerve electrical stimulation using rats was measured by the following method.

SD female rats (Japan SLC, Inc.) were anesthetized by subcutaneously administering 1200 mg/kg of urethane (manufactured by Fujifilm Wako Pure Chemical Industries, Ltd.), and then the lower abdomen of each rat was incised at the midline. After the ureters on both sides were ligated and cut, a cannula for measuring intravesical pressure (PE-60, manufactured by BECTON DICKINSON) was inserted into the bladder through the external urethral orifice and fixed with sutures. After about 200 μL of saline was injected via the cannula inserted into the bladder, the other end of the cannula was connected to a pressure transducer to measure intravesical pressure.

The pelvic nerve near the bladder of the rat was separated under stereomicroscope observation and an electrode for nerve stimulation (K2-14015M-PT, manufactured by Brain-Science idea. Co., Ltd.) was attached. The peritoneal cavity of the rat was filled with liquid paraffin (26114-75, NACALAI TESQUE, INC.). After the postoperative rest period, the pelvic nerve was electrically stimulated to cause an increase in intravesical pressure, using an electrical stimulator (SEN-7203, manufactured by NIHON KOHDEN CORPORATION). At this time, the stimulation frequency was set to 8 Hz, the pulse width was set to 0.3 ms, and the stimulation time was set to 10 seconds. The voltage of the electrical stimulator was adjusted such that the increase in intravesical pressure was about 50% to 70% of that at stimulation with 10 V.

Then, the electric stimulation was repeated at an interval of 10 minutes. After the increase in intravesical pressure induced by electric stimulation was stabilized three times or more, a test compound (dosage 0.3 mg/kg), distigmine bromide (dosage 0.03, 0.1 mg/kg), or a vehicle was intravenously administered at a single dosage of 1.0 mL/kg via a catheter placed into a femoral vein, and the effect of the test compound on increase in intravesical pressure was measured for 1 hour. Saline was used as a vehicle, and the test compound was dissolved in dimethylsulfoxide and then added to the vehicle. At this time, the final concentration of dimethylsulfoxide was set to 10%.

The response data (intravesical pressure) were imported to a personal computer via a data collection and analysis system (PowerLab (registered trademark), manufactured by ADInstruments) and analyzed using analysis software (LabChart (registered trademark), manufactured by ADInstruments). For each electric stimulation, AUC of the increase in intravesical pressure (area under the curve of plot of intravesical pressure) was calculated, and a ratio of change Rc (unit: %) with respect to the value (AUC) before administering the test compound was calculated according to the following equation (2). In the equation (2), Ab denotes AUC before administering the test compound, and Aa denotes AUC after administering the test compound. In addition, the maximum effect observed during 1 hour after administering the test compound (maximum ratio of change Rc) was defined as the effect of the test compound. The higher the ratio of change Rc, the higher the effect of enhancing bladder contraction force and the higher the effect of increasing intravesical pressure. The results of this test are shown in Table 69.

$$Rc = 100 \times (Aa - Ab)/Ab \quad (2)$$

TABLE 69

| Test Compound (Example No.) | Ratio of Change (%) |
|---|---|
| 1 | 55.3 |
| 2 | 36.5 |
| 3 | 28.5 |
| 4 | 89.5 |
| 5 | 49.1 |
| 6 | 55.1 |
| 7 | 41.8 |

TABLE 69-continued

| Test Compound (Example No.) | Ratio of Change (%) |
|---|---|
| 8 | 85.7 |
| 9 | 44.0 |
| 10 | 33.7 |
| 11 | 80.7 |
| 12 | 53.4 |
| 13 | 113.3 |
| 14 | 70.4 |
| 49 | 43.6 |
| 53 | 50.2 |

All the test compounds exhibited an effect of enhancing bladder contraction force. Although distigmine bromide also exhibited an effect of enhancing bladder contraction force, a nicotinic side effect (fasciculation) was observed at 0.1 mg/kg.

Also, all the test compounds evaluated in this test did not induce an increase in intravesical pressure in a state where electrical stimulation was not applied to the rats. Accordingly, it was confirmed that each test compound does not exhibit an effect of increasing intravesical pressure when used alone.

From the above, it was confirmed that in rats, each test compound in Table 69 does not exhibit an effect of increasing intravesical pressure when used alone, but has an effect of enhancing an increase in intravesical pressure induced by pelvic nerve electrical stimulation.

Furthermore, each test compound does not exhibit agonist activity against M3 receptors when used alone, but has an effect of enhancing nerve stimulation-dependent bladder contraction. Accordingly, the test compounds having M3 PAM activity can enhance the signal levels of M3 receptors under more physiological conditions, and are expected to be therapeutically promising for diseases involving M3 receptors. In addition, the test compounds may avoid a cholinergic side effect (cholinergic crisis) which has been reported on existing pharmaceutical drugs (for example, distigmine bromide), and thus, the compounds may be therapeutic drugs having more excellent safety.

Test Example 3: Effect in Rat Lumbar Spinal Canal Stenosis Model 8-week-aged SD female rats (CLEA Japan, Inc.) are anesthetized by intraperitoneal injection of a mixed anesthesia of 40 mg/kg of ketamine (Ketalar (registered trademark), manufactured by DAIICHI SANKYO COMPANY, LIMITED) and 5 mg/kg of xylazine (Selactar (registered trademark), manufactured by Bayer Yakuhin, Ltd). Under anesthesia, the back of each rat is incised to expose the fifth and sixth lumbar arches.

The fifth lumbar arch is drilled to form a hole having a diameter of about 1.5 mm, and a small piece of silicone rubber (manufactured by KOKUGO Co., Ltd.) is inserted into the epidural space between the fifth and sixth lumbar vertebrae, thereby compressing the cauda equina nerve of the rat. The rat whose cauda equina nerve is compressed is sometimes referred to as a treated rat in what follows. The small piece is formed to have a length of 3.5 mm, a width of 5.0 mm, and a thickness of 0.5 mm. After the small piece is inserted, the incision is closed by suturing the incision. Subsequently, an antibiotic (Viccillin for injection, 100 mg per rat, Meiji Seika Pharma Co., Ltd.) is administered systemically to the treated rat.

After two weeks from the cauda equina nerve compression treatment, a certain amount of water for injection (hereinafter, referred to as "water") is loaded to each treated rat via oral administration. Then, the treated rat is placed in a metabolism cage (manufactured by Natsume Seisakusho Co., Ltd), and the urination amount thereof within 6 hours after the start of water loading is measured. One hour before the water loading, the test compound or distigmine bromide dissolved in 0.5% methylcellulose aqueous solution (vehicle) or a vehicle alone is administered orally to the treated rat in a single dose. The urination amount is measured using an electronic balance (GX-200, manufactured by A&D Company, Limited), imported to a personal computer via a data collection and analysis system (PowerLab (registered trademark), manufactured by ADInstruments), and analyzed using analysis software (LabChart (registered trademark), manufactured by ADInstruments). The metabolism cage has a size having a width of 230 mm, a length of 220 mm, and a height of 150 mm.

The total urination volume in 6 hours after water loading is evaluated. Furthermore, each treated rat is taken out from the metabolism cage after 6 hours from the start of water loading, the lower abdomen of the treated rat is pushed with fingers to cause urination by manual pressure, and the volume of the residual urine is measured.

As described in Test Example 1 and Test Example 2, the compound of the present invention exhibits M3 PAM activity and is effective in vivo models. Therefore, the compound of the present invention is useful, for example, as a preventive agent or therapeutic agent for urination disorders and urine collection disorders in underactive bladder, hypotonic bladder, acontractile bladder, detrusor underactivity, and neurogenic bladder.

Formulation Example 1

Tablet (oral tablet)
In 80 mg of one tablet of prescription:

| | |
|---|---|
| Compound of present invention of Example 1 | 5.0 mg |
| Corn starch | 46.6 mg |
| Crystalline cellulose | 24.0 mg |
| Methyl cellulose | 4.0 mg |
| Magnesium stearate | 0.4 mg |

A mixed powder of the ingredients at this ratio is tableted by a usual method to obtain an oral tablet.

INDUSTRIAL APPLICABILITY

The compound of the present invention or a pharmaceutically acceptable salt thereof exhibits M3 PAM activity, and therefore is useful as a preventive agent or therapeutic agent for a urination disorder or a urine collection disorder in bladder/urinary tract diseases, glaucoma, or diabetes, which involve M3 receptors.

The invention claimed is:

1. A compound of the formula [1]:

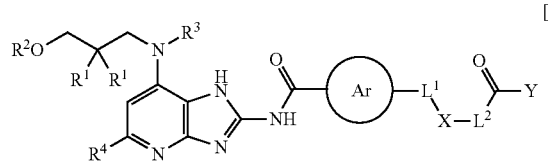

or a pharmaceutically acceptable salt, stereoisomer, or solvate thereof,
wherein:
each $R^1$ is independently H or alkyl; or
two $R^1$, together with the carbon atom to which they are attached, form a 3- to 7-membered cycloalkyl or an oxygen-containing non-aromatic heterocyclyl;
$R^2$ is H, alkyl, alkyl-O(alkyl), or cycloalkyl, wherein the alkyl is optionally substituted with one cycloalkyl substituent;
$R^3$ is H, alkyl, or alkyl-O(alkyl);
$R^4$ is phenyl or pyridyl;
wherein the phenyl is optionally substituted with one, two, or three substituents independently selected from the group consisting of halogen, trihaloalkyl, O(alkyl), and cycloalkyl; and
wherein the pyridyl is optionally substituted with one or two substituents independently selected from the group consisting of CN, alkyl, trihaloalkyl, O(alkyl), and cycloalkyl;
Ar is an aromatic carbocyclic group or an aromatic heterocyclic group, wherein the aromatic carbocyclic group or aromatic heterocyclic group is optionally substituted with one substituent selected from the group consisting of halogen, alkyl, and O(alkyl);
$L^1$ is a bond, $C_{1-6}$ alkylene, $C_{1-6}$ haloalkylene, $C_{1-6}$ alkylene-$NR^a$—, $C_{1-6}$ alkylene-O—, or —C(O)—;
$R^a$ is H or alkyl,
X is a bond, alkylene, cycloalkylene, or non-aromatic heterocyclylene, wherein the non-aromatic heterocyclylene is optionally substituted with one halogen substituent;
$L^2$ is a bond, $C_{1-6}$ alkylene, —$NR^b$—$C_{1-6}$ alkylene, or O—$C_{1-6}$ alkylene;
$R^b$ is H or alkyl; and
Y is NH(alkyl), NHO(alkyl), NHS(O)$_2$alkyl, NHS(O)$_2$haloalkyl, NHS(O)$_2$NH(alkyl), NHS(O)$_2$N(alkyl)$_2$, NHS(O)$_2$O(alkyl), NHS(O)$_2$cycloalkyl, or OH.

2. The compound according to claim 1, or a pharmaceutically acceptable salt, stereoisomer, or solvate thereof, wherein:
each $R^1$ is independently alkyl; or
two $R^1$, together with the carbon atom to which they are attached, form a 3- to 7-membered cycloalkyl;
$R^2$ is alkyl;
$R^3$ is alkyl; and
$R^4$ is phenyl or pyridyl;
wherein the phenyl is optionally substituted with one, two, or three substituents independently selected from the group consisting of trihaloalkyl and cycloalkyl; and
wherein the pyridyl is optionally substituted with one or two substituents independently selected from the group consisting of trihaloalkyl, O(alkyl), and cycloalkyl.

3. The compound according to claim 1, or a pharmaceutically acceptable salt, stereoisomer, or solvate thereof, wherein:
two $R^1$, together with the carbon atom to which they are attached, form a 3- to 7-membered cycloalkyl;
$R^2$ is alkyl;
$R^3$ is alkyl;
$R^4$ is pyridyl, wherein the pyridyl is substituted with one trihaloalkyl substituent and one substituent selected from the group consisting of O(alkyl) and cycloalkyl;

Ar is an aromatic heterocyclic group;
L¹ is a bond, $C_{1-6}$ alkylene, or $C_{1-6}$ alkylene-NR$^a$—;
R$^a$ is alkyl,
X is a bond;
L² is a bond; and
Y is OH.
4. The compound according to claim 1, wherein the compound is selected from the group consisting of:
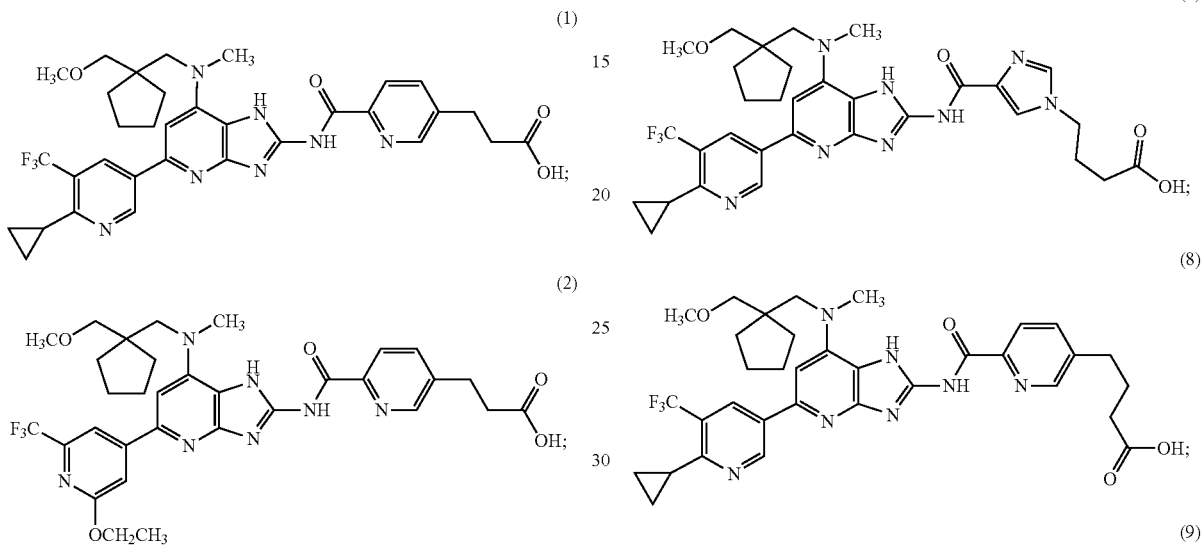
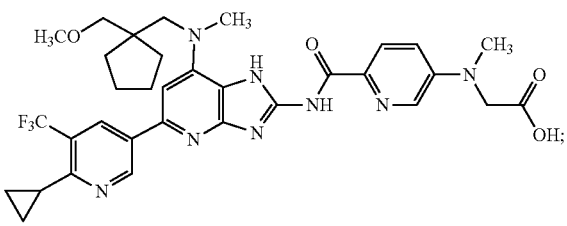

-continued

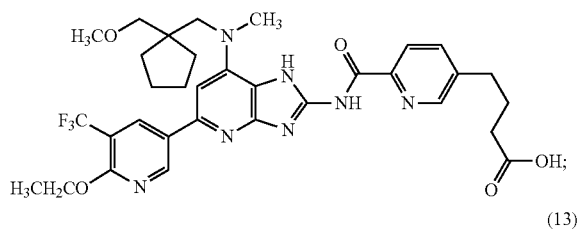
(12)

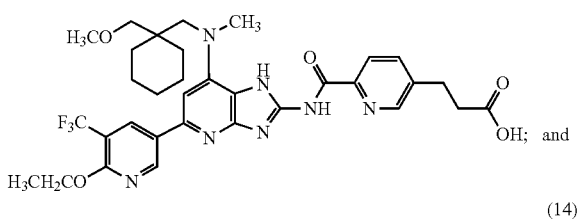
(13)

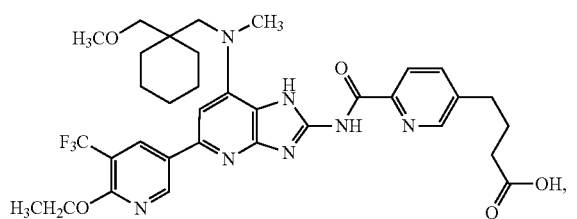
(14)

or a pharmaceutically acceptable salt, stereoisomer, or solvate thereof.

5. An M3 positive allosteric modulator (PAM) comprising a compound according to claim 1, or a pharmaceutically acceptable salt, stereoisomer, or solvate thereof, as an active ingredient.

6. An M3 positive allosteric modulator (PAM) comprising a compound according to claim 4, or a pharmaceutically acceptable salt, stereoisomer, or solvate thereof, as an active ingredient.

7. A pharmaceutical composition comprising a pharmaceutically acceptable non-toxic and inert carrier and a compound according to claim 1, or a pharmaceutically acceptable salt, stereoisomer, or solvate thereof, as an active ingredient.

8. A pharmaceutical composition comprising a pharmaceutically acceptable non-toxic and inert carrier and a compound according to claim 4, or a pharmaceutically acceptable salt, stereoisomer, or solvate thereof, as an active ingredient.

9. A method for enhancing M3 receptor (M3) positive allosteric modulator (PAM) activity in a human, wherein the method comprises administering to the human in need thereof a therapeutically effective amount of the pharmaceutical composition according to claim 7.

10. The method according to claim 9, wherein the human suffers from a urine collection disorder in an M3 receptor-mediated bladder disease.

11. The method according to claim 10, wherein the urine collection disorder is due to acontractile bladder, detrusor underactivity, detrusor-external urethral sphincter dyssynergia, hypotonic bladder, neurogenic bladder, underactive bladder, or urethral relaxation failure.

12. The method according to claim 9, wherein the human suffers from a urination disorder in an M3 receptor-mediated bladder disease.

13. The method according to claim 12, wherein the urination disorder is due to acontractile bladder, detrusor underactivity, detrusor-external urethral sphincter dyssynergia, hypotonic bladder, neurogenic bladder, underactive bladder, or urethral relaxation failure.

14. The method according to claim 9, wherein the human suffers from a urine collection disorder in an M3 receptor-mediated urinary tract disease.

15. The method according to claim 14, wherein the urine collection disorder is due to acontractile bladder, detrusor underactivity, detrusor-external urethral sphincter dyssynergia, hypotonic bladder, neurogenic bladder, underactive bladder, or urethral relaxation failure.

16. The method according to claim 9, wherein the human suffers from a urination disorder in an M3 receptor-mediated urinary tract disease.

17. The method according to claim 16, wherein the urination disorder is due to acontractile bladder, detrusor underactivity, detrusor-external urethral sphincter dyssynergia, hypotonic bladder, neurogenic bladder, underactive bladder, or urethral relaxation failure.

18. The method according to claim 9, wherein the human suffers from M3 receptor-mediated diabetes.

19. The method according to claim 9, wherein the human suffers from M3 receptor-mediated glaucoma.

20. A method for enhancing M3 receptor (M3) positive allosteric modulator (PAM) activity in a human, wherein the method comprises administering to the human in need thereof a therapeutically effective amount of the pharmaceutical composition according to claim 8.

21. The method according to claim 20, wherein the human suffers from a urine collection disorder in an M3 receptor-mediated bladder disease.

22. The method according to claim 21, wherein the urine collection disorder is due to acontractile bladder, detrusor underactivity, detrusor-external urethral sphincter dyssynergia, hypotonic bladder, neurogenic bladder, underactive bladder, or urethral relaxation failure.

23. The method according to claim 20, wherein the human suffers from a urination disorder in an M3 receptor-mediated bladder disease.

24. The method according to claim 23, wherein the urination disorder is due to acontractile bladder, detrusor underactivity, detrusor-external urethral sphincter dyssynergia, hypotonic bladder, neurogenic bladder, underactive bladder, or urethral relaxation failure.

25. The method according to claim 20, wherein the human suffers from a urine collection disorder in an M3 receptor-mediated urinary tract disease.

26. The method according to claim 25, wherein the urine collection disorder is due to acontractile bladder, detrusor underactivity, detrusor-external urethral sphincter dyssynergia, hypotonic bladder, neurogenic bladder, underactive bladder, or urethral relaxation failure.

27. The method according to claim 20, wherein the human suffers from a urination disorder in an M3 receptor-mediated urinary tract disease.

28. The method according to claim 27, wherein the urination disorder is due to acontractile bladder, detrusor underactivity, detrusor-external urethral sphincter dyssynergia, hypotonic bladder, neurogenic bladder, underactive bladder, or urethral relaxation failure.

29. The method according to claim 20, wherein the human suffers from M3 receptor-mediated diabetes.

30. The method according to claim 20, wherein the human suffers from M3 receptor-mediated glaucoma.

\* \* \* \* \*